(12) United States Patent
Sahin

(10) Patent No.: US 9,730,433 B2
(45) Date of Patent: Aug. 15, 2017

(54) INFRASTRUCTURE FOR SOLAR POWER INSTALLATIONS

(71) Applicant: Nedim T. Sahin, Boston, MA (US)

(72) Inventor: Nedim T. Sahin, Boston, MA (US)

( * ) Notice: Subject to any disclaimer, the term of this patent is extended or adjusted under 35 U.S.C. 154(b) by 868 days.

(21) Appl. No.: 13/646,082

(22) Filed: Oct. 5, 2012

(65) Prior Publication Data
US 2013/0118550 A1    May 16, 2013

Related U.S. Application Data

(60) Provisional application No. 61/545,028, filed on Oct. 7, 2011.

(51) Int. Cl.
| | | |
|---|---|---|
| *A01K 63/06* | (2006.01) | |
| *H01L 31/042* | (2014.01) | |
| *H02S 40/38* | (2014.01) | |

(52) U.S. Cl.
CPC .......... *A01K 63/065* (2013.01); *H01L 31/042* (2013.01); *H02S 40/38* (2014.12); *Y02E 10/50* (2013.01)

(58) Field of Classification Search
CPC .... H01L 31/0422; A01K 63/065; H02S 40/38
See application file for complete search history.

(56) References Cited

U.S. PATENT DOCUMENTS

| | | | | |
|---|---|---|---|---|
| 3,984,881 A | * | 10/1976 | Gerlach | E04H 4/08 126/565 |
| 4,365,106 A | | 12/1982 | Pulvari | |
| 4,529,830 A | * | 7/1985 | Daniel | F21S 11/00 136/246 |
| 4,786,795 A | * | 11/1988 | Kurashima | F24J 2/38 126/573 |
| 5,558,422 A | | 9/1996 | Sanford | |

(Continued)

FOREIGN PATENT DOCUMENTS

| | | | | |
|---|---|---|---|---|
| DE | 202006001289 U1 | * | 5/2006 | ............. F24J 2/0472 |
| JP | 08162662 A | | 6/1996 | |

(Continued)

OTHER PUBLICATIONS

Pauley, Solar-Marine Power Generators, Oct. 28, 2011, www.trendhunter.com/trends/marine-solar-cells, accessed Sep. 28, 2015.*

(Continued)

*Primary Examiner* — Shannon Gardner
(74) *Attorney, Agent, or Firm* — Burns & Levinson LLP; Joseph M. Maraia

(57) ABSTRACT

The technology provides a plurality of examples for implementing solar cell, solar panels, and solar collection devices on natural looking installations such as faux trees and plants as well as objects mimicking natural ones. The technology allows the installation of solar power generating installations in a distributed manner on land and water. The installation of, for example, artificial plants as carriers of solar cells provides a number of benefits to society in addition to the generation of power. The aesthetics of a community are maintained, while at the same time the need for maintain natural plants is eliminated, providing financial and environmental savings for consumers and municipalities.

40 Claims, 14 Drawing Sheets

(56) References Cited

U.S. PATENT DOCUMENTS

| | | | |
|---|---|---|---|
| 5,716,442 A | | 2/1998 | Fertig |
| 5,825,302 A | * | 10/1998 | Stafford .............. G06K 7/0008 340/10.41 |
| 5,961,740 A | | 10/1999 | Wambach et al. |
| 6,730,840 B2 | | 5/2004 | Sasaoka et al. |
| 7,249,863 B2 | | 7/2007 | Ballarini et al. |
| 7,334,913 B1 | | 2/2008 | Chen |
| 7,558,452 B2 | | 7/2009 | Ho |
| 7,875,536 B2 | | 1/2011 | Samuelson et al. |
| 7,888,584 B2 | | 2/2011 | Lyden |
| 7,915,523 B2 | | 3/2011 | Farhadieh |
| 8,165,435 B2 | | 4/2012 | Martin-Lopez |
| 2005/0057945 A1 | | 3/2005 | Pipo et al. |
| 2006/0011194 A1 | | 1/2006 | Hensley et al. |
| 2009/0007959 A1 | | 1/2009 | Wu et al. |
| 2010/0158673 A1 | | 6/2010 | Keene |
| 2010/0186797 A1 | | 7/2010 | Joshi |
| 2010/0229854 A1 | | 9/2010 | Martin-Lopez |
| 2010/0289269 A1 | | 11/2010 | Christy et al. |
| 2011/0023934 A1 | | 2/2011 | Xue et al. |
| 2011/0139215 A1 | | 6/2011 | Lyden |
| 2011/0203647 A1 | * | 8/2011 | Kumar ................. H02S 10/10 136/255 |
| 2011/0277815 A1 | * | 11/2011 | Sankrithi ................. F24J 2/14 136/246 |

FOREIGN PATENT DOCUMENTS

| | | |
|---|---|---|
| JP | 11-168228 A | 6/1999 |
| KR | 10-2010-0047999 A | 5/2010 |
| KR | 10-0999934 B1 | 12/2010 |
| KR | 10099934 B1 | 12/2010 |
| KR | 10-2011-0030392 A | 3/2011 |

OTHER PUBLICATIONS

Pauley, Floating Webs Capture Sun and Wave Power, Nov. 17, 2011, news.discovery.com/tech/marine-solar-cells-wave-solar-energy-111117.htm, accessed Sep. 28, 2015.*

Maghanga et al., Spectrally selective reflector surfaces for heat reduction in concentrator solar cells: modeling and applications of TiO2:Nb-based thin films, Appl Opt. 2011; 50(19), abstract.*

Machine translation DE 200620001289, accessed Sep. 28, 2015.*

Bourzac; "Wrapping Solar Cells around an Optical Fiber"; Downloaded Online via http://www.technologyreview.com/news/416052/wrapping-solar-cells-around-an-optical-fiber/ [Retrieved: Jan. 7, 2013]; MIT Technology Review; 4 pages (Oct. 30, 2009).

Bland; "Solar Power Goes Underground—Scientists use fiber optics instead of solar panels to capture sun's energy"; Downloaded Online via http://www.msnbc.msn.com/id/33793775/ns/technology_and_science-future_of_energy/t/solar-power-goes-underground/#.UORrcneWSIV [Retrieved: Jan. 2, 2013]; Discovery News—NBCNEWS.com; 2 pages (Nov. 9, 2009).

Greendix Website; "The Family Tree"; [online] Located at: http://www.greendix.com/news_detail.asp?news_id=31, Posted on Jul. 20, 2010, Downloaded on: Jan. 2, 2013.

Greendix Website; "The Energy Apple"; [online] Located at: http://www.greendix.com/news_detail.asp? news_id=30, Posted on Jul. 15, 2010, Downloaded on: Jan. 2, 2013.

BP Solar; Designed to capture more of the sun—A close look at what makes our solar modules unique;Solar Panel Specifications from BP; Downloaded from www.bpsolar.com [Dec. 14, 2010]; 2 pages (Dec. 14, 2010).

Elrick; "Water shortage may be next cause of world war"; Barnstable Patriot; Downloaded Online via http://www.waterconserve.org/ [Jan. 2, 2013]—Originally posted at: http://www.barnstablepatriot.com/water_shortage_may_be_next_cause_of_world_war_news_16_11395.html; 3 pages (Feb. 23, 2007).

International Search Report corresponding to PCT/US12/59134, date of mailing Mar. 13, 2013; 4 pages.

International Preliminary Report on Patentabiltiy corresponding to PCT/US12/59134, date of mailing Apr. 8, 2014; 6 pages.

* cited by examiner

FIG. 1A
FIG. 1B
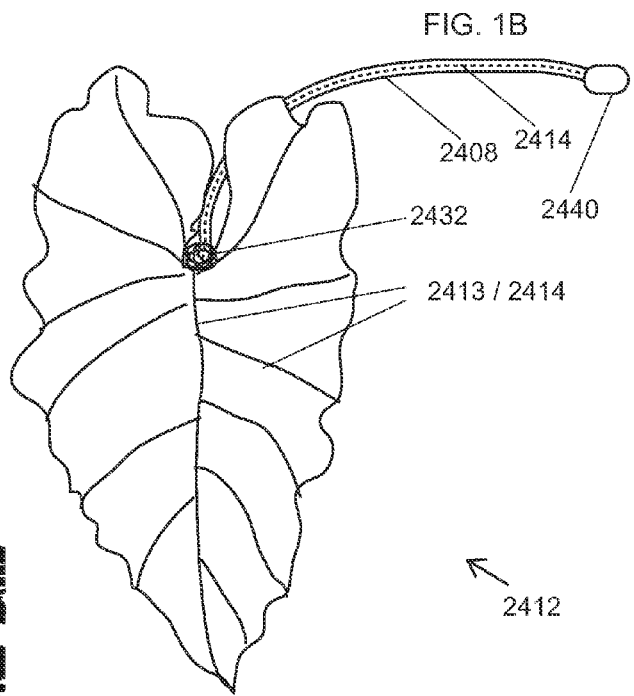
FIG. 1C
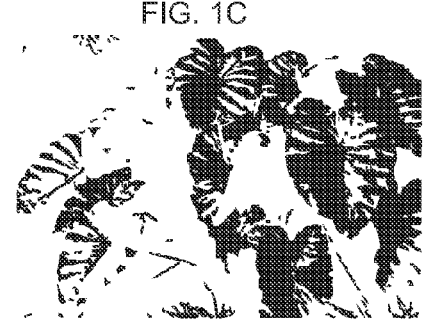
FIG. 1D
FIG. 1E
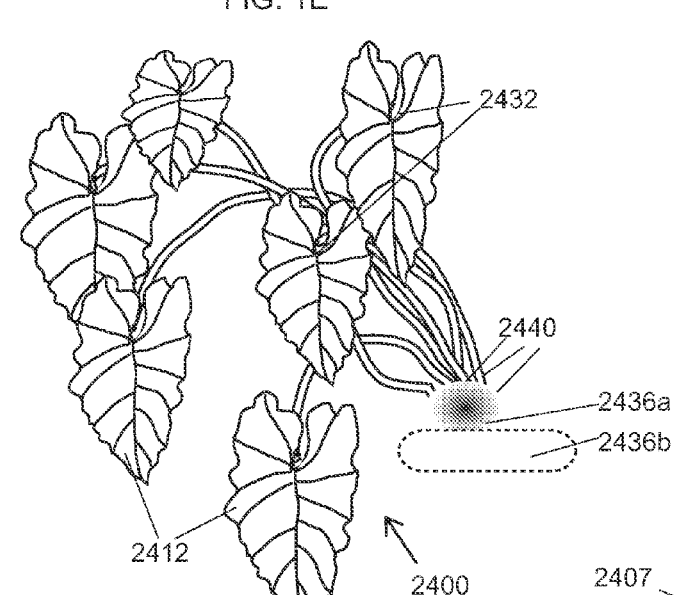
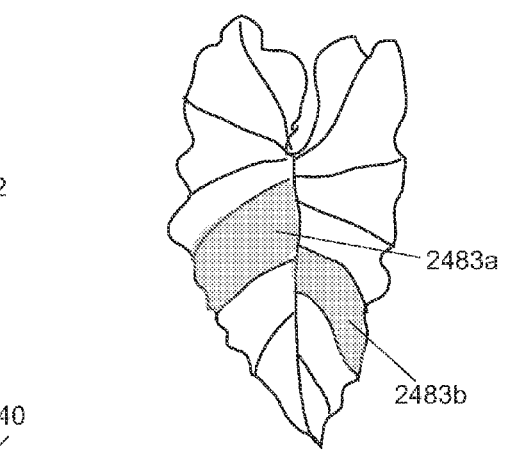
FIG. 1F
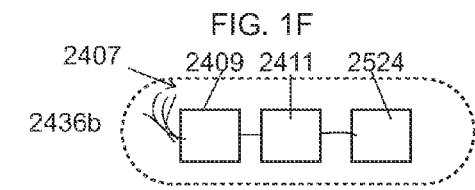

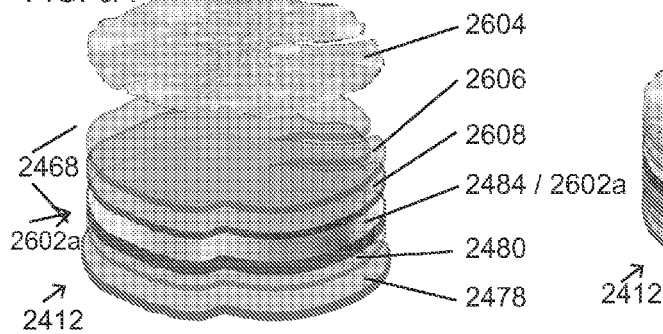
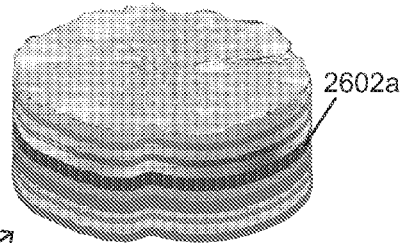
FIG. 6A
FIG. 6B
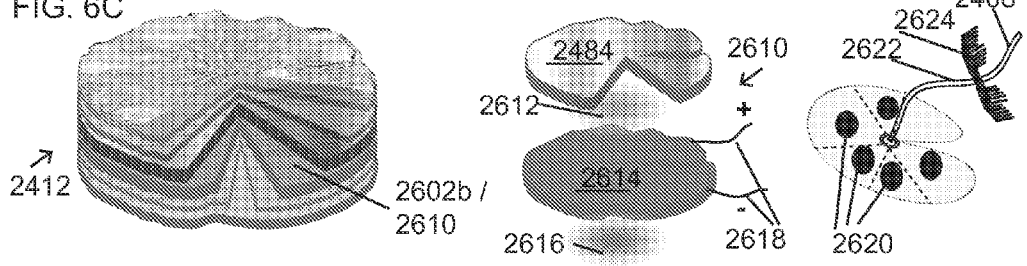
FIG. 6C
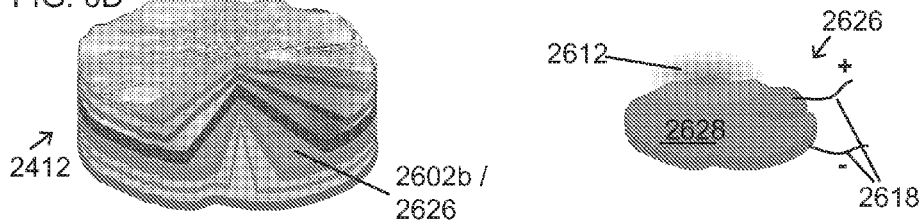
FIG. 6D
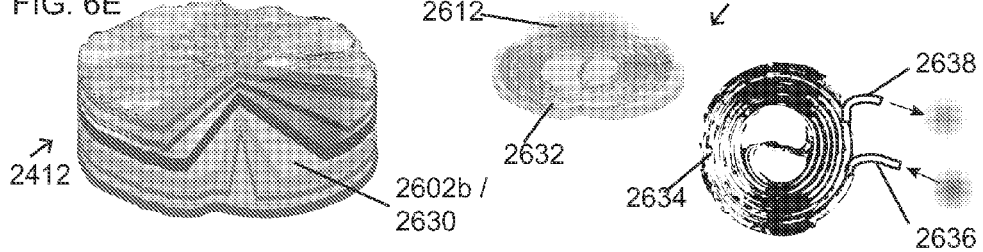
FIG. 6E
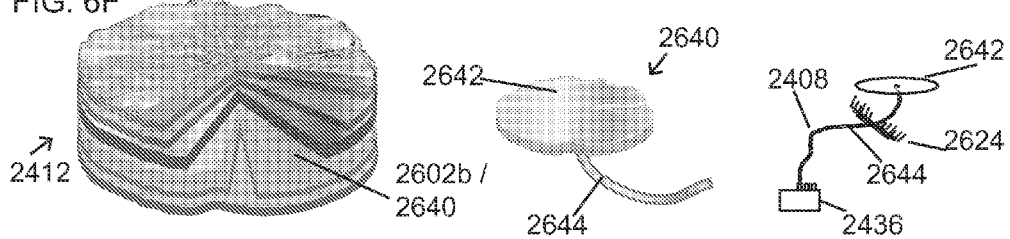
FIG. 6F

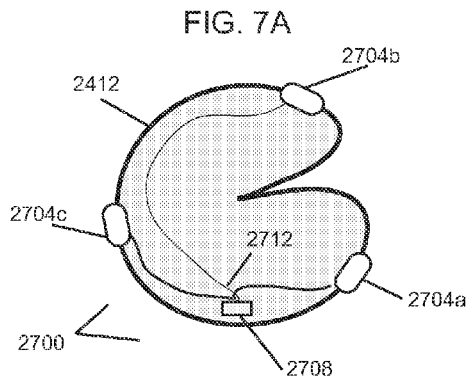
FIG. 7A
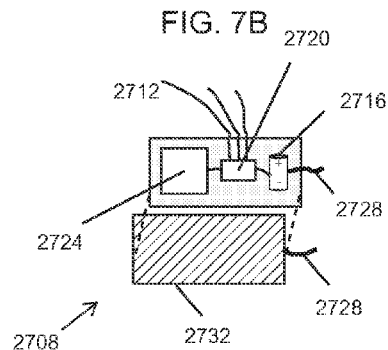
FIG. 7B
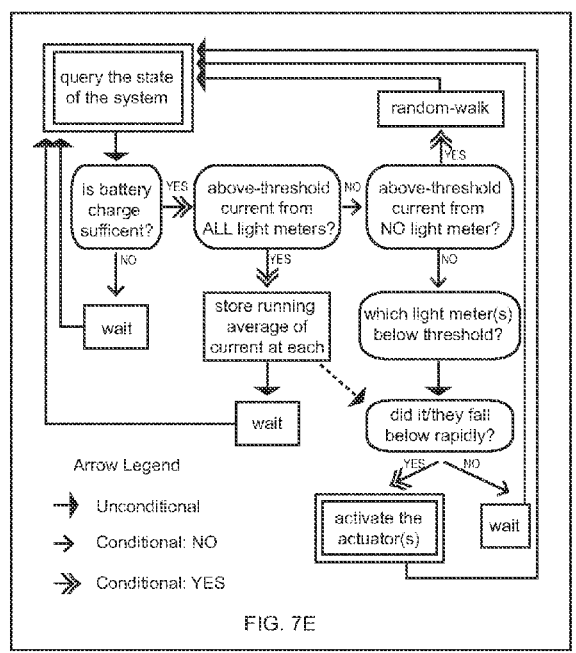
FIG. 7E
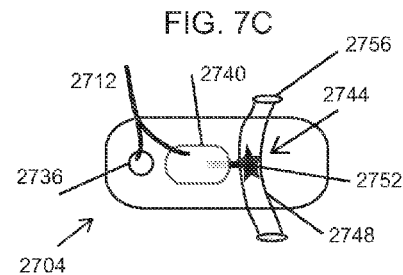
FIG. 7C
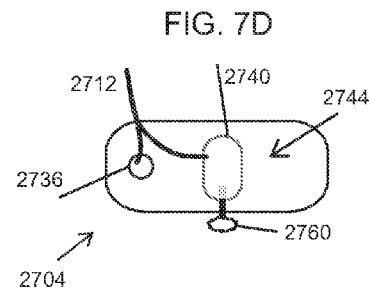
FIG. 7D
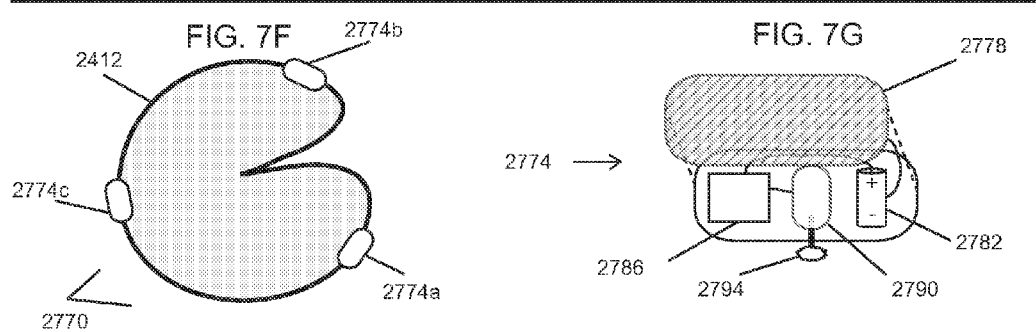
FIG. 7F
FIG. 7G

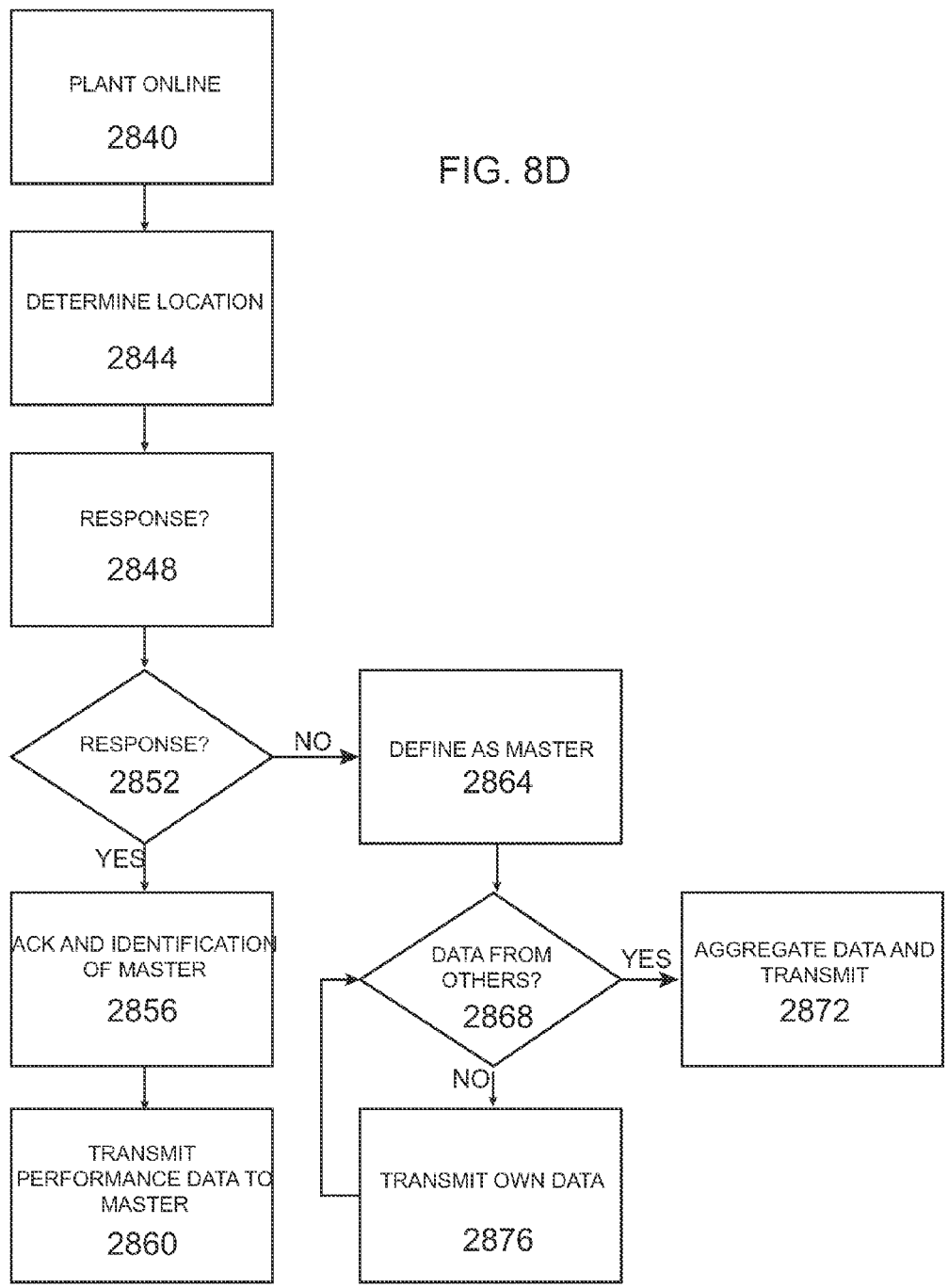

INFRASTRUCTURE FOR SOLAR POWER INSTALLATIONS

This patent application claims priority to U.S. Provisional Patent Application No. 61/545,028 filed on Oct. 7, 2011 ("Method and Device for Harnessing Alternative Energy Sources Unobtrusively"), which is incorporated by reference herein in its entirety.

BACKGROUND

Solar energy has been proposed as a solution to energy availability and there are a number of solar energy generating solutions available. Solar energy installations may be private or commercial. Many commercial installations require a large land area or surface area so that a sufficient number of solar panels or other solar converters can be arrayed to allow the most efficient use of the sun in providing the desired conversion of solar energy to electrical energy and/or heat. Private or personal installations have often taken the form of roof top installation of rectangular panels to allow a homeowner to heat water and/or to generate electrical energy.

A problem with all of these systems is the need for large areas of space for the installation of ungainly panels. Many municipalities are unable to take advantage of solar power solutions because of the need for large contiguous space. In addition, many solar installations are unsightly, causing some potential users to decide against implementation.

The technology described below contemplates a multi-tiered approach that results in more natural and aesthetic presentations.

SUMMARY

In some aspects, this disclosure provides an aquatic power-generating apparatus including an energy-gathering unit shaped like a plant leaf. The energy-gathering unit includes a photovoltaic complex for converting light to electricity, a conductive infrastructure layer integrated with the photovoltaic complex for conducting the electricity from the photovoltaic complex, and a buoyant base layer underneath the conductive infrastructure layer for keeping the energy-gathering unit afloat on water. The aquatic power-generating apparatus includes a stalk having a protective housing and one or more conductive cores for conducting the electricity from the energy-gathering unit. The aquatic power-generating apparatus includes a base unit electrically coupled to the energy-gathering unit by way of the one or more conductive cores of the stalk. The base unit combines electricity from the energy-gathering unit with electricity from other energy-gathering units. The base unit includes an output conduit carrying the combined electricity from the base unit. In some embodiments the aquatic power-generating apparatus includes a sunlight-chasing control assembly including three or more actuator assemblies arranged around a perimeter of the energy-gathering unit and a microprocessor unit communicatively coupled to a respective actuator assembly. Each actuator assembly includes a light meter, electric motor and propulsion drive. The microprocessor unit is configured to, in response to data on instantaneous luminance levels provided by the light meter of the respective actuator assembly, activate the electric motor to drive the propulsion drive and move the energy-gathering unit across the water.

In other examples, any of the aspects above can include one or more of the following features.

In some examples of the aquatic power-generating apparatus the energy-gathering unit resembles any one of lily pad, elephant ear, kelp, water hyacinth, and water lettuce.

In other examples of the aquatic power-generating apparatus the conductive infrastructure layer is divided into segments, each segment associated with a portion of the photovoltaic complex, and each association converting sunlight to electricity and conducting the electricity separately from other associations.

In some examples of the aquatic power-generating apparatus the energy-gathering unit further includes a one-way mirrored surface over the photovoltaic complex for allowing sunlight to pass through and reflect back the sunlight reflected by the photovoltaic complex.

In other examples of the aquatic power-generating apparatus the energy-gathering unit further includes a green-reflective layer over the photovoltaic complex for imparting a green appearance to the energy-gathering unit.

In some examples of the aquatic power-generating apparatus the energy-gathering unit further includes an insulating layer between the buoyant base layer and conductive infrastructure layer for providing constant, well controlled, and tuned layer between the buoyant base layer and conductive infrastructure layer.

In other examples of the aquatic power-generating apparatus the energy-gathering unit further includes a thermoelectric complex for gathering energy in the form of electricity, via the thermoelectric effect.

In some examples of the aquatic power-generating apparatus the energy-gathering unit further includes a pyroelectric complex for gathering energy in the form of electricity, via the pyroelectric effect.

In other examples of the aquatic power-generating apparatus the energy-gathering unit further includes a fluid-exchange solar thermal complex for gathering energy in the form of heat, via thermal exchange using a fluid pumped into the energy-gathering unit unheated and returned to a heat-exchanger heated.

In some examples of the aquatic power-generating apparatus the energy-gathering unit further includes a solid-state solar thermal complex for gathering energy in the form of heat, via thermal conduction along a heat pipe.

In some examples of the aquatic power-generating apparatus the energy-gathering unit further includes an ambient electromagnetic signal receiver and conversion complex for gathering energy in the form of electricity, via analog reception of ambient electromagnetic signals.

In other examples of the aquatic power-generating apparatus the protective housing of the stalk is made from any one of plastic, polymer, rubber, cloth, and braided metal.

In some examples of the aquatic power-generating apparatus the protective housing of the stalk is dipped, sprayed, deposited, wrapped, painted on the one or more conductive cores of the stalk.

In other examples of the aquatic power-generating apparatus the protective housing of the stalk is a pre-fabricated flexible tube provided separately, and the conductive core is threaded through the pre-fabricated flexible tube.

In some examples of the aquatic power-generating apparatus the protective housing of the stalk includes a plurality of segments.

In other examples of the aquatic power-generating apparatus the base unit is coupled to another base unit by way of the output conduit to combine electricity from multiple base units.

In some examples of the aquatic power-generating apparatus the base unit is coupled to an energy storage device by way of the output conduit, the energy storage device including any one of super-capacitor, battery, battery bank, electrically coupled flywheel and superconducting energy store.

In other examples of the aquatic power-generating apparatus the base unit is coupled to an a derivative energy storage device by way of the output conduit, the derivative energy storage device including a means for converting electricity from the base unit to any one of mechanical energy, thermal energy, potential energy, chemical energy, and synthesis of materials for fuel cells.

In some examples of the aquatic power-generating apparatus wherein the microprocessor unit is located in a controller unit connected to the actuator assemblies arranged on the energy-gathering unit, via control wires. The microprocessor unit is further configured to in response to data on instantaneous luminance levels provided by each of the actuator assemblies, activate the electric motor of one or more actuator assemblies to drive the propulsion drive of one or more actuator assembly and move the energy-gathering unit across the water.

In other examples of the aquatic power-generating apparatus the microprocessor unit is located in a network-level controller unit connected to the actuator assemblies arranged on the energy-gathering unit and other energy-gathering units, via control wires, forming a network of energy-gathering units, and the microprocessor unit is further configured to in response to data on instantaneous luminance levels provided by at least some of the actuator assemblies of the network of energy-gathering units, activate the electric motor of at least some of the actuator assemblies to drive the propulsion drive of at least some of the actuator assemblies and move at least some of the energy-gathering units across the water.

In some examples of the aquatic power-generating apparatus the network of energy-gathering units includes a master network-level controller unit and another network-level controller unit, the master network-level controller unit controlling the actuator assemblies of the network of energy-gathering units and the other network-level controller controlling the actuator assemblies of the network of energy-gathering units when the master network-level controller unit fails.

In other examples of the aquatic power-generating apparatus the network-level controller unit is located in the base unit.

In some examples of the aquatic power-generating apparatus the network of energy-gathering units includes a master base unit with the network-level controller and another base unit without a network-level controller.

In other examples of the aquatic power-generating apparatus the propulsion drive is any one of an impeller and propeller.

In some examples of the aquatic power-generating apparatus, the apparatus further includes a light pipe for conducting sunlight away from the energy-gathering unit to a location remote from the energy-gathering unit and converting the conducted sunlight to electricity at the remote location.

In other examples of the aquatic power-generating apparatus, the apparatus further includes a light pipe for conducting sunlight away from the energy-gathering unit to a location remote from the energy-gathering unit and heating a substance at the remote location.

In some examples of the aquatic power-generating apparatus, the apparatus further includes a motion to electricity force transducer for gathering energy in the form of mechanical energy and converting the mechanical energy to electricity, the motion to electricity force transducer is interposed between the stalk and base unit or between the base unit and ground to which the base unit is tethered by an anchor unit.

In other examples of the technology, the power-generating apparatus resembles in form a terrestrial or aquatic plant and comprises at least one energy-gathering unit shaped like an outer structure of a plant including any of leaf, frond, pad, blade, twig, husk, bark, modified leaf, mushroom cap, petal, flower, cone, bud, fruit, and needle; a stalk assembly including a stalk branch for each energy-gathering unit, each stalk branch including a protective housing and one or more conductive cores for conducting energy from the energy-gathering unit in the form of light, heat, and/or electricity, the stalk branches optionally being bundled together in part of the apparatus within a larger structure resembling a tree trunk; at least one set of two or more energy-converting assemblies for receiving energy from the environment and converting it into a desirable form, each energy-converting assembly comprising any of: a photovoltaic complex for converting light to electricity, a thermoelectric complex for gathering energy in the form of electricity via the thermoelectric effect, a pyroelectric complex for gathering energy in the form of electricity via the pyroelectric effect, a fluid-exchange solar thermal complex for gathering energy in the form of heat via thermal exchange using a fluid pumped into the solar thermal complex unheated and returned to a heat-exchanger heated, a solid-state solar thermal complex for gathering energy in the form of heat via thermal conduction along a heat pipe, and an ambient electromagnetic signal receiver and conversion complex for gathering energy in the form of electricity via analog reception of ambient electromagnetic signals, the energy-converting assemblies of a set being integrated with each other and working in concert, each set of energy-converting assemblies being arranged within an energy-gathering unit, and/or located in a remote location, each energy-gathering unit containing at least one conductive infrastructure comprising any of: an electrically conductive infrastructure layer for conducting the electricity from an electricity-producing energy-converting assembly, a thermally conductive infrastructure layer for conducting the heat from a heat-producing energy-converting assembly, and a light conducting infrastructure for conducting light that reaches the surface of the energy-gathering units to a remote location; a base unit that combines energy of each type (electricity, heat and light) from any coupled energy-gathering units, the base unit being coupled electrically to any electricity-producing energy-converting assembly arranged within an energy-gathering unit by way of one or more electrically conductive cores of its stalk branch, the base unit being coupled thermally to any heat-producing energy-converting assembly arranged within an energy-gathering unit by way of one or more thermally conductive cores of its stalk branch, and/or the base unit being coupled to any energy-gathering unit by receiving light from a light conducting infrastructure by way of one or more light-conducting cores of its stalk branch, the base unit able to serve as the remote location to which light can be conducted, and where energy-converting assemblies may be arranged, any energy-converting assemblies arranged therein being respectively able to convert the combined light from light-coupled energy-gathering units to electricity or heat, the base unit having an electricity storage device and electronics sufficient to condition electricity from electricity-producing energy-converting assemblies to charge said electricity storage device, and/or a heat storage device and heat exchanger to receive heat from heat-producing energy-converting assemblies and provide usable heat to an external system, the base unit including an output conduit carrying the combined electricity, heat, and/or light from the base unit; the power-generating apparatus as a whole resembling in form a terrestrial or aquatic plant including any of: tree, bush, shrub, aquatic plant, ground-covering plant, ivy, grass, mushroom, flowering plant, coral, algae, seaweed, and mold; the power-generating apparatus as a whole therefore, by virtue of its several integrated parts, being able to function as a full-integrated and standalone device that can produce energy in a desirable form from the environment without further modification or integration, the power-generating apparatus also being able to function as a member of a network of similar devices.

Other examples of the technology provide a plurality of methods and apparatuses for implementing solar cell, solar panels, and solar collection devices on natural looking installations such as faux trees and plants. The technology allows the installation of solar power generating installations in a distributed manner on land and rights of way already owned or controlled by municipalities or private citizens. The installation of such artificial plants as carriers of solar cells provides a number of benefits to society in addition to the generation of power. The aesthetics of a community are maintained, while at the same time the need for watering of natural plants is eliminated, providing financial and environmental savings for consumers and municipalities. The installations are capable of producing electricity and/or heat from light (e.g. sunlight) and/or from motion of a fluid (e.g. wind, waves, tides, and the like).

BRIEF DESCRIPTION OF THE DRAWINGS

FIGS. 1A-F illustrate an example embodiment of the technology in the form of a ground-based plant.

FIGS. 6A-M illustrate examples of an aquatic energy-gathering leaf with seven separate additional modes or methods of energy gathering; and a visual glossary.

FIGS. 7A-G illustrate examples of a sunlight-chasing control assembly.

FIGS. 8A-D illustrate examples of a network-level controller.

DETAILED DESCRIPTION

Figure 2A:
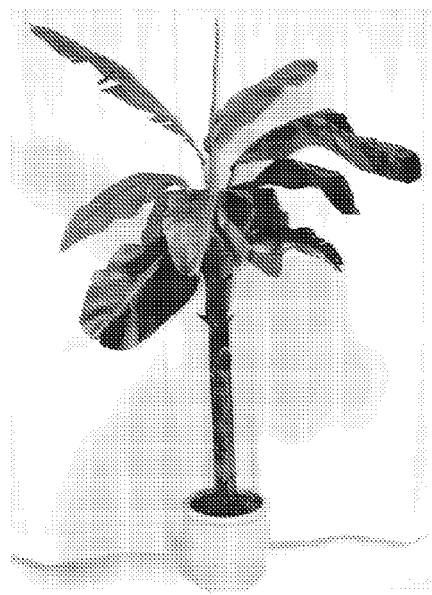
FIGS. 2A-C illustrate examples of an embodiment in the form of a tree.

The technology pertains to methods, devices, and systems for collecting energy from light or other radiation, and/or from motion of fluids (e.g. wind), and/or from ambient electromagnetic emission, involving items that are visually similar to naturally-occurring or aesthetically pleasant objects, such as trees, other plants, other landscaping items, building materials, natural non-living items, objects of art, or other items. For instance, photovoltaic materials may be applied to the surface of leaves (which can be real living leaves or synthetic leaves or hybrid natural-synthetic leaves), and electricity can be channeled along conducting media such as wires, designed to mimic and collocate with structures in natural leaves such as veins. Such leaves can be arranged in a manner that mimics any number of plants. As such, the present technology provides for a method to collect solar power or various other forms of alternative energy while not introducing items that visually disrupt natural landscapes. Furthermore the technology allows for clean, silent power generation right near or collocated with the point of energy consumption, at arbitrary density, while being aesthetically pleasing. Furthermore, the technology allows for living landscaping items to be replaced or mimicked by the installation, eliminating the need for watering and typical landscaping maintenance. Embodiments of the technology include methods and devices similar to above, yet wherein the outer surface of such devices is designed to collect light and channel it to a centralized region wherein light is converted to other forms of energy. For instance a plant made with optical fibers can conduct light to an inner chamber where a single solar array can convert light gathered from all surfaces of the plant into electricity.

The technology takes advantage of the idea of distributed generation of energy (in the form of electricity and/or heat). To date distributed generation has been applied principally at the consumer level, in the form of solar panels for roof top installations, whether for a homeowner or a commercial building. There has not been a useful intermediate step of distributed generation at the municipal or utility level, or even in the realm between full scale utility and end user. The present technology contemplates distributed generation that is scalable along the spectrum of utility, municipality, to individual building and down to a self-sustained power consuming entity for individual applications. The technology contemplates the ability to supply homes, blocks, grids of blocks, and so on, up to the city level. This not only provides for cleaner energy, it also allows the more rapid development of areas that are not currently near a power grid, obviating the need for underground or overhead physical connections via transmission wires to a central energy producing facility.

The technology is modular in nature for scalability and ease of use and assembly. This also allows for easy maintenance and upgrading of installations.

Energy-Gathering Unit

In one embodiment, an energy-gathering apparatus 2400 comprises a plurality of energy-gathering units 2412, each of which includes photovoltaic cells embodied as, or part of, a natural form. In one embodiment, the energy-gathering unit 2412 takes the form of a plant leaf comprising, integrated with, or layered with, photovoltaic cells. The system contemplates a number of embodiments of plant leaves and a number of embodiments of energy-gathering means and modalities aside from solar energy collection, and examples are discussed herein. It will be understood that the embodiments described herein are for purposes of example only, and other embodiments may be employed without departing from the scope or spirit of the system.

In choosing an appropriate shape for an energy-gathering unit, there are a number of considerations. The energy-gathering unit should be such that the most surface area is exposed to sunlight or the motive energy force. The energy-gathering unit should be appropriate for the environment as much as possible, to provide aesthetic qualities and to not be so alien from the environment as to discourage use of the system. In one embodiment, the energy-gathering unit 2412 of the system 2400 is implemented in the form of an elephant ear plant leaf.

FIGS. 1A-F illustrates an embodiment of the energy-gathering units 2412 and of the system 2400. FIG. 1A depicts a photograph an elephant ear plant. A total system or apparatus 2400 of this embodiment resembles the entirety of such a plant, including the several parts, visible and non-visible (FIG. 1C). The energy-gathering unit 2412 comprises an elephant ear leaf 2412 such as is found on an elephant ear plant (FIG. 1B), and is connected to the rest of the plant/apparatus 2400 via a stalk 2408, which can contain wiring 2414. Some advantages of this structure include the broad, contiguous surface on which to arrange photovoltaic materials, resistance to movement in wind (so that optimal location of the leaves is not likely to be altered in typical weather conditions), a thick stalk and pronounced leaf veins 2413 that can hide wiring, and relative simplicity of design and manufacturing.

The energy-gathering unit includes a plurality of photovoltaic cells (e.g. 2483*a*, 2483*b*, in FIG. 1D) formed on the surface thereof, together comprising a photovoltaic complex 2484. In some embodiments, wiring 2414 is integrated in the leaf 2412 in a similar manner to the veins 2413 on a natural leaf. In other instances, the wiring can be subsurface and installed in the most efficient manner possible. The energy-gathering leaf 2412 joins to the stalk 2408 via a connector 2432 also known as a leaf-coupling junction. This connector allows connections to all of the cells 2483 on the energy-gathering leaf 2412.

The connector 2432 may be a pin type connector (male or female as desired) and should be of a type that can securely fasten to its receiving coupling in other parts of the system. The connector 2432 should be such that when connected, the connection formed is water resistant, as the installation will be in a natural environment. For the purposes of compatibility with readily-available devices, an RJ45 type connector is used in one embodiment, which is the connector used for Ethernet computer cables. Likewise the internal wiring is a derivative of Ethernet cables. It is possible to send electrical power (not just network signals) over several of the contacts in an Ethernet cable for a reasonable distance, such that this cabling system would be sufficient for the purposes here.

The leaf 2412 may be formed from a resin, plastic, or other synthetic material, and colored in a natural manner so as to provide a pleasing and natural representation of the emulated plant. Further details are discussed below. In one embodiment, the system contemplates a plurality of sizes and colors of leaves, so that an installer can make aesthetic choices when constructing a faux plant for installation. The leaf should be constructed so that it is resistant to excessive bending in expected wind of the area of installation, improving the chances of maintaining optimum positioning of the system to receive sunlight when installed.

In one embodiment, both the top and bottom surfaces of the leaf are coated with photovoltaic material, so that electricity is produced no matter which way the leaf is oriented relative to the sun. This allows for flexibility of leaf placement, a greater range of useful angles of a given leaf; and the ability to generate electricity from reflected or scattered light (which might reach the underside of a leaf, as defined by its position relative to the sun at any given moment). The two surfaces can be considered separate circuits as desired.

Each leaf has an expected optimum power output and an expected practical power output based on the environment of installation. This allows a straightforward determination of how many leaves are required to provide a certain amount of average and peak power.

Branch or Stalk

In one embodiment of the system, energy-gathering units (leaves) 2412 are interconnected and assembled into a total system 2400 via branches or stalks 2408.

Referring now to FIG. 1B, a stalk 2408 comprises a semi-rigid member having connectors 2432 and 2440 at each end. Connector 2432, the leaf coupling junction, has multiple ports for receiving output from a number of solar cells.

Connector 2432 is coupled to connector 2440 via embedded wiring 2412 in the stalk 2408. The stalk 2408 is comprised of a semi-rigid synthetic, in this embodiment, and is of a natural color to provide aesthetic realism. Each stalk may be of different lengths and colors to emulate a naturally occurring plant as desired.

In one embodiment, the leaf coupling junction 2432 may be associated with metering circuitry so that the output and efficacy of each energy-gathering unit may be determined based on output. In this manner, if an energy-gathering unit (leaf) 2412 fails or if its performance degrades, the system can identify the specific energy-gathering unit 2412 by referring to the meter information for its corresponding port. In other instances, metering is done on a solar cell by solar cell 2483 basis, or a plant by plant 2400 basis as desired.

As described above, the connectors and ports should be such as to resist separation during expected environmental conditions. In addition, the connectors should be water resistant when engaged. The system contemplates port covers that can be used when no energy-gathering unit is coupled to a connector.

In one embodiment of the system, a plurality of leaves are assembled together via their stalks 2408 on a Plant Apparatus 2400 to form a natural looking bush or stand of elephant ear plants, which provides both electricity as well as aesthetically pleasant decoration. One embodiment of the Plant Apparatus 2400 is illustrated in FIG. 1E. The Plant Apparatus 2400 includes a plurality of energy-gathering units/leaves 2412, their leaf coupling junction connectors 2432 at the top end of the stalks 2408 and the base coupling junctions 2440 at the lower ends of the stalks 2408. Wiring 2412 is disposed within the trunk stalks 2408 and the veins 2413 of the leaves, for coupling the output of the energy-gathering leaves 2412 together. All the stalks and their respective wiring 2414 are received by a base unit 2436, via the base unit coupling junctions 2440.

In terrestrial embodiments such as the present one base units 2436 can have an above-ground portion 2436*a* as well as a below-ground portion 2436*b*. The above-ground portion 2436*a* is mostly devoted to connecting stalks, and is an efficient configuration of base coupling junctions 2440. This makes connecting and servicing units 2412 relatively easy. The below-ground portion serves to hide further electronics from view, and to attach the apparatus 2400 firmly to the ground.

The above-ground portion of the base units in one embodiment, is arrange in a roughly spherical configuration, allowing the placement of stalks 2408 at a plurality of locations about its surface, via base coupling junctions 2440. The below-ground portion of the base unit includes electronics 2407 and may include a communication module 408 (wired or wireless) so that updates and reports from the plant module may be sent to a central monitoring facility.

Electricity from all such Plant Apparatus 2400 attached to the infrastructure can be conducted to downstream elements that can be shared by one or more installations and Plant Apparatus. For instance, electricity can go through a charge controller 2409 to a battery 2411. The battery can be used to power items in the local area. Also, the infrastructure can have a power inverter 2524 to generate AC power—directly from the DC power coming from the Plant Apparatus which will vary greatly over time, or via output from a battery. In other embodiments, each Plant Apparatus includes a battery, inverter, capacitor storage, and the like in electronics module 2407. The electronics module 2407 may also include a GPS unit to allow the Plant Apparatus to record and report its exact position. This can be helpful for maintenance of a system, assist in record keeping during installation, and to ameliorate theft by the ability to track Plant Apparatuses that have been moved or taken.

In one embodiment, the Plant Apparatus 2400 has an onboard computer as part of electronics 2407 that is similar to an intelligent power meter, and it monitors how much electricity is generated by the Plant Apparatus. In one embodiment it measures the electricity from each connector on the trunk independently—thus from each leaf that is plugged in to the trunk. (In the case of non-active leaves, those input channels (connectors) simply record flat-line responses (zero current)). This computer captures instantaneous data, and records the data in an onboard digital memory and/or transmits it via the communications module 408 to a central monitoring station.

The leaves of the elephant ear plant (including their stalks) are relatively stiff in nature and do not move much under normal conditions. Therefore, a plant modeled after the elephant ear plant will not arouse much suspicion even if the leaves 2412 maintained a relatively fixed orientation with respect to the sun. This allows for a synthetic plant 2400 to be made that can balance the orientation of several leaves for the expected primary sun angles over the day and over the year, in the manner that traditional solar panels are oriented but with additional flexibility to choose multiple angles (multiple leaves; multiple surfaces on the corrugated leaves) so that different leaves have different levels of optimality relative to the sun angle at any given time of day/year.

This allows the center part of the leaf (e.g. 50-85% of the surface area) to be devoted to photovoltaic sun collection from a relatively constrained set of angles, due to its rigidity, without violating visual expectations (such as of a supple leaf) and thus without making an observer consider the plant to be likely fake or unsightly. Solar cells 2483 may be concentrated on this center portion of the leaf 2412, saving cost relative to solar cells 2483 that may otherwise experience low optimality relative to the sun angle, or the issues associated with partial shading, if they were arranged near the perimeter of leaves, which are less rigid.

Aquatic Apparatus in the Form of a Lily Plant

FIGS. 4A through 4F are schematic illustrations of an aquatic power-generating apparatus 2400 that generates power from sunlight, and optionally from the motion of water and/or air, while visually blending with a naturalistic aquatic environment. The apparatus 2400 includes a plurality of plant-like structures 2404 which in this embodiment resemble lily plants, as might naturally be found in a pond or river. They also provide an optimal configuration and surface area for solar energy harvesting due to their form.

An apparatus 2400 may be joined with one or more other apparatus 2400 to create a larger installation that can generate power over a relatively wide area. Some mechanisms for joining a plurality of apparatuses are described below. An apparatus 2400 of an embodiment schematically represented or described here can be joined with one or more others that have slight or substantial differences and thus each apparatus need not be of the identical embodiment. As an example, not intended to limit the range of possibilities, one apparatus may include the ability to generate power from the movement of air and/or water, while another one may not include this functionality. Furthermore, one apparatus 2400 resembling a lily plant and being situated in water may be connected together with other examples of the technology, such as ones that resemble land-based plants, trees, and inanimate landscaping elements, to create a larger system for gathering energy from the environment that can be deployed over a large landscape area.

Basic Anatomy of Aquatic Apparatus

Figure 4A:
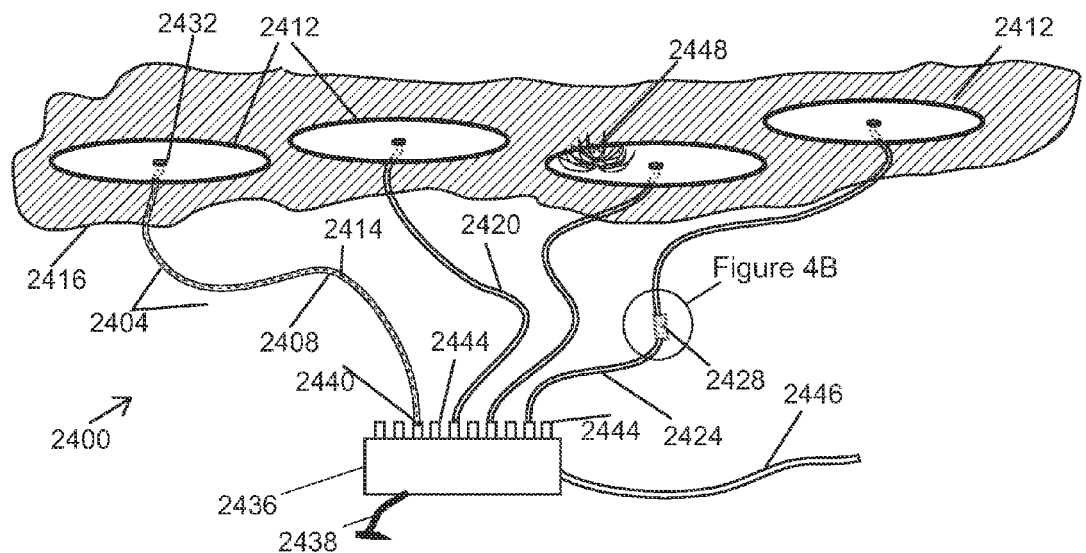
FIGS. 4A-F illustrate examples of an embodiment in the form of an aquatic plant.

Each plant-like structure 2404 includes a stalk 2408 and an energy-gathering pad or unit 2412, which resembles a lily pad in these embodiments. Energy-gathering unit, energy-gathering structure, energy-gathering pad, energy-gathering lily pad, lily pad, and pad are used interchangeably herein. The pad 2412 floats on the surface of a body of water such as a pond or river (a water surface is schematically represented in FIG. 4A as 2416). The stalk 2408 is flexible, and can have slack 2420 in it, which allows for the pad 2412 to float laterally across the pond surface in a naturalistic way and to optimally arrange itself with respect to other pads 2412 in order to harness sunlight.

The flexible, long stalks 2408 allow for the apparatus 2400 to be deployed in bodies of water of different average depths and even bodies of water which vary in depth greatly over time (such as a tidal pool, locked river, or pond that dries and swells at different times). The slack 2420 allows for the pads to remain at the water surface and not to be submerged, even if the water depth changes significantly. Additionally, stalks can be extended to an arbitrary length, by use of one or more stalk extender section 2424 that is coupled to the original stalk using a stalk connector assembly 2428. The stalk connector assembly is detailed in FIG. 4B.

The lily-like apparatus 2400 can be deployed such that the base unit sits on the bottom of the body of water. In non-flowing bodies of water such as ponds, the base unit can be unsecured. In flowing or tidal bodies of water, the base unit 2436 can be tethered to the bottom of the body of water or to another structure via an anchor assembly 2438. It is also possible for an apparatus 2400 to be entirely floating, that is to say that the base unit is not in contact with the bottom of the body of water. This configuration can work with an anchor assembly 2438 (usually in flowing water) or without an anchor assembly 2438 (usually in but not limited to static bodies of water). The output conduit 2446 can also be used to tether an apparatus 2400 or keep it within a given area.

Stalks 2408 include one or more conductive cores, and a protective housing. A conductive core can include a simple wire or other conductor, in the embodiments in which stalks carry only electricity. A protective housing can include a plastic, polymer, rubber, cloth, braided metal, or other type of sheath over the conductive core. A protective housing may be dipped, sprayed, deposited, wrapped, painted or otherwise applied directly to a conductive core. Alternatively, a pre-fabricated flexible tube may be provided separately, and the conductive core threaded through it. The stalk 2408 may get its flexibility from general malleability or flexibility of the housing and conductive core, or the housing may gain flexibility by being corrugated or comprised of a plurality of short segments (like a dryer hose).

Each stalk 2408 is connected to a pad 2412 at a pad coupling junction 2432, and is connected to the base unit 2436 via a base unit coupling junction 2440. The base unit 2436 can accommodate a plurality of plant-like structures 2404, and at any time there may be unused base coupling junctions 2444. An unused base coupling junction 2444 automatically seals itself against water. When a stalk 2408 is connected to a base coupling junction 2440, the connection can also be made to be water-sealed and very strong, for instance by virtue of threaded locking closures. Thus, any stalk 2408 can be used to pick the base unit 2436 up off the bottom of the body of water, by grasping the stalk 2408 beneath the pad 2412 and pulling firmly up, for example. This assists in servicing the apparatus 2400 or for adding more of the lily-like structures 2404 to the base unit 2436 to expand the functionality of the apparatus 2400 as a whole. Useful energy exits the base unit via an output conduit 2446. In the embodiments schematically represented in FIG. 4A-F, the output conduit 2446 conducts electricity derived from at least some of the pads 2412, which convert sunlight to electricity.

Figure 4B:
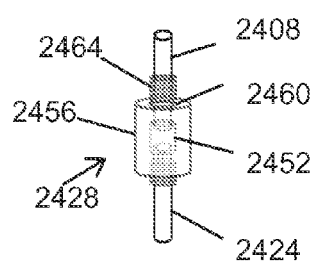

FIG. 4B is a schematic representation of one embodiment of a stalk connector assembly 2428. In this embodiment, the end of a stalk 2408 is coupled to a stalk extender section 2424 by first being introduced into an inner connector 2452, which conducts the energy (in this embodiment, electricity) between the two stalk sections. In this embodiment, this takes place within an outer connector 2456 whose inner bore 2460 is sized to fit the inner connector 2452, and which forms a waterproof seal around the inner connector 2452. Next, the stalk segments are further secured in place via threaded locking bushings 2464 that fit snugly around the stalk ends and which screw into a threaded housing within the inner bore 2460 of the outer connector 2456. These components complete the seal and secure the stalk 2408 to the stalk extender section 2424 strongly. The stalk connector assembly 2428 in this embodiment is similar to the pad coupling junction 2432 and base unit coupling junction 2440 but it is two-ended. That is to say, that one end of a stalk 2408 could fit into a top of a stalk connector assembly 2428 or into a base unit coupling junction, and the other end of a stalk (or a stalk extender section 2424—see below) could fit into the bottom of a stalk connector assembly 2428 or into a pad coupling junction 2432. Many other types of connectors are possible and the use of stalk extenders is not limited to any one type of connector.

Stalk extender sections 2424 are essentially the same as stalks 2408, in many embodiments, except in how they are employed (to extend the lengths of stalks 2408). In some embodiments, they have the same types of endings as stalks, and thus can be interchanged with stalks 2408. In these embodiments, the pad coupling junction 2432 can be connected directly to a stalk 2408 or a stalk extender section 2424, because the endings of each are the same. Advantageously, a broken stalk 2408 can be replaced by a stalk extender section 2424, and advantageously a total apparatus 2400 can be constructed, stocked, shipped, and assembled more easily because stalks 2408 and stalk extender sections 2424 can be interchanged.

In some embodiments, however, stalks 2408 and stalk extender sections 2424 are in fact different, much the same as USB extension cables differ from USB patch or device cables. This allows for stalk extender sections 2424 to be manufactured, stocked, marketed, sold, and assembled separately and with different prices and availability. It further allows control over how many extender sections will be supplied to and strung together by a user, which can have safety and compliance implications.

In some embodiments of an apparatus 2400, the stalks are of varying lengths, within a broad range, such that lily pads 2412 have different amounts of slack 2420 in their stalks 2408 and therefore can float laterally along the surface of a body of water to different distances relative to the center of the apparatus 2400 or relative to the placement of the base unit 2436. This has the utility of generating a more naturalistic appearance of the apparatus as a whole, which increases the likelihood of adoption and acceptance of the apparatus 2400 in human visible areas, especially high-value areas that may come under close human inspection.

Networking by Connecting Base Units

Figure 4C:
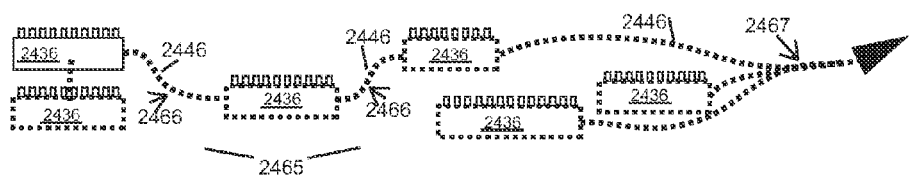

Referring to FIG. 4C, the base unit 2436 of one apparatus 2400 can be connected together with the base unit 2436 of another apparatus, which may be an identical apparatus or one with functional differences. Base units can be connected in series or in parallel or in other configurations, such that the electricity or other energy flowing out via the output conduit 2446 of each can be pooled and transmitted onward similarly to how the energy from a single base unit is transmitted. A plurality of base units can be connected to form a network 2465 of base units, and thus a network 2465 of aquatic power-generating apparatuses in the form of lily plants 2400, wherein such a network 2465 as a whole may resemble a larger stand of lily plants and may cover the surface of a larger body of water. The size of such an installation is in principle nearly unlimited.

In such a network 2465, individual apparatuses 2400 may have different size base units 2436, which are thus capable of attaching different numbers of plant-like structures 2404 (see FIG. 4C), and indeed each apparatus 2400 may have a varying and changeable number of plant-like structures 2404 attached at any given time and thus a varying number of their base coupling junctions (2440 and 2444) utilized. As noted above, base units 2436 in a network 2465 may be from apparatus of very different kinds including aquatic units that do not resemble lily plants (for instance those that resemble coral), or even land-based units nearby. In this way, the larger category of embodiments is modular and becomes very flexible, since their parts or interchangeable and/or networkable.

Base units 2436 in a network 2465 can be connected according to several paradigms, including but not limited to ones in which base units are connected such that the output conduit 2446 from one base unit 2436 feeds into a next base unit 2436 (this paradigm is marked as 2466 in FIG. 4C), or ones in which base units 2436 are connected such that the output conduits extend together but separately, conducting energy together toward a common output (this paradigm is marked as 2467 in FIG. 4C).

It is important to note that a paradigm 2466 of output conduits from one base unit 2436 feeding into downstream base units 2436 does not imply a convention of wiring "in series", in a strict electrical sense. The internal configuration of a base unit has different arrangements in different embodiments and is not necessarily as simple as a direct electrical circuit. Moreover, in several embodiments, as discussed below, more than just electricity is received by the base units 2436, for instance thermal energy.

In any such a network 2465, standard wiring practices may prevail. For instance, as needed, one or more DC ground fault interrupter may be installed, for instance in addition to an earth ground, in order to avoid surges such as from lightning. Individual base units 2436 and the combined system may be fused appropriately. Other standard wiring practices as are known to an electrician or engineer of regular skill are included implicitly herein.

Networks 2465 also include the embodiments, features and advantages as described elsewhere in regard to networks 2808, in reference to FIGS. 8A through 8D.

Electricity Output—Example Targets

In embodiments where the output conduits 2446 carry electricity (exclusively or in part), said electricity is conducted and provided to one or more targets amongst a wide range of targets. For instance, in some embodiments, electricity passing via the one or more base units 2436 is provided to an energy storage device, such as a battery, a battery bank, a super-capacitor, an electrically coupled flywheel, a superconducting energy store, or other electricity storage device; and/or is provided to a derivative energy storage device such as one that converts the electricity to mechanical energy (e.g. a rotating item), thermal energy (e.g. a heat reservoir or steam generator), potential energy (e.g. water pumped up a water tower; or a large suspended weight that can be raised or lowered), chemical energy, synthesis of materials for fuel cells, or the like.

Supercapacitors (or electric double-layer capacitors EDLC) have many of the benefits of capacitors (e.g. superfast charging, solid state, low cost, extremely long life, high output power, safety) and many of the benefits of batteries (ability to discharge in part not just all at once like conventional capacitors, energy storage). Contemporary EDLCs have surpassed the energy density of lead-acid batteries (which are dangerous, heavy, and constrained in their form factors and sizes), and are well within an order of magnitude of the energy density of lithium-ion batteries. In fact experimental grapheme-based EDLCs are within the range of energy densities of lithium ion batteries. Therefore, supercapacitors are extremely advantageous for alternative energy applications. Herein, references to batteries or other electrical storage devices are to imply alternatives where EDLCs are employed, alone or in conjunction with batteries or other energy storage devices.

In some embodiments, electricity (whether directly from the apparatuses or from energy storage devices) is provided to an inverter. The inverter generates alternating current (AC) from the direct current (DC) input. In the case of systems that provide electricity directly to the grid, a grid-tie inverter (GTI) may be used. Electricity can thus be provided to downstream elements in AC or DC, and it can be provided immediately, or after some delay or over some extended period (because it can be temporarily stored).

A wide variety of downstream elements or targets exist, to which this electricity can be provided. For instance, the electricity can be fed into a national electrical grid, fed into a local electrical grid, used directly to supply power to a business (such as a data center or hospital or factory or any other kind of business), used directly to supply power to a home or school or community center, used directly to power one or a plurality of devices, or used in any other way or combination of ways. A device or plurality of devices as might be directly powered can include any device whatsoever, for instance but not exclusive to: lighting, heating units, water filtration devices, water treatment devices, broadcast antennae or towers, cameras, seismographs, other monitoring devices, network access points, and any other device or combination of devices.

Lily Flowers

Artificial lily flowers 2448 are placed on pads 2412, and distributed across a set of pads 2412 in a pseudo-random and naturalistic pattern to assist in the visual similarity to natural lily plants. Such lily flowers 2448 are of at least two varieties: one variety is inert (functioning for visual realism only) and another variety has materials on its surfaces that make use of sunlight to generate usable energy. The same or similar embodiments of the energy-gathering complex 2468 as described below for lily pads 2412 also here apply to lily flowers 2448. (An energy-gathering complex 2468 is a collection of active layers or devices that act or assist to gather energy of one form or another from the environment and which are arranged upon part or all of a surface of an energy-gathering unit 2412. Within the energy-gathering complex 2468 can be one or more energy-gathering assemblies 2602, such as a photovoltaic complex 2484 that can include an integrated solar cell or cells). Such embodiments as apply here for lily flowers 2448 include but are not limited to, for example, flexible photovoltaic surface coatings, thermoelectric coatings, and/or thermal conduction layers (see FIG. 4E and FIGS. 6A through 6I)—with the exception that these energy-gathering assemblies are arranged in a three-dimensional configuration resembling a natural flower of a natural lily plant.

When lily flowers 2448 of the active variety are placed on pads 2412, they are connected to the apparatus 2400 in order to provide energy to the system. In one embodiment, a wire from the lily flower 2448 is connected to a connector on the top or bottom surface of the pad 2412, separate from or integrated with the pad coupling junction 2432. Electricity generated by the lily flower 2448 is thus fed into the system and is conducted down the stalk 2408 along with electricity generated by the pad. Lily flowers 2448 in one embodiment have a light assembly and an energy storage device such as a battery (separate from any as may exist for the pad (2412) or apparatus 2400 as a whole). Electricity derived from the energy-gathering materials on the surface of the lily flower 2448 is provided to the energy storage device via a conductor such as a wire. Continually or at times such as at night, electricity from the energy storage device is provided to the light assembly which provides illumination. A light assembly may include a light bulb or a light-emitting device such as a light-emitting diode or other light-providing item. Illumination provided by the light assembly may illuminate the lily flower and/or the lily pad and/or the surface or surrounds of the body of water.

Further Details of Base Units

Solar cells have a very complex relationship between their operating environment and the power they can produce, and this means that the power output changes from moment to moment. For instance, the power output of a cell relates to the amount of sunlight, the wavelength (color) profile of the sunlight—which changes during the day and because of atmospheric contents, the angle of the panel relative to the sun, the operating temperature, any shading that occurs, any dirt on the solar cell, and other factors. For any given set of conditions, there is one particular voltage and current point that will result in the maximum power being delivered by the solar cell. Based on Ohm's law, one simply needs to adjust the resistance (load) on the circuit in order to force the solar cell into operating at that exact combination of voltage and current. Therefore, if one simply adjusts the resistance on the circuit containing a solar cell, it will produce its maximum power. However, there are two complexities.

For one, the ideal resistance changes from moment to moment because the environmental conditions do, and secondly, the ideal resistance for one solar cell will be different from another if there is any difference in the intrinsic electronics of the panels, or if they have different amounts of shade or dirt on them, for instance. Therefore, even if one adjusts the resistance on the circuit at each moment, if the circuit includes multiple solar cells with different properties, the resistance level is typically not ideal for all the cells.

This is what leads to problems with partial shading: if a large array of solar cells experiences even a small amount of shading, the whole system can shut down or greatly reduce its power output. This effect, however, is in part due to the typical wiring of arrays of solar cells, and of the equipment that is used most typically to run them.

Namely, largely arrays of solar cells and solar panels are often wired in series, and the ideal resistance point is often set for an entire string of cells/panels. Therefore, if even one panel is affected in some way, it can take out the whole string. Furthermore, if the ideal resistance point for one or a few solar cells changes drastically (due to shading for instance), the typical system will set the resistance point to accommodate that panel(s) and the output of the whole array will plummet.

Furthermore, the very nature of photovoltaic materials means that they are susceptible to essentially internal shorting, and a decrease in output can actually go so far as to reverse the flow of current, back into the solar cell.

These problems are particularly important in the some examples of the present technology for several reasons. First of all, photovoltaic materials are arranged upon surfaces that are not simple and planar like a typical solar panel, but rather they have complex topography (such as lily pads, leaves, and other embodiments as described below). Such surfaces themselves can lead to self-shading or parts of the photovoltaic materials, and such contexts imply potential for shading, e.g. from other leaves. The complex surfaces, in contexts appropriate for vegetation, are also difficult to keep clean. Furthermore, the present embodiments often involve relatively small contiguous surfaces, and large sets of them, each in a somewhat different orientation or set of environmental conditions. Additionally, a key feature of several examples of the technology is modularity—including that a variable number of energy-gathering structures, such as solar leaves or lily pads, can be plugged into a base unit.

Therefore, a wiring configuration analogous to the most prevalent (and simplest) wiring configurations for traditional solar arrays would lead to many problems, in the context of the present technology. The present technology includes innovations to address these potential problems. Some are drawn from existing modern photovoltaic systems and some are specific to the technology. Several of the solutions are implemented in the base unit 2436 of a given energy-gathering apparatus 2400.

As mentioned above, in order to get the maximum power out of a solar cell, a resistance or load must be applied across the circuit that contains it, in order to adjust the voltage versus current such that they result in the ideal combination for the particular environmental and intrinsic conditions of that solar cell. Ascertaining the ideal resistance is call maximum power point tracking (MPPT). This is often done by a large-scale inverter that connects a large string of panels and does MPPT as part of its functionality. However, in several present embodiments, an alternative method is preferable. Namely, MPPT can be done separately from inversion, and can be done for each subunit, for instance for the output of each pad 2412.

Figure 4D:
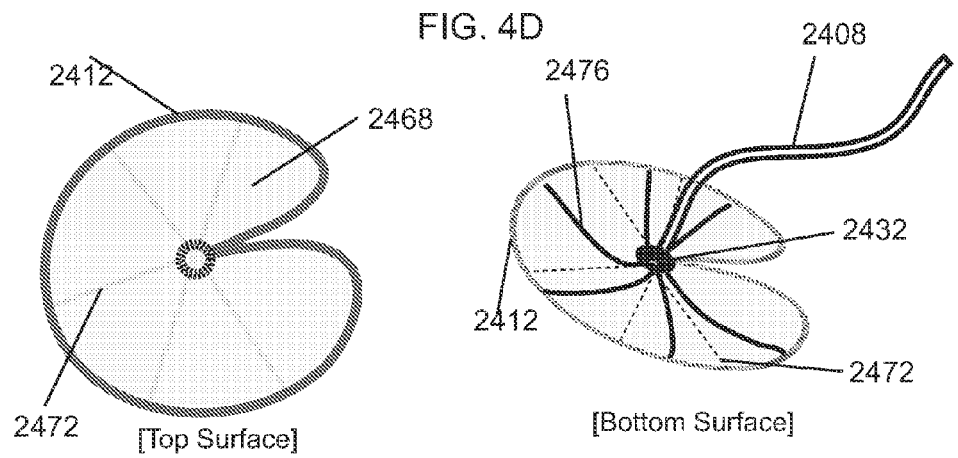
Figure 4E:
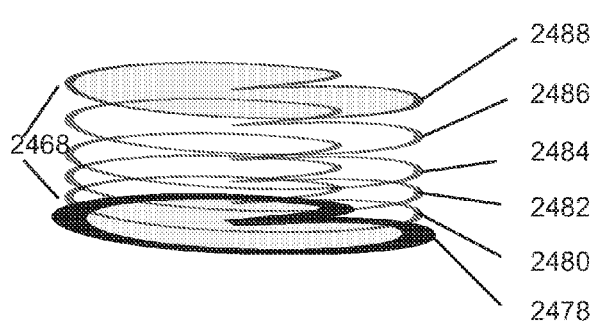
Figure 4F:
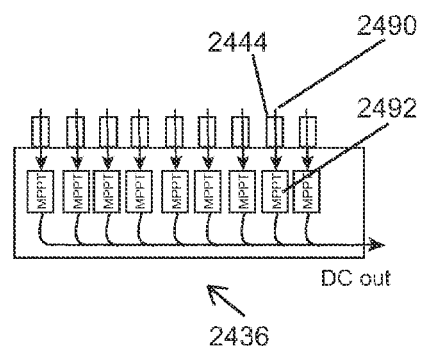

FIG. 4F is a schematic representation of a base unit 2436 with circuitry to accomplish the MPPT. For each base coupling junction 2444, a conductor 2490 such as a wire is represented, which conducts the electricity passing down each stalk 2408 ultimately from each energy-gathering lily pad 2412. The conductor 2490 leads to an MPPT device 2492 that provides maximum power point tracking (MPPT) and applies the relevant resistance across the circuit on a moment by moment basis. This assures that the maximum possible power is output from the photovoltaic materials on the lily pad 2412. DC current is then conducted from the MPPT devices 2492, and combined with the output from all the other MMPT devices 2492. The combined DC output can then be provided to all downstream elements.

The FIG. 4F focuses on the MPPT functionality and omits several types of circuitry that may be required, or optionally included, in a base unit 2436. Note that an MPPT device usually regulates its output voltage. That is to say, the output voltage of an MPPT device can be fixed, for instance at the voltage level that is appropriate for a battery or battery bank. The reason that this is worth noting is that the above description points out that the maximum power point for a solar cell will be some equilibrium of voltage and current such that the voltage times the current yields the highest power. Implicit in this, is that the output voltage will vary. The MPPT device, in applying the ideal resistance, will also vary the output voltage of the solar cell itself. If the MPPT device then passed on that same voltage, one would have the problem of variable voltages in the final output, which makes outputs from multiple circuits hard to combine and makes charging batteries difficult. However, MPPT devices generally include another step: they convert the output of the solar cell from DC to AC, and then convert it back from AC to DC but with a fixed final output voltage. Thus, the final output of each MPPT device 2492 in this embodiment will be at the same voltage (though with different amperage ratings). This makes it possible to simply combine the outputs as depicted, for instance to conduct to a single inverter directly or to conduct to a battery or battery bank for charging. This is relevant because in some examples relatively small solar collectors produce relatively low voltage, so an MPPT device can increase the output voltage so that it matches that of any battery or battery bank in the system.

An individual MPPT device 2492 may not be needed for each lily pad 2412. The reasons is that, for the most part, lily pads 2412 will be under similar sunlight and temperature conditions and their surfaces are relatively flat and point in the same direction. (These are some of the advantages of making a naturalistic alternative energy collector in the form of a lily plant). Therefore, to reduce cost and complexity, a single MPPT device 2492 may be included in a base unit 2436. In this embodiment, the conductors 2490 carrying electrical output from all base coupling junctions (and thereby from all installed lily pads 2412) feed into the one MPPT device 2492. The MPPT device 2492 then optimizes based on the entire apparatus 2400, which may work well so long as individual pads 2412 are not under very different conditions. The output DC electricity from the MPPT device 2492 can then be conducted to downstream elements as before.

Figure 5A:
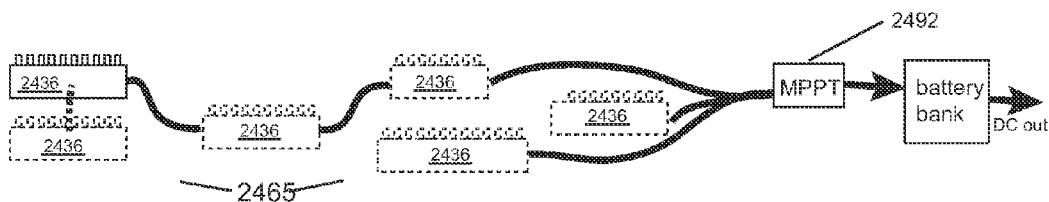
FIGS. 5A-G illustrate details of an aquatic embodiment including base units, a network of units, and surface coatings for photovoltaic power generation.

In the case of a network 2465 consisting of a plurality of base units 2436 (and thus a plurality of lily-like apparatuses 2400), the network 2465 may be configured to have less than one MTTP device per base unit. That is, the entire network may feed into a single MTTP device 2492, or there may be a plurality of MTTP devices 2492 but less than the number of base units 2436 (e.g., one MTTP device 2492 for one subgroup of base units 2436). This can be accomplished by disabling the MTTP device 2492 in some number of base units 2436 and routing the output through to a base unit 2436 with the MTTP device 2492 enabled; or, in other embodiments, there may be not MTTP devices 2492 in the base units 2436, and there would be a stand-alone MTTP device or devices 2492 into which the output of the base units 2436 feed (see FIG. 5A).

In a contrasting alternative embodiment, one MTTP device 2492 may be provided for each segment of a lily pad 2412, where a lily pad 2412 is divided into several segments that each function as if a separate solar cell. In the present family of embodiments, with energy-gathering pads 2412 like lily pads, this level of granularity is less necessary: because each segment of a pad 2412 will usually have the same or similar environmental conditions. However in other examples of the technology, such as in land-based plants or trees or non-animate landscape elements, this type of paradigm is more important because different segments of for instance a curved and complex surface may be under very different illuminance conditions. In such an embodiment, a separate conductor 2490 from each segment of a pad 2412 leads to a separate MPPT device 2492. Otherwise, the paradigm is similar to above.

In alternative embodiments, a supercapacitor may be provided at each lily pad 2412, or electrically independent segment thereof, to receive incoming electricity and to accumulate or buffer it. The supercapacitor is then connected into the rest of the circuitry as otherwise described, so that its electricity output is conducted to the base units 2436 and onward. In such a configuration, the supercapacitor(s) can be implemented as a thin layer in addition to other layers of the lily pad 2412, perhaps situated immediately beneath the photovoltaic complex 2484 or above the lily pad substrate 2478. Alternatively, a supercapacitor may be provided in a base unit 2436 or in a network 2465. Supercapacitors can condition or smooth the output power and can provide energy storage with very rapid charging, almost no degradation over time, potentially low cost, and other advantages include the ability to shape them in a broad array of configurations such as a flat and flexible layer of a leaf such as a lily pad.

Figure 5B:
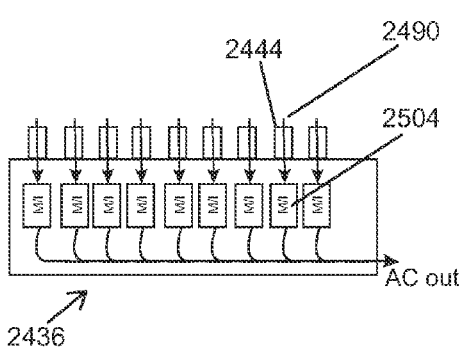

FIG. 5B schematically represents an alternative family of embodiments that also address the issues above related to managing differing outputs of individual lily pads 2412 or segments thereof. Namely, the electrical output from each lily pad 2412 is conducted to a microinverter (MI) device 2504.

All alternative embodiments based on MTTP devices as described elsewhere herein, such as those with a single MTTP device 2492 for each plurality of lily-like apparatuses 2400, also apply but with microinverter devices 2504 instead of MTTP devices 2492.

In other embodiments, embedded microcircuit-versions of an MTTP or microinverter are built directly into the lily pad or other energy-gathering structure, directly in contact with the photovoltaic components. Thus the solar cell is already optimized and/or the output is already conditioned when it is conducted down the stalk 2408.

An MTTP is a subtype of a larger family of electronic devices, namely the charge controller. Overall, a charge controller regulates the voltage that comes out of a solar cell or array of solar cells (or any other device) and delivers downstream an output voltage that is appropriate, for instance for a battery.

Figure 5C:
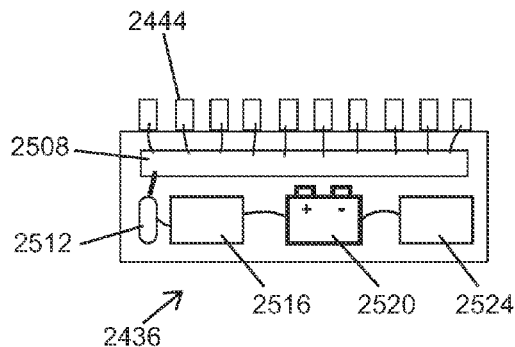

FIG. 5C schematically represents a base unit 2436 with several of the archetypal components that may be included in various embodiments. Incoming electricity from all connected pads 2412 is conducted along a conductor to a combiner 2508 and pooled into one output charge. Then output electricity is conducted along a conductor to an optional rectifier diode 2512, which prevents back-feed. Back-feed is when electricity would flow back from for instance a battery and into a solar cell when the output of the cell falls and yet the battery is charged. Next, the DC current is conducted to a charge controller 2516. This charge controller may be an MPPT device 2492 or it may be another form of a charge controller device, perhaps a simpler one. Then the regulated power is conducted a battery or battery bank 2520 (similar to 2716). DC electricity can then be drawn from the battery or battery bank 2520, for instance to directly power devices. The DC can also be converted to AC power, via an inverter 2524. These downstream elements, e.g. a battery and/or an inverter, can be centralized and stand-alone, as in FIG. 5A, and thus shared across many devices.

The circuitry in a base unit 2436 does not have to be bulky, nor expensive. For instance, a combiner 2508 can be a very simple circuit that ties all incoming lines together. A charge controller can be implemented as a charge controller integrated circuit (charge controller IC). A charge controller IC can be a tiny circuit and can be low cost, especially for relatively low voltages and/or currents as may be expected in individual apparatuses of the kinds described above. Such charge controller IC's are for instance often integrated into simple cell phones and personal music devices.

As such, base units 2436 can be economical, lightweight, practical, solid-state, interchangeable, networkable, and easy to produce, stock, ship, assemble, and integrate. Each lily pad 2412 has an expected optimum power output, as well as an expected in-practice power output based on the environment of installation. This allows a straightforward determination of how many pads 2412 and total apparatuses 2400 are required to provide a certain amount of average and peak power for the total installation of network 2465.

Further Details of Energy-Gathering Units

The present technology contemplates a number of embodiments that resemble lily plants as well as other plant leaves or parts, and examples are discussed herein. It will be understood that the embodiments described herein are for purposes of example only, and other embodiments may be employed without departing from the scope or spirit of the system.

In choosing an appropriate functional configuration and shape for an energy-gathering unit, there are a number of considerations. For example, the energy-gathering unit should be such that the most surface area is exposed to sunlight or the motive energy force as much as possible, with as few surrounding occludes as possible. The energy-gathering unit should be appropriate for the environment as much as possible, to provide aesthetic qualities and to not be so alien from the environment as to discourage use of the system. In the first family of embodiments, the energy-gathering unit of the system is implemented in a form resembling a living lily pad, in the context of a system that overall resembles a living lily plant or stand of lily plants, when observed from an expected viewing distance.

FIG. 4D is a schematic representation of a single energy-gathering lily pad 2412, according to one embodiment. The energy-gathering lily pad 2412 is depicted from both the top surface (from directly above) and the bottom surface (tilted, with stalk extending up and out of the page), as noted on the figure. The pad 2412 and surface are crafted to look photorealistic in their resemblance to natural living lily pads.

This visual emulation of a living plant greatly increases the acceptability of these devices in public areas, which greatly increases the amount of energy such as sunlight that can be harnessed from a given human-populated area. Such populated areas are precisely where energy is in the greatest demand, and traditional power plants are least desired because of their undesirable looks, noise, odors, pollution, hazards, and overall degradation of property values. Thus it is an important function and practical economic and political advantage to increase the acceptability of an alternative energy harnessing apparatus. Therefore, specific technology that enables alternative energy harnessing devices which can hide in plain sight are a substantial advance to the field.

The photorealistic top surface of the lily pad 2412 of the present family of embodiments is covered by an energy-gathering complex 2468 that serves to generate electricity and/or gather heat energy from sunlight, in this embodiment. The composition, manufacture, and functionality of this example are detailed below. The energy-gathering complex 2468 may or may not be divided into lateral segments, demarcated by segment boundaries 2472 as in FIG. 4C (top surface view).

In FIG. 4D, the stalk 2408 and pad coupling junction 2432 are visible along the bottom surface of the pad 2412. Additionally, insulated, electricity-gathering wires 2476 are schematically represented. The insulated wires 2476 conduct electricity generated by the respective segments of the energy-gathering complex 2468 along the underside of the pad or are integrated into the substrate of the pad, and feed into the pad coupling junction 2432 through which their electricity is conducted along the stalk 2408 toward the base unit 2436.

FIG. 4E is a schematic representation of one embodiment of a lily pad 2412, representing some of the functional surfaces and layers that allow it to function as an energy-gathering device. The base layer is a substrate 2478 that forms the base of the lily pad leaf, and keeps the device afloat. The lily pad substrate 2478 may be buoyant in water, and may be made of materials such as plastic or polymer or foam or other materials. The lily pad substrate 2478 is manufactured as a synthetic plant, to appear alike a lily pad, according to manufacturing techniques for high-quality outdoor synthetic plants, including visually realistic color and texture, especially on the bottom side and any upturned edges. Next is an insulating backing layer 2480 as a base for the photovoltaic complex. This backing layer 2480 serves a similar function to a "primer" coat, in paint For instance, it readily adheres to the lily pad substrate 2478 with a strong bond, and it forms a smooth surface to which the layers of the photovoltaic substance or other active surfaces will readily adhere. This layer has functional advantages in that the backing layer 2480 can remain constant and well controlled, and tuned to receive the active layers that will come on top of it—even if the lily pad substrate 2478 may vary quite a bit in composition. This allows for the manufacture process to begin with commercially available synthetic plants such as plastic, 'silk', or 'cloth' plants that may be made by other suppliers and with no knowledge of their intended purpose as energy-gathering plants. This poses advantages in terms of cost control, the ability to change suppliers readily, as well as the control of intellectual property (e.g., suppliers do not know the rest of the manufacturing process nor the intended final products). Thus, the backing layer 2480 forms a reliable physical barrier and junction between the inert lily pad substrate 2478 and the active layers above (2482-2490). This all being said, some embodiments omit the backing layer 2480, rendering them simpler and potentially cheaper to produce. In these embodiments, further layers are assembled directly on top of existing synthetic plants, or are fabricated in an integrated fashion: incorporated directly into the surface structure as the lily pad substrate 2478 is made. Many other configurations and means of manufacture exist and are incorporated into the present technology.

The next layer of the energy-gathering complex 2468 in this embodiment, as depicted schematically in FIG. 4E, is a conductive infrastructure layer 2482 that can conduct electricity, for instance from active layers above such as photovoltaic layers, and provide it to the pad coupling junction, to be conducted away by elements within the stalk 2408. This conductive infrastructure layer 2482 can be like a sparse wire mesh, in some embodiments, and the wires are prepared to conduct the output of photovoltaic substances. This infrastructure layer also can be arranged in several segments such that overlying photovoltaic substances form into segments or compartments that are independent or semi-independent (as described below). This helps assure that partial shading of the pad 2412 is not as deleterious as otherwise. The infrastructure layer need not be physical wires or wire mesh, but can be any type of conductive lanes. For instance, it can be a layer that is sprayed, etched, photolithographically arranged, self-assembled, adsorbed or otherwise arranged directly on to whichever surface is below; and it may be made of any conductive substance not limited to metals nor metal-derived substances. Furthermore, the infrastructure layer may not be deposited or manufactured separately from other layers, above or below. For instance, a backing layer 2480 or indeed the lily pad substrate 2478 itself may be molded, pressed, solidified, injected, sputtered, deposited, painted, or otherwise fabricated and may incorporate into it the relevant conductive lanes. Likewise, an active layer such as a photovoltaic layer may be deposited with a network of conductors directly laid in. Many other configurations and means of manufacture exist and are incorporated into the present technology.

Conductors 2476 such as wires are arranged in some embodiments to follow the paths normally taken by the "veins' of natural plant leaves, such as living lily pads in this case. Thereby, two functional advantages are conferred. First of all, necessary conductors 2476 are "hidden" because they fit into patterns that are expected in natural plants. Secondly, the photorealism of the lily-shaped energy-gathering apparatus 2400, or other plant-resembling apparatuses, is increased by the presence of synthetic "veins". Conductors 2476 can be housed in green plastic housings, for instance, and adhered into place according to patterns based on living leaves of the same type. Alternatively, conductors 2476 can be incorporated into the lily pad substrate 2478 (or equivalent, for non-lily embodiments), when these are manufactured. Such in-built conductors then are prepared to be connected to outputs from electricity-producing layers that are later applied, such as a photovoltaic complex.

As per FIG. 4E, in an embodiment schematically represented, the next layer of the energy-gathering complex 2468 is a photovoltaic complex 2484. The photovoltaic complex is described in detail below, but in essence in this embodiment it is comprised of thin-film photovoltaic (PV) layer, for instance a dye-sensitized solar cell (DSSC) assembly, which is sprayed or otherwise applied on to the insulating backing layer 2480 and conductive infrastructure layer 2482. This spraying is done layer by layer, because a DSSC entails several layers (see below). Next is an optional one-way mirrored surface 2486 to let sunlight pass in but then bounce back the light that is invariable reflected by a PV surface, so that the PV has one or more extra chances to absorb the light. Finally this embodiment optionally has a green-reflecting layer 2488 (a layer of material that lets most light pas through but reflects or refracts a fraction of the green light back to the observer) to impart a green appearance on the whole assembly.

Further Details of Energy-Gathering Unit Composition

The lily pad substrate 2478 may be formed from a resin, plastic, foam, gel, or other synthetic material, or a combination of these or other materials. The lily pad substrate 2478 may be colored in a natural manner so as to provide a pleasing and natural representation of the emulated plant. In one embodiment, the system contemplates a plurality of sizes and colors of pads 2412, so that an installer can make aesthetic choices when constructing a faux plant for installation, for example. The pad 2412 should preferably be constructed so that it is resistant to excessive wear and tear in expected sun, wind, rain, snow or other environmental conditions of the area of installation. This improves the chances of maintaining optimum positioning of the system to receive sunlight when installed, and improves the appearance.

Further Details of Photovoltaic Complex

In the energy-gathering lily pads 2412 in the embodiments described above (photovoltaic only), the key energy-gathering component of the pads 2412 is the photovoltaic complex 2484 (and to some degree the conductive infrastructure layer 2482). This section provides some further detail of the photovoltaic complex for these embodiments, which can be extended and homologized to other embodiments as described elsewhere herein.

On the surface of the buoyant lily pad substrate 2478, or on the backing layer 2480, is thin-film photovoltaic material. In a category of embodiments, the photovoltaic material (which allows for the production of electricity directly from sunlight) is of the class of materials called "thin-film solar cells". These are solar cells that can be thin—only a millimeter for instance—and can also be flexible: like a sheet of paper. One type of thin-film solar cells employed is the Dye-Sensitized Solar Cell (DSSC) such as illustrated in FIG. 5D and FIG. 5E.

For instance, dye-sensitive solar cell (DSSC) materials are deposited directly on the substrate or backing layer, e.g. layer by layer. That is to say, the thin-film photovoltaic material that comprises the photovoltaic complex 2484 is actually constructed/manufactured directly in place—directly on the pads 2412. The pads can be sourced from external manufacturers, or can be manufactured at the same time as the active coatings are applied or integrated directly. On this base, the rest of the DSSC is constructed, thus forming the photovoltaic complex 2484 as per FIG. 4E.

Referring to FIG. 4E, the base layer, namely the lily pad substrate 2478, is manufactured in place or readied for further deposition. Then an optional backing layer 2480 of material is spray-deposited on the plastic surface that acts as an in-between layer: to protect the plastic surface of the lily pad substrate 2478 and to protect chemical or any effects from that surface from affecting photovoltaic layers. The in-between layer also helps the first layer of the DSSC assembly to stick.

Figure 5D:
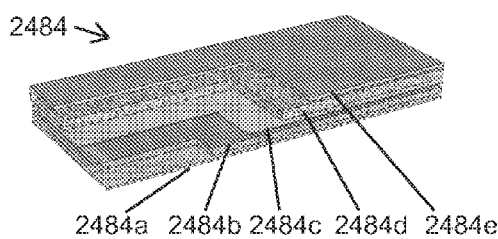
Figure 5E:
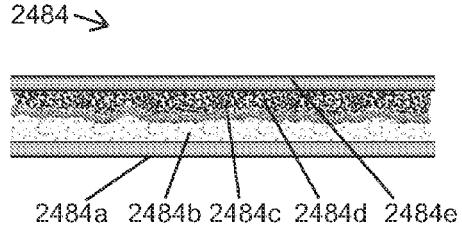

Referring now to FIG. 5D and FIG. 5E, the sub-layers of the photovoltaic complex (collectively 2484) are schematically represented in individual detail. During manufacture, the first layer 2482a of the DSSC is applied. This can be a thin layer of platinum. The platinum layer can act as a catalyst and a cathode. This layer can be sprayed or electroplated or vapor-deposited (CVD), deposited photo-catalytically, vapor-deposited in a vacuum, plasma-assisted chemical vapor deposited (PACVD), physical vapor deposited (PVD), simply applied as platinum foil, applied by decomposition of chloroplatinic acid, deposited by decomposition of a Karstedt catalyst (in the presence of xylene, for instance, or hexamethyldisilazane), deposited using a cold process—for instance by decomposition of dimethyl(cyclooctadiene) platinum ("CODPtMe2") and for instance spin-coating, and/or any combination of these processes, and/or other processes. Choice of method depends on several factors including temperature profile and durability of the lily pad substrate 2478 or whatever is being used as a base layer (plastic substrates, for instance, probably would melt at normal process temperatures for CVD). Given the simplicity of the DSSC materials, simple spray-application, at cold temperatures, is possible. It is possible to apply at least some of the materials via a modified inkjet printer head. However, for other embodiments (see below), these other methods of application may be employed.

Next, an electrolyte layer 2484b is applied to the platinum layer 2484a, in this embodiment. For instance a liquid electrolyte layer rich in iodide can be used.

In alternate embodiments, a solid electrolyte layer can be used instead, which eliminates some constraints imposed by a liquid layer when the DSSC is deployed on a flexible surface.

Next, an outer membrane can be prepared which will be applied, later, over the plastic leaves that have been coated as above.

The outer membrane can be a clear plastic or a protected-plastic sheet, on which fluorine-doped tin dioxide (SnO2:F) 2484e or pyrolytic carbon or other similar material is deposited. Next, a thick, porous layer of titanium dioxide (TiO2) nanoparticles 2484d can be deposited onto the SnO2:F layer.

Next a photosensitive organic dye layer 2482c, for instance ruthenium-polypyridine dye, or a relevant type of porphyrin, or other dye, can be applied. For instance, such a dye can be applied with a solvent and let to soak into the titanium dioxide nanoparticle layer such that dye molecules cover some of the surface area of that layer. Then the solvent is washed away and a complex layer of the light-sensitive dye remains as a coating on the titanium dioxide.

Note, other dyes can be used, for instance with the goal of matching the desired color scheme of the final product. This is not the only way to adjust the final apparent color, however it is one way. Dyes with a green hue, for instance, may be chosen in order to increase adoption and deployment of device in public areas (because they will look a naturalistic green and thus harmonize with other plants).

At this point, the outer membrane is prepared to be applied to the prepared lily pad substrate 2478, in this particular embodiment. The outer membrane is now introduced to the platinum-prepared lily pad substrate 2478, with the organic-dye layer 2482c facing toward the platinum-coated surface of the lily pad substrate 2478.

To summarize (refer to FIG. 5D and FIG. 5E), the lily pad substrate 2478 (with whatever insulating layers, e.g. 2480) is prepared with a first layer of platinum 2484a that acts as the cathode (and catalyst), and second layer of electrolyte 2484b, which can do electron transport. On top of that is a third layer comprising an organic dye 2484c (electron donor) which is distributed over the many surfaces and cavities of a fourth layer comprising titanium dioxide 2484d. On top of that is a fifth layer, a clear conductive oxide layer 2484e such as fluorine-doped tin oxide, which acts as the anode. This is one example embodiment of the photovoltaic complex 2484, and many embodiments exist, both containing DSSC variants and containing other photovoltaic materials.

Note, in alternative embodiments, all layers can be deposited and grown directly on the lily pad substrate 2478, rather than applying a separate outer membrane layer. For instance in some embodiments, a solid layer is employed instead of the liquid electrolyte layer. With no liquid layer, it is easier for all layers of the photovoltaic assembly to be applied by spraying, or a method of physical or chemical deposition.

A vast range of possible photovoltaic materials and means of deposition/manufacture exist, which would suit the present family of embodiments. The present description of a DSSC-based photovoltaic complex is only supplied by way of illustrative example. The technology contemplates a broad range of viable possibilities. The primary requirements for a photovoltaic material for the photovoltaic complex is that it be fairly flexible rather than rigid. A green-color appearance is a benefit but is not required, because partially-reflective or partially-refractive coatings or materials are employed in order to return some light in the green spectrum to the observer and thus to give the viewer the impression that the overall surface is green. These coatings nonetheless transmit most of the light to the photovoltaic material below.

In some embodiments, the photovoltaic material is segmented into multiple solar 'cells' 2472 by processes such as etching, photolithography, or the manner in which the conductive infrastructure 2482 is laid down, if this is desired. The cells can be segmented logically, for instance where a cell includes one or more surfaces that have similar topography, or which will be likely to support versus not support a solar lily flower 2448. This way, the cells will receive sun to a similar degree at every part of the cell, at any given sun angle or level of shading, which is advantageous for some configurations of photovoltaic materials and cells. This is particularly important for other embodiments, such as ones that involve complex leaves of ground-situated plants, that might receive complex shading patterns.

DSSC Dyes and Other Methods to Achieve a Green Color

As noted above, DSSCs use an organic dye, and this imparts on them their color. It is advantageous for some embodiments of the present technology to be able to appear green in color, because most plant leaves have a green color for much of the year (due to their Chlorophyll content). Accordingly, many embodiments of the present technology utilize commercially-available dyes that appear green in color for the organic dye layer of a DSSC-based photovoltaic complex 2484. This provides great functional advantages.

In some embodiments, green dyes are extracted directly from plant matter. Leaves and other chlorophyll-containing parts of plants are crushed, dissociated using ultrasound, extracted using known series of solvents, strained, boiled, and/or otherwise treated in order to release their dyes. Plant material is derived in some embodiments directly from the types of plants that are emulated by said embodiments, for instance in this case from natural lily plants. Alternatively, commercial and landscaping waste, such as grass clippings from golf courses and hotel grounds, are purchased for a low cost and thus eliminated from waste treatment facilities. Dyes derived in any of these ways are candidates for use in DSSC embodiments.

Independently of source or process, green-color dyes are employed in some embodiments in the DSSCs. In this way, plant matter is used in order to further the illusion that the synthetic energy-gathering devices are natural plants Indeed the plant items they emulate evolved to convert sunlight to useful energy, so using plant-derived dyes, especially chlorophyll itself, completes a circle and makes a lot of metaphorical and functional sense.

Embodiments utilizing DSSCs are not limited to those with green dyes. Dyes that are currently used or will be used for DSSCs in general are also applicable here, including but not limited to Ruthenium based dyes that have recently been shown to produce DSSCs with efficiencies approaching crystalline silicon solar cells.

The present technology includes many other methods (aside from green DSSCs) for achieving a color pattern, texture, and overall hue (usually green) such that embodiments fit in with the expected surrounding scenery, especially in the context of natural greenery.

Figure 5F:
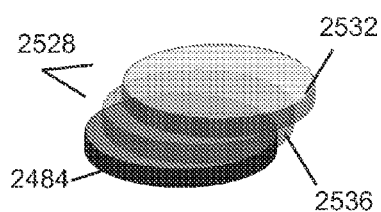

FIG. 5F is a schematic representation of one embodiment of a color masking device 2528, designed to impart a green hue upon the appearance of an underlying item (such as a photovoltaic complex 2484) while minimizing the amount of light transmittance that is lost. In short, the color masking device includes at least two layers, which are designed to work together in order to achieve the color masking yet phototransmission functionality: one to bounce some green light back to the observer but let in the rest, and one to disallow light from bouncing back out to the observer if it first bounces off underlying layers such as a non-green photovoltaic complex. See below.

A first layer of the color-masking device 2528 is a narrow-band reflective or refractive layer 2532. This layer has the property of reflecting or refracting a narrow band of visible light, for instance concentrated in the part of the electromagnetic spectrum that is perceived as green by humans with normal eyesight. It also preferably has the property of transmitting a wide band of electromagnetic radiation, including most visible light as well as ultraviolet (UV) and infrared (IR) radiation.

Figure 5G:
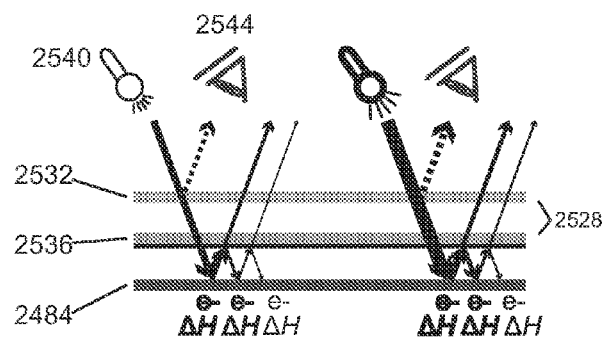

Referring to FIG. 5G, such a narrow-band reflective or refractive layer 2532 in this embodiment appears green to a human observer 2544, if a light source 2540 is shined on it against the side facing said observer 2544. At the same time, it allows most light that can be used for photovoltaic production of electricity to pass through to underlying photovoltaic complex 2484.

The material forming the narrow-band reflective or refractive layer 2532 may be deposited by CVD, PACVD, PVD, sputtering, spraying or other method, and may be thus deposited onto a separate substrate or film that will later be combined with a device such as an energy-gathering lily pad 2412. Alternatively, the materials may be thus applied directly to an energy-gathering lily pad 2412 or other embodiment, as part of a multi-layer deposition or assembly process. Application of such a layer is similar to the applications of filters and special coatings on optics items such as SLR camera lenses and mirrors.

A second layer of the color-masking device 2528 is a one-way mirror layer 2536. This one-way mirror layer 2536 has the property of transmitting most incident light that arrives from one side, but reflecting a large proportion of light that arrives from the other side. This is the kind of device used for interrogation or observation rooms, where an observer on one side perceives it as a regular mirror but an observer on the other side can see through the glass and watch the first observer. (Such devices are sometimes confusingly called "2-way mirrors", and at times even "three-way mirrors"). The one-way mirror layer 2536 is arranged so that the transmissive surface faces up (toward the sun) and the reflective surface faces down (toward other layers, for instance a photovoltaic complex 2484. This means that light arriving from above, for instance sunlight, mostly passes through and can reach the photovoltaic materials below. In contrast, any light that is reflected by said photovoltaic material is reflected back toward the photovoltaic materials, where it has another change to be absorbed and/or converted to electricity. Thus, the one-way mirror layers 2536 confers including that, a.) a larger proportion of arriving sunlight may be utilized for producing electricity, and b.) little light that reached the photovoltaic materials heads back toward the observer and thus the color of the photovoltaic materials is less apparent to the observer.

Referring again to FIG. 5G now, light from a light source 2540 hits the narrow-band reflective or refractive layer 2532: some of the green light is reflected back to the observer, and most light as well as UV and IR are allowed to pass through. The observer perceives the device as green because of the reflected/refracted light. The light that passed through layer 2532 then hits the one-way mirror layer 2536: and most of it passes right through, because this is the transmissive side/direction. The light next hits the photovoltaic complex 2484, at which point it has lost only some green light and little else. The photovoltaic complex 2484 converts or absorbs much of the light (producing electricity and heat), but some reflects back. The reflected light (likely a dark blue color, for most photovoltaic materials) then hits the reflective surface of the one-way layer 2536: most of the light is reflected back toward the photovoltaic complex 2484 but some escapes the one-way layer and further escapes the green-reflective layer 2532 and reaches the observer. Meanwhile, light reflected by the one-way layer 2536 then hits the photovoltaic complex 2484 once again, and the same process repeats: much gets absorbed or converted, some gets reflected, and most of that is once again reflected toward the photovoltaic complex 2484 while a little escapes back toward the observer.

The brighter the source light (FIG. 5G on the right), the more reflected light may escape after being reflected by the photovoltaic complex 2484, however, commensurately more green light is reflected or refracted toward the observer by the first layer 2532 to accommodate for this.

It is advantageous if the outer layers of an energy-gathering lily pad 2412 block as little as possible radio-frequency (RF) electromagnetic radiation, for embodiments of the present technology that harness RF radiation to generate electricity (described below). In these cases, mirrored surfaces that contain only a small amount of metal are preferable. Therefore, in several embodiments, the two-way mirror layer 2536 is comprised of a pyrolytic mirror. That is, instead of using a metal-rich silvered mirror surface to create the two-way mirror layer 2536, a pyrolytic coating is applied instead. The pyrolytic coating can be thin and contain less metallic substance than a typical silvered mirror, and therefore block less RF. For instance honeycomb-configuration silicon carbide coatings can be used for the mirrored surface. These coatings can be applied by CVD, PACVD, PVD, sputtering, or other methods. Another pyrolytic coating compound is SnO2:F, which happens to also be a candidate compound for the anode layer of a DSSC embodiment of the photovoltaic complex 2484. In this manner, the respective layers can be arranged such that the SnO2:F layer can serve double duty. Namely, the green-refractive or reflective layer 2532 can lie atop a thickened SnO2:F layer, which serves both as two-way mirror layer 2536 of the color-masking complex 2532, and as the anode layer 2484e of a photovoltaic complex 2484.

The materials that comprise a color-masking device 2528 can be first applied to a transparent film and that film can be applied to an energy-gathering lily pad 2412 or other apparatus. Alternatively, these materials can be applied directly, onto underlying layers.

The present technology anticipates integrated devices that include a color masking device 2528 that is integrated along with one or a combination of the other layers described elsewhere herein. As such, an embodiment may have several active layers or complexes, and may gather energy from the environment from multiple sources (e.g. light, RF, etc.) and via multiple processes (e.g. photovoltaic effects, thermoelectric effects, pyroelectric effects, etc.).

Embodiments of the technology include those reassembling plants that are not green in color, thereby obviating the need to put a green appearance on photovoltaic materials, which generally are not green in color. Some plants that are emulated by said embodiments include: Japanese maple, aeonium, *Alocasia infernalis*, and several varieties of succulents and cacti.

Some Advantages of DSSCs

Above are mentioned some of the challenges that typical solar cell installations face with regard to occasional or partial shading, which are exacerbated particularly in the present invention due to the complex and potentially self-shading configurations that are necessary to produce naturalistic conformations as described above and elsewhere herein. Likewise, above, some advantages of the present invention are discussed that counteract these issues such as specific paradigms of wiring, for instance embodiments that involve MPPT devices 2492 or microinverters 2504 in-line in the circuitry. (Such devices can be installed for each lily pad 2412 (See FIG. 4F and FIG. 25B), or for each base unit (see FIG. 5C), or for each network 2465 (see FIG. 5A), or in other configurations). The present section describes why the choice of which particular photovoltaic materials to use, in some cases, has an effect on this concept as well, and why the choice to use dye-sensitized solar cell (DSSC) technology confers particular advantages upon those respective embodiments of the invention.

Some background is necessary to illustrate why these advantages exist.

A highly simplistic description is the following: in most solar cell materials, incoming sunlight kicks electrons up out of their normal arrangement to create the electricity, but these electrons leave 'holes' when they are kicked and they can fall right back into those holes. When there is not enough sun to keep kicking the electrons out of their orbits they can fall back into the holes in enough numbers to short-circuit the whole cell. Therefore shadows can short-circuit the cells, and low-light conditions are difficult: below a certain threshold of sunlight the cells don't just produce a lower amount of electricity, they produce none.

In contrast, DSSCs are different. The electrons are injected by the Titanium dioxide rather than being kicked up from within the main semi-conductor. Therefore, no holes are created so the electrons cannot fall back in when lighting conditions are low. Technically there are two ways that the electrons could be reabsorbed before becoming part of the desired current flow, namely combining with the dye or the electrolyte. However, kinetics are favourable in this example—namely, those reactions are categorically slower than the competing reactions that are part of normal DSSC function, so in practice the electrons released by incoming light rarely fall back in. Therefore, DSSCs are particularly advantageous for low-light applications, and for applications that may involve partial and occasional shading.

Therefore the embodiments of the present invention that employ DSSC materials and similar types of photovoltaics benefit from their several advantages including their light weight, flexibility, easy of manufacture, low cost of manufacture, environment friendliness of manufacture, quantum efficiency, stability, rapid innovation due to current research focus on them, ability to be colored green (for realism in plant-resembling embodiments), and also this quality of handling low-light and partial shadow conditions well.

Further Examples of Photovoltaic Complex

A photovoltaic complex 2484 can include any photovoltaic material or any other material having the property of developing a charge separation or a current when exposed to light or other electromagnetic radiation.

Thin-film and organic photovoltaic materials are particularly advantageous in this technology because many (but not all) of the embodiments appear more realistic when physically flexible or pliable.

A partial list of some materials that can be utilized in construction a photovoltaic complex 2484 includes: graphene, organic photovoltaic material, amorphous silicon, cadmium telluride, copper indium gallium selenide, other materials combined from groups XI, XIII, and XVI of the periodic table of elements, and other materials, current and future, known to have photoelectric properties.

Processes for Depositing Photovoltaic Materials

PVD—physical vapor deposition—is an advantageous method of material application because of its low process temperature range. This is important because the substrate 2478 in many embodiments is a plastic or polymer (for flexibility). Chemical vapour deposition CVD is a common process for surface coatings, however the usual CD process temperatures are much above the melting points of most plastics likely to be employed here. However, PACVD or plasma-assisted CVD has a range of process temperatures reaching down to 300 degree Celsius or even 200 degrees Celsius. In this lower range of PACVD process temperatures, several types of plastics remain solid and thus might be compatible with PACVD coating processes to deposit materials that have photovoltaic, thermoelectric, or pyroelectric properties.

Some of the chemical processes implied in PACVD may also cause compatibility issues with certain plastics. To address this concern, plastics or polymers such as may be used here can be pre-treated. Some pre-treatments can involve a first coating of the item, with a coating that is protective against chemical interactions in PACVD processes. A pre-treatment coating can also be protective in terms of temperature. A pre-treatment coating can include metals or metal-derived substances. A plastic member can be metalized before applying a PACVD process. As an example, a plastic lily pad substrate 2478 can be metalized in a separate process and then PACVD can be used to apply coatings that can include photovoltaic materials, pyroelectric material, thermoelectric materials, heat-conductive materials, heat-insulative materials, electrically-conductive materials, electrically-insulative materials, piezoelectric materials, and/or other materials.

A further advantage of embodiments that involve metalizing a plastic layer as a pre-treatment is that one or more metalized layers can be applied (in some cases in conjunction with interposed insulating layers) and one or more metalized layer can be etched or lithographically arranged. The effect of this would be to create a pattern of conductive pathways in one or more layer. That is to say, the surface can be made to function like a set of wires. These 'wires' can in some embodiments be used to conduct electricity from active layers such as the layers mentioned just above including photovoltaic layers. For instance, a conductive infrastructure can first be laid down, and then the photovoltaic materials can be chemically deposited, thus forming a solar cell in place, on the desired substrate.

HIPAC, APA-Arc methods may be appropriate in some cases. Some processes do not need any high-temperature deposition method. For instance DSSCs can be sprayed on, layer by layer, with a modified inkjet printer head.

The choice of plastics or other materials is of course also important in designing the process. In the case of embodiments where at least one layer of the energy-gathering complex will be applied directly and with a relatively hot process, a high-temperature plastic is advantageous. Some types of plastic that might meet this constraint, include, in part: PET-P, PEEK, and Nylons. These are better, for instance, than polystyrene, polyphenylene, or polyethylenes, because the latter three have lower melting points. Many additional factors are important in choice of substrate material, including durability, flexibility, toxicity, risk of outgassing during manufacture, appearance, ability to take patterning and coloration well, and so forth.

Any and all materials to be deposited or otherwise arranged can first be arranged on an intermediary substrate, and then be physically fitted onto a substrate such as a lily pad substrate 2478. That is to say, that energy-gathering assemblies 2602 can be created on a film that is compatible with processes such as CVD or PACD, and then this film can be physically applied to a pre-made plastic leaf—as a representative example.

Beyond Color: Texture and Pattern for Realism

To create a visually realistic synthetic plant requires more than a green color. Realistic textures and patterns are preferable, and should be patterned on or visible at the outer surfaces of such plants. Some embodiments of the present technology have a base layer, a substrate 2478, which is patterned to resemble a plant part such as a lily pad/leaf. However, when there are other layers atop this substrate, such as a photovoltaic complex 2484, patterns from the substrate 2478 will not show through. Therefore, in some embodiments a visible top layer 2604 is patterned with realistic features. Such features include large and small veins on the leaf structure, color variation, and irregularities and topography that create an organic and natural look.

Some embodiments of the visible top layer are generated by laser-scanning a living plant part (such as a leaf, or lily pad) and then 3D-printing a version in plastic or a resin or a polymer. Some embodiments are created from actual living leaves, which are then treated for instance by being impregnated with glycerin or a plasticizer, and/or coated. (This method is also used in some embodiments of the substrate 2478.) Some embodiments are injection-molded or sprayed onto a film or cast or prepared in a manner that is typical of the manufacture of flexible plastic parts. Veins can be used for the dual purpose of hiding wires.

The natural (fractal-like) configuration of veins and venules confers advantages on such embodiments, as the configuration is an efficient means of covering a 2D territory, and of extracting current from photovoltaic materials.

FIG. 6A is a schematic representation of a visible top layer 2604 that in this case resembles a living lily pad. The visible top layer 2604 is shown in the context of other layers that make up a lily pad energy gathering device 2412, with the layers exploded in 3D. This is the depiction that will be used for further embodiments, below. In this depiction the bottom layer is the lily pad substrate 2478. Above it are several layers, which taken as a whole form the energy-gathering complex 2468. An energy-gathering complex includes one or more energy-gathering assembly 2602, as well as assistive layers. In the embodiment represented in FIG. 6A, there is only a first energy-gathering assembly 2602a, which specifically is a photovoltaic complex 2484, as described and dissected in detail above (FIG. 5D and FIG. 5E: layers 2484a-2484e are all examples of components that can be contained with energy-gathering assembly 2602a). Assistive layers include a backing layer 2480 between the substrate 2478 and the first energy-gathering assembly 2602a. Above that is an upper layer 2608. This layer 2608 embraces several possible layers including a one-way mirror layer 2536 but also other coatings that can be positioned over a photovoltaic complex 2484. Above that is a finish layer 2606, which also can embrace several types of layers including a reflective or refractive layer 2532.

FIG. 6B is a schematic representation of an energy-gathering unit 2412 in the shape of a lily pad, with the several layers from FIG. 6A further collapsed (though not drawn to scale), and with a second energy-gathering assembly 2602b interposed amongst the layers, below the first energy-gathering assembly 2602a. In the sections below, many variants of a second energy-gathering unit 2602b are described.

Additional Examples of Energy-Gathering Unit—Other than Photovoltaics

Thus far, the energy-gathering lily pads 2412 that have been described only produce electricity, and they do so based on sunlight, via the photoelectric effect. The present technology contemplates a much broader scope. The description has been constrained to photoelectric production of electricity in order to focus on the detailed structure of one (lily-pad) embodiment of the present technology.

All of the permutations of the lily-pad embodiment, as described above or below, for individual apparatuses or for networks, shall be considered as applying to any of the further embodiments below of a lily-pad type energy-gathering apparatus but which utilize more than the photoelectric effect. In turn, all of those embodiments, as well as all of the categories of embodiment that utilize more than the photoelectric effect, shall be considered as applying to all the embodiments described much below, which do not resemble lily plants but rather which resemble other plants as well as other non-plant objects.

The families of embodiments described in this section all can be thought of as iterations on the lily-pad apparatus 2400 described thus far, but wherein the lily pads 2412 and in some cases the stalks 2408 and base units 2436 are used to gather energy from their environment in additional ways. These are schematically represented in FIGS. 6A through 6K, and described below.

In these figures, the various layers, coatings, devices, or other elements included or amended in each family of embodiments are schematic and not literal, in particular their thickness or extent are not drawn to scale. In particular their thickness is not to scale relative to the thickness of the lily pad substrate 2478 nor relative to the thicknesses of each other layer or element.

Thermoelectric

FIG. 6C schematically represents a family of embodiments wherein the energy-gathering lily pad 2412 has, in addition to the photovoltaic complex 2484, a means for gathering energy in the form of electricity, via the thermoelectric effect. In these embodiments, a second energy-gathering assembly 2602b is a thermoelectric complex 2610. A substance that exhibits the thermoelectric effect (which has subtle variants) will develop a charge separation when one side of it is heated while the other side is cool relative to the heated side. The larger the temperature separation, the larger the charge separation. In this way, if a thermoelectric substance is arranged such that a top surface receives an appreciable amount of heat, and a bottom surface is in contact with a relatively cool substance that has a high thermal conductivity and high heat capacity, then heat will be drawn away efficiently from the bottom surface and the temperature separation will be maintained and the thermoelectric substance will continue to generate electricity, for instance all through the day.

The conditions of an energy-gathering unit 2412 emulating a leaf, particularly a lily pad, are ideal for thermoelectric generation. In an example embodiment (FIG. 6C, middle), a thermoelectric sheet 2614 is positioned beneath the photovoltaic complex 2484. Photovoltaic materials generate heat when in use. The heat comes from light that is absorbed by the photovoltaic material but is not converted to electricity by the photoelectric effect. In this case, the operating heat 2612 transfers to the upper surface of the thermoelectric sheet 2614. Meanwhile, the bottom surface of the thermoelectric sheet 2614 is continually exposed to relatively cool conditions 2616 by the water below. This heat differential drives the thermoelectric effect, especially the Seebeck effect, and an electric charge is generated. Conductive leads 2618 are arranged to conduct this charge, and it is combined with output of any other energy-gathering assemblies 2602 such as the photovoltaic assembly 2484 in this embodiment.

In order to benefit from the cooling effects of the water maximally, in some embodiments, the sheet of thermoelectric material 2614 is brought into thermal contact with the water, either by directly touching it physically or by touching a material with a high thermal conductivity that directly touches the water. In FIG. 6C, rightmost panel, for instance, the underside of a lily pad 2412 is represented. On this underside, the lily pad substrate 2478 and any backing layer 2480 have been penetrated by thermal conductor patches 2620, which conduct heat from the thermoelectric assembly 2610 to the water. Alternatively, the entire lily pad substrate can be comprised of a material with sufficient thermal conductivity to do the heat exchange.

In another example embodiment (not mutually exclusive with the thermal conductor patch 2620 method), a heat sink assembly 2624 is arranged below the lily pad, for instance attached to the stalk 2408. The heat sink assembly 2624 efficiently dissipates heat from the thermoelectric sheet 2614 into the water below the lily pad 2412, thus driving the thermoelectric effect. Heat is conducted to the heat sink assembly 2624 from the underside of the thermoelectric sheet 2614 via a modified stalk 2408 which is modified to contain a heat pipe 2622. The heat pipe is an extruded member alike a water pipe or a thick wire, made of or containing material(s) with high thermal conductivity. The material or another member can flare outward from the stalk coupling junction to create a sheet under the thermoelectric sheet 2614, acting as a funnel for heat, to conduct heat from the thermoelectric sheet 2614 into the heat pipe 2622.

Materials to be used for thermoelectric generation include all thermoelectric materials currently and to be developed, include lead telluride, bismuth telluride, bimetallic junction material, carbon nanotube/polymer materials, graphene nanomaterials, and others. Thermoelectric generators are usually rigid structures. In the present technology, the thermoelectric sheet is thin and flexible. To achieve this, materials such as tellurides and graphene materials are coated in a thin coat on a membrane, and the whole assemble can be flexed. Also, such materials can be arranged in a series of smaller strips so that they flex past each other when the assembly is bent or perturbed. This can assist with the wiring/circuitry, as a plurality of smaller generators can be arranged in a circuit to address impedance limitations. Future thermoelectric materials will have greater efficiency and greater flexibility and are incorporated here.

Even after sunset, some heat will remain in the photovoltaic and other layers, and therefore these embodiments can generate electricity a little bit longer after dark than pure photovoltaic devices. This smoothing of the production time further across the day-night cycle can be exaggerated if a heat reservoir is interposed between the photovoltaic complex 2484 and the thermoelectric complex 2610. This arrangement is of particular use in other embodiments covered below, where the apparatus 2400 is larger and/or more rigid, and can hide a larger heat reservoir.

The nature of the present technology—namely, it being an emulation of a plant—becomes particularly advantageous here. Because a lily pad is continually exposed to a relatively large body of water (and a terrestrial leaf is exposed to free-flowing air) the side that is not exposed to the sun is usually being cooled readily and passively. Furthermore, integration with a photovoltaic substance (in those embodiments in which it is) means that heat at the adjacent surface is abundant. Indeed, heat released by a photovoltaic substance is usually considered a waste, and in fact local heating causes photovoltaic materials to run less efficiently. Therefore, any mechanism to draw away the heat is an advantage, and the fact that the removed excess heat can be used to generate useful electricity is a bonus. Furthermore, heat is eventually transferred to the water. This can have an additional benefit of intentionally heating the water so that it is more pleasant for humans to use, or for instance is more hospitable for exotic fish species such as koi. Therefore, the nature of the present technology confers particular functional advantages toward the goal of gathering alternative energy from the environment, and integrated embodiments that employ photovoltaic and thermoelectric means have particular advantages that are greater than the sum of their parts.

Pyroelectric

FIG. 6D schematically represents a family of embodiments wherein the energy-gathering lily pad 2412 has, in addition to photovoltaic complex 2484, a means for gathering energy in the form of electricity, via the pyroelectric effect. In these embodiments, the second energy-gathering assembly 2602b is a pyroelectric complex 2626. Pyroelectric materials generate an electrical charge whenever they are subjected a change in temperature. They do not need the temperature gradient that thermoelectric species do but they do require changes in temperature.

In some example embodiments, the pyroelectric complex 2626 includes a sheet of pyroelectric material 2628, and conductors 2618 arranged to conduct the charge generated by the sheet 2628.

Artificial pyroelectric materials can be made in a thin-film configuration, which is beneficial for the present embodiments. Some pyroelectric materials that can be used include but are not limited to: polyvinylidene fluoride, gallium nitride, polyvinyl fluorides, cesium nitrate, lithium tantalate (e.g., produced by the Czochralski method), cobalt phthalocyanine, PZT, triglycine sulfate, lead zirconate, strontium barium niobate, PVDF, barium titanate, lithium sulfate monohydrate, and other pyroelectric materials.

During normal functioning, temperatures in energy-gathering units 2412 are likely to fluctuate and these fluctuations can be converted to electricity by the pyroelectric complex 2626. Particularly, when passing cloud or passing shadows cause a decrease in sunlight and thus in the output of the photoelectric complex 2484, a commensurate fluctuation in operating temperature is converted to an increased output from the pyroelectrical complex 2626. Thus, the two subsystems complement each other, especially when there are frequent fluctuations in illumination such as on days with an abundance of "fair-weather" cumulus clouds in otherwise blue sky.

Solar Thermal

FIG. 6E schematically represents a family of embodiments wherein the energy-gathering lily pad 2412 has, in addition to photovoltaic complex 2484, a means for gathering energy in the form of heat, via thermal exchange using a fluid pumped into the pad structure unheated and returned to a heat-exchanger heated. In these embodiments, the second energy-gathering assembly 2602b is a fluid-exchange solar thermal complex 2630.

In some embodiments, the fluid-exchange solar thermal complex 2630 includes a heat exchanger layer 2632, which in turn includes a spiral-tube heat exchange assembly 2634. Relatively cold fluid (e.g. water or other fluid—liquid or gas) is pumped into an intake tube 2636. The cold fluid circulates through the spiral piping of the heat exchange assembly 2634, gradually being heated by the heat 2612 generated in overlying layers. Eventually the fluid passes all the way through and exists the fluid output tube 2638. At this point in time, the exiting fluid carries with it usable heat. The heat in some embodiments is used to heat the body of water in which it is placed, and in some embodiments it is used in order to heat a home or a commercial structure, or in other ways impart its heat in a useful way. The piping of the heat exchanged 2634 is flexible and soft.

FIG. 6F schematically represents a family of embodiments wherein the energy-gathering lily pad 2412 has, in addition to photovoltaic complex 2484, a means for gathering energy in the form of heat, via thermal conduction along a heat pipe. In these embodiments, the second energy-gathering assembly 2602b is a solid-state solar thermal complex 2640. The solid-state thermal complex 2640 includes a heat reservoir 2642 made of a some solid or fluid material that can absorb relatively a lot of heat.

Connected to the heat reservoir 2642 in this example embodiment is a heat pipe assembly 2644. The heat pipe assembly can be integrated within the stalk 2408, as a flexible tube or pipe of a solid, gel, paste, liquid, gas, powder, or other substance, which can conduct heat sufficiently to draw it away from the heat reservoir and thereby draw it away from heat-generating components of the pad 2412 such as a photovoltaic complex 2484. The heat pipe assembly 2644 may include or be attached to a heat sink 2624 or similar heat disperser, for instance in the water below the pad 2412. The heat pipe assembly 2644 may conduct heat all the way to the base unit, where it can be combined with heat drawn from other structures and there utilized. In general, the heat can be used, as described above, to heat the water in the body of water in which the apparatus 2400 is situated, or may be conducted elsewhere, for instance, to heat a home or commercial structure or other entity. Heat may also be used for other purposes such as to drive chemical reactions, to drive a Stirling engine, or other purposes.

Radio-Frequency (RF) and Other Electromagnetic Radiation

Figure 6G:
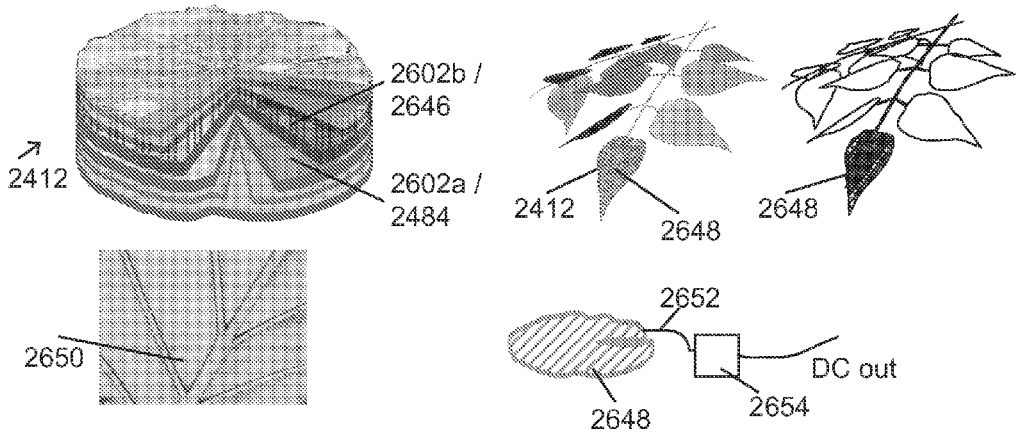

FIG. 6G schematically represents a family of embodiments wherein the energy-gathering lily pad 2412 has, in addition to photovoltaic complex 2484, a means for gathering energy in the form of electricity, via analog reception of radio-frequency (RF) and other ambient electromagnetic signals (em). In these embodiments, the second energy-gathering assembly 2602b is a radio-frequency (RF) and other em receiver and conversion complex 2646. Note that here the second assembly 2602b is placed physically above the first assembly 2602a, because the second assembly 2602b, as an em receiver and conversion complex 2646, a.) should not be blocked by the circuitry of a photovoltaic complex 2484, and b.) can be configured to transmit a large proportion of incoming light.

Embodiments of an energy-gathering unit 2412 that include an em receiver and conversion complex 2646 can be configured, in whole or in part, to harvest electromagnetic radiation that is found in our everyday environment, whether from natural or man-made sources. FIG. 6G, right, depicts a schematic representation of an energy-gathering leaf unit 2412 (here a deciduous tree leaf not a lily pad) that is an example energy-gathering unit for harvesting em radiation.

The energy-gathering leaf 2412 in this embodiment has a series of conductive filaments 2648 (which can be wires) that can act as an analog antenna/receiver. The conductive filament can be a so called "nantenna" which is a nanoscale antenna and can be printed directly onto a substrate, in this case onto a layer of the leaf 2412. Additional embodiments employ wire "coils", for instance enshrouding a stalk 2408, or in a flat annular coil arrangement on the surface layer of an em receiver and conversion complex.

FIG. 6G, rightmost, also depicts a wireframe model of the same set of leaves 2412, with the filaments 2648 filled in for only one leaf (implied for the rest). The natural vein structure 2650 of natural leaves is very useful as an opportunity to hide wiring/conductors used for em harvesting. Furthermore, the geometric arrangements of veins and venules is a result of evolution for millions of years and the function of these structures is to feed and extract materials efficiently from a complex 2D surface of a leaf. As such, mirroring the same geometry confers functional advantages to the present technology.

Harvesting of em radiation can begin with receiving electromagnetic signals by way of the filament structures 2648 in a leaf 2412. These signals are conducted to a rectifying and smoothing circuit 2654 by way of a wire 2652. Next, DC electrical output is conducted from the rectifying and smoothing circuit 2654 to downstream elements as described above, for instance charge controller circuits, batteries, and inverters.

The conductive filaments 2648 can be fabricated from a wide variety of conductive substances. Some embodiments utilize Mu Metal for the filaments 2648, because it very efficiently channels magnetic fields and it can absorb RF very well. In this manner, mu metal is useful for achieving better energy harvesting, and also for better shielding.

Shielding in some cases is useful for protecting the device from which emissions are being harvested—for instance by creating a faraday screen for a computer or other installation. Shielding in some cases is about protecting the environment or people from emissions—for instance by absorbing or shunting EM emissions from power substations. That is to say, an installation of apparatuses 2400 that incorporate em receiver and conversion complexes 2646 into their energy-gathering units 2412 can have the effect of absorbing stray em radiation, and thereby protecting people, e.g. from cancer. This is particularly useful in embodiments other than lily pad aquatic embodiments, for instance in embodiments that resemble ivy. Such ivy can be deployed directly on the fences and walls of power substations, high-voltage power line pylons, and broadcast tower bases, among other places, and thus can protect humans from the em radiation while also generating useful electricity from the em that would otherwise be spilled into the environment and left unused.

Fiber Optics and Other Light-Channeling

Figure 6H:
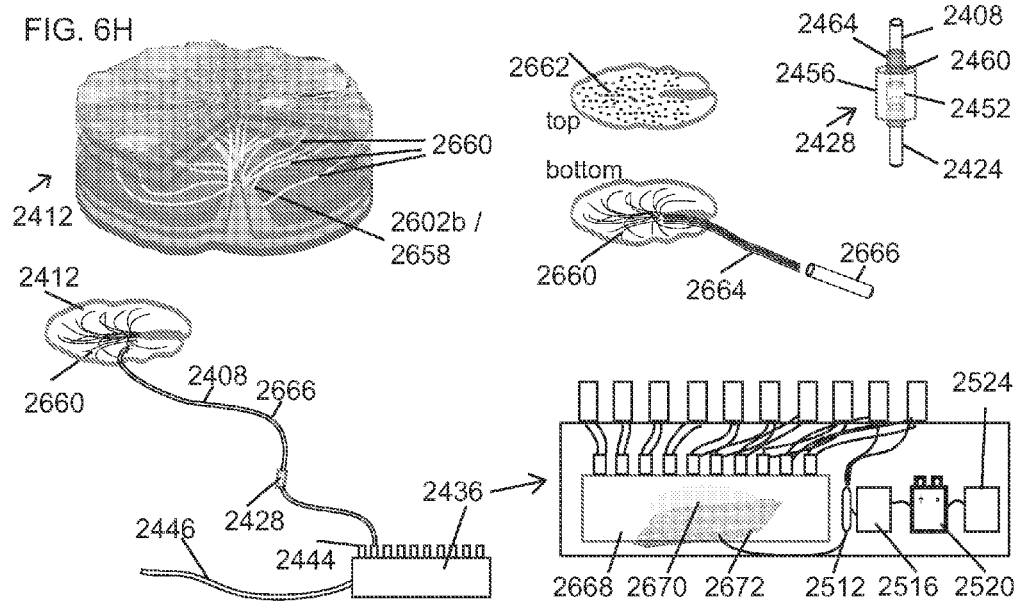

FIG. 6H schematically represents a family of embodiments wherein the energy-gathering unit (lily pad) 2412 has a means for gathering energy in the form of electricity, via the photovoltaic effect, but with a different configuration than in previous embodiments. Namely, fiber optic cables and/or light pipes are used to conduct sunlight away from the surface of the pad 2412, and the light is converted to electricity in a remote location. The optical fibers within the energy-gathering unit 2412, collectively, are considered an optical light-channeling complex 2658.

In some embodiments, the system uses light channeling to concentrate received light onto photovoltaic cells. In one scheme, energy-gathering units 2412 do not have any photovoltaic materials on them (note the missing photovoltaic complex 2484 in FIG. 6H). Instead, fiber optic strands 2660 transport light that hits the energy-gathering unit to the base unit 2436, and the photovoltaic conversion of light to electricity is carried out there.

Referring to FIG. 6H, upper right, fiber optic strands 2660 originate at or near the outermost surface of the pad or leaf 2412 and extend through and along the inner layers of the leaf 2412. Such fiber optic strands 2660 can transport light from all over the leaf surface. Fiber endings 2662 are represented on a top surface of a representative leaf 2412, showing a broad and even distribution across the surface. An arbitrarily high number of optical fibers 2660 can be incorporated into the material of a leaf 2412 in the light-channeling complex 2658. On the bottom surface (noted in figure), the corresponding fibers extend from the widely and evenly distributed points toward a central region near the pad coupling junction. This represents the first stage of aggregating light.

Fibers 2660 are organized into a fiber-optic bundle 2664, in this family of embodiments. The fiber optic bundle 2664 can extend down the stalk 2408, in conjunction with any electrical conductors/wires that may also extend down the stalk 2408. Additionally or alternatively, fibers 2660 or the fiber optic bundle 2664 can terminate in a light tunnel 2666. A light tunnel 2666 carries light the way a water pipe carries water. It has extremely highly reflective walls and thus can transport light with little loss, alike a very thick fiber-optic cable. An advantage of using a light tunnel is that the fiber optic strands 2660 do not need to run the entire length of the stalk 2408 (which, remember, is a variable length). Another advantage is that a single light-conducting structure can remain in place even while different pads 2412 or other energy-gathering units 2412 are attached or swapped. These measures reduce cost, increase interchangeability of parts, increase interoperability, and allow greater flexibility in several ways.

A modified coupling junction 2428 is also represented in FIG. 6H. The modified version of the coupling junction 2428 allows for coupling of stalks 2408 and/or stalk extender segments 2424 that include bundles 2664 of optical fibers. A modified coupling junction 2428 can also allow the coupling of stalks 2408 and/or stalk extender segments 2424 that include light tunnels 2666, in another type of embodiment. These coupling junctions also connect whatever electrical wires may concurrently be in the stalks 2408.

Light is conducted down the stalk 2408 via the mechanisms above, and ends up at the base unit 2436. Within the base unit 2436, in these embodiments, light is conducted from the light tunnel 2666 or fiber optic bundle 2664 of each stalk, through the base coupling junctions. From there it is conducted into an inner light chamber 2668, via optical connectors from the base coupling junctions to inner coupling junctions on the fiber light chamber. Combined light 2670 from all installed lily pads is introduced into the light chamber 2668.

Light conversion is carried out in the light chamber 2668. For instance, a solar cell 2672 is placed inside the light chamber 2668, in some embodiments. In other embodiments, the inside surface of the light chamber is coated with thin-film photovoltaic materials, and wired up according to ordinary practice, such that current generated by the photovoltaic material is conducted to usual downstream elements.

As stressed elsewhere, an apparatus 2400 can have multiple means of gathering energy, from multiple sources. Accordingly, a base unit 2436 that is modified to include a light chamber and the circuitry to harvest useful energy from the resulting concentrated light, can also still have circuitry to handle output from other systems that are integrated into the apparatus 2400 or energy-gathering units 2412.

Accordingly the base unit 2436 in FIG. 6H includes electrical components that can be used for the output of both the light-channeled photovoltaic system as well as other systems such an em receiver and absorption complex 2646. Such elements can include a rectifier 2512, charge controller 2516, electricity storage device 2520, and/or inverter 2524, all connected by appropriate wires with both the light chamber output and any electrical input coming from the stalks.

Because the base unit is under water, it can dissipate heat very efficiently, which makes it safer to work with highly concentrated light derived from many energy-gathering units. It also means that embodiments that use thermoelectric means in addition to photovoltaic means can run efficiently.

Embodiments that use light-channeling can reduce the cost of the plants by replacing relatively expensive collector cells with fiber-optics that increase the efficiency of the system. Fiber optic cables can be high in cost but photovoltaic materials can be higher. More importantly, current photovoltaic materials are low in efficiency and are getting better rapidly. Fiber optics and light tunnels are nearly perfectly efficient, and are not rapidly improving (except in cost). Therefore, it is advantageous to fashion the permanent parts of the system with the fully-mature and efficient components, the fiber optics, and to allow the relatively early-stage and evolving photovoltaic part to be replaceable in the future. In the future, photovoltaic materials in the light chambers can be replaced, or for instance the entire base unit 2436 can be replaced. Additionally, hiding the light chamber 2668 out of site means that traditional solar cells and panels can be use, and they are generally cheaper, mostly due to scale. For instance, a traditional monocrystalline silicon photovoltaic cell or panel can be inserted into the light chamber in order to do the conversion to electricity with the greatest simplicity and lowest cost.

Figure 6I:
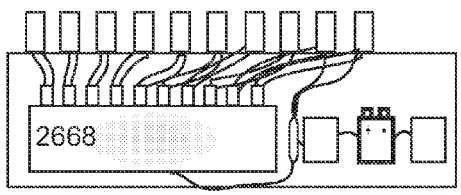

FIG. 6I schematically represents a family of embodiments wherein the energy-gathering lily pad 2412 has a means for gathering energy in the form of heat, but with a different configuration than in previous embodiments. Namely, fiber optic cables and/or light pipes are used to conduct sunlight away from the surface of the pad 2412, and the light is there used to heat a substance.

This family of embodiments is identical to the one above, as described in reference to FIG. 6H. Therefore, the drawing and description here focus solely on those aspects that differ. Referring to FIG. 6I, again all light collected by units 2412 is combined in the light chamber 2668. In contrast to the embodiments represented by FIG. 6H, the light chamber is used for gathering energy in the form of heat. Here, all means for gathering useful energy from heat as described above (for instance in reference to FIG. 6E and FIG. 6F) also apply to heat that may be generated within the light chamber.

It is natural to combine the latter two families of embodiments, and for instance to provide a system with a light chamber as above, having photovoltaic as well as heat-based means. For instance, the light chamber can be lined with thin-film photovoltaic material and/or may have silicon solar cells within it. Beneath and near these can be thermoelectric and/or pyroelectric materials, arranged analogously to what is described above. Furthermore, heat pipes and/or heat sinks can conduct remaining heat from the base unit. The heat can be used as described above, for instance to heat the water in the immediate vicinity and/or to heat other structures or to drive chemical reactions or the like.

These fiber-optic based systems can take the natural form of plants or inorganic items, such as rocks, stones, stumps, and the like such as may be visually expected in a contemporary scene in areas of high energy demand, for instance a landscaped urban area (including the buildings and pathways). For instance the construction blocks comprising a building can be emulated by embodiments of the present technology. As an example, a construction block 2669 embodiment may contain light-channeling elements as described above for a lily-pad embodiment.

Figure 6J:
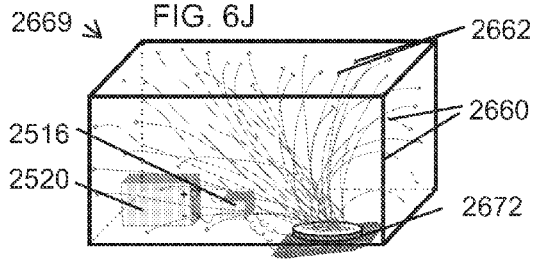

FIG. 6J schematically represents a construction block 2669 that contains a plurality fiber optic strands 2660 that can conduct light from their exposed endings 2662 on the surface of the block 2669 to a plate or a light chamber 2668, for instance arranged at one surface of the block 2669 or in a cavity within the block 2669. A solar cell 2679 or a photovoltaic complex 2484 may be arranged in order to receive light thus conducted and to produce electricity. Electricity can then be conducted along wires to a charge controller 2516 and then to an electricity storage device 2520 such as a battery or supercapacitor or other device. A charge controller 2516 and storage device 2520 can be contained within the block 2669 or elsewhere, or in a single master block 2669 that relates to a network of a plurality of such blocks, connected with an infrastructure that conducts the light to a central light chamber or that connects electricity from individual blocks (in this case each fitted with a photovoltaic or other means).

Note that this system and all embodiments utilizing light-channeling can use the light-channeling means in both directions. That is to say, that light introduced at the light chamber 2668 is conducted to the other end of fiber optic strands 2660. Therefore, some embodiments have a light bulb or light-emitting diode placed in the light chamber or otherwise in an arrangement such that it can produce light that will reach the fiber optic strands. In these embodiments, as an example, energy gathered during the day can be used in part to power a light-emitting device and the light can emanate to the surface of the energy-gathering unit 2412 such as a leaf. In this way, these embodiments are self-lighting and can provide safety lighting, decoration, signage, or other types and uses of lighting.

Such embodiments, as in all cases, can be combined with all the other alternative embodiments described elsewhere, thus for instance a light-channeling construction block 2669 can include and/or integrate thermoelectric, pyroelectric, piezoelectric, RF-converting, and/or other types of energy-gathering capabilities, in any combination.

Physical Motion of Fluids

Figure 6K:
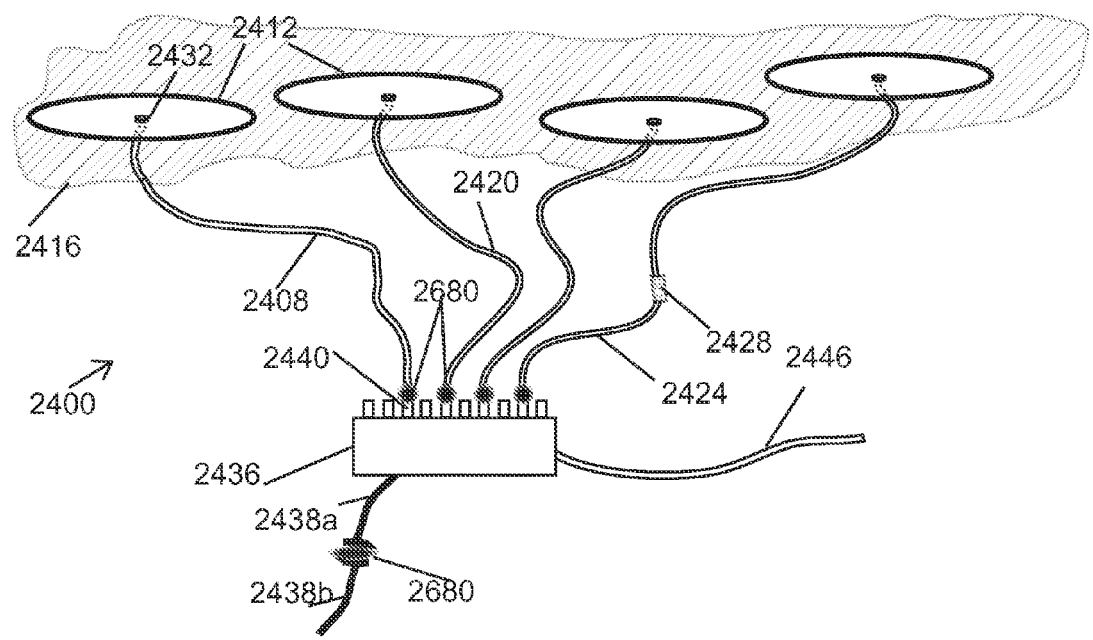

FIG. 6K schematically represents a family of embodiments wherein the energy-gathering lily pad 2412 and lily plant-like structures 2424 have, in addition to photovoltaic complex 2484, a means for gathering energy in the form of mechanical energy that is converted to electricity, via the piezoelectric effect. Namely, in these embodiments, movement and tension of the pads 2412 and stalks 2408 due to wind, water convection, currents (when deployed for instance in rivers), and tides (when deployed in tidal areas), form the mechanical energy that is gathered. The conversion takes place in piezoelectric generators or dielectric elastomers, which are arranged to be interposed between the stalks 2408 and the base units 2436, or between the base units 2436 and a ground to which they are tethered by an anchor unit 2438.

Referring to FIG. 6K, an apparatus 2400 like those seen before is schematically represented, but with some additions. First of all, stalks 2408 and stalk extenders 2424 may be stiffened, so that movement and tension as referenced above is be less absorbed and distributed by the stalks. Instead, more of the related force is concentrated at the attachment points, for instance at the base unit coupling junction 2440.

Motion to electricity force transducers 2680 are arranged in strategic locations. For instance, in the example embodiment represented in FIG. 6K, force transducers 2680 are interposed between the end of the stalks 2408 and the base unit coupling junction 2440. Additionally, force transducer 2680 is interposed between an upper segment of the anchor assembly 2438a and a lower segment 2438b. Both of these locations will experience a concentration of most forces applied that may be applied on the whole apparatus or its major parts, but dynamics as referenced above such as tidal flow, river currents, wind, and the like.

Force transducers 2680 are embodied as piezoelectric materials in some embodiments, and as dielectric elastomers in other embodiments. Additional means of converting kinetic energy or force to usable energy are also included in the present technology.

Combining and Integrating Multiple Means of Harnessing Energy from the Environment In each of the families of embodiments represented in FIGS. 6A through 6I, a single additional mode of energy-gathering is added to the energy-gathering pad 2412. A representative means for this mode is represented in addition to an embodiment of the basic photovoltaic means (photovoltaic complex 2484) as described above. However, it should be understood that a.) the additional alternate energy-gathering means can stand on its own and a complete embodiment of the present technology may not include a photovoltaic energy-gathering means, and b.) any given alternate energy-gathering means can usually be combined and integrated with one or a plurality of additional energy-gathering means as described here, or other ones not described here.

That is to say, a single lily-pad 2412 might have three or four or more means of gathering energy from the environment simultaneously. These are integrated and form a harmonized energy-gathering unit 2412. Within the energy-gathering unit, the energy-gathering complex 2468 is the collection of all energy-gathering means, each of which is an energy-gathering assembly 2608. For instance a first energy-gathering assembly 2608a may be a photovoltaic complex 2484, and a second energy-gathering assembly 2608b may be a thermoelectric complex 2610, and a third energy-gathering assembly 2608c may be an em receiver and conversion complex 2646.

These energy-gathering assemblies (collectively 2602) are integrated, along with assistive layers, forming the energy-gathering complex 2468 of the total energy-gathering unit 2412. For instance, a single conducting infrastructure 2482 may be interposed between the first and second assemblies 2602a and 2602b and utilized to conduct output electricity along the stalk to the base unit, in one embodiment. Likewise, the em complex 2646 and photovoltaic complex 2484 may physically contact the thermoelectric complex 2610 (directly or via heat pipes, for instance), thereby transferring to it the heat that results from their incomplete conversion of incoming radiation (which would otherwise be wasted as heat output into the environment). In these example ways, the several energy-gathering assemblies 2602 within an energy-gathering unit 2412 are not just physically integrated but are functionally (e.g. electrically and/or thermally) integrated. Many other embodiments of the technology that embrace multiple means of gathering alternative energy are also similarly integrated.

Figure 6L:
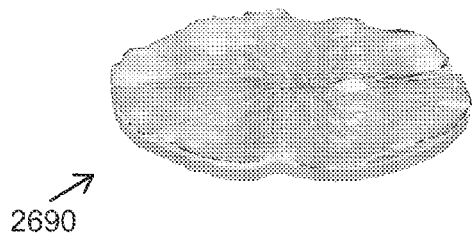
Figure 6M:
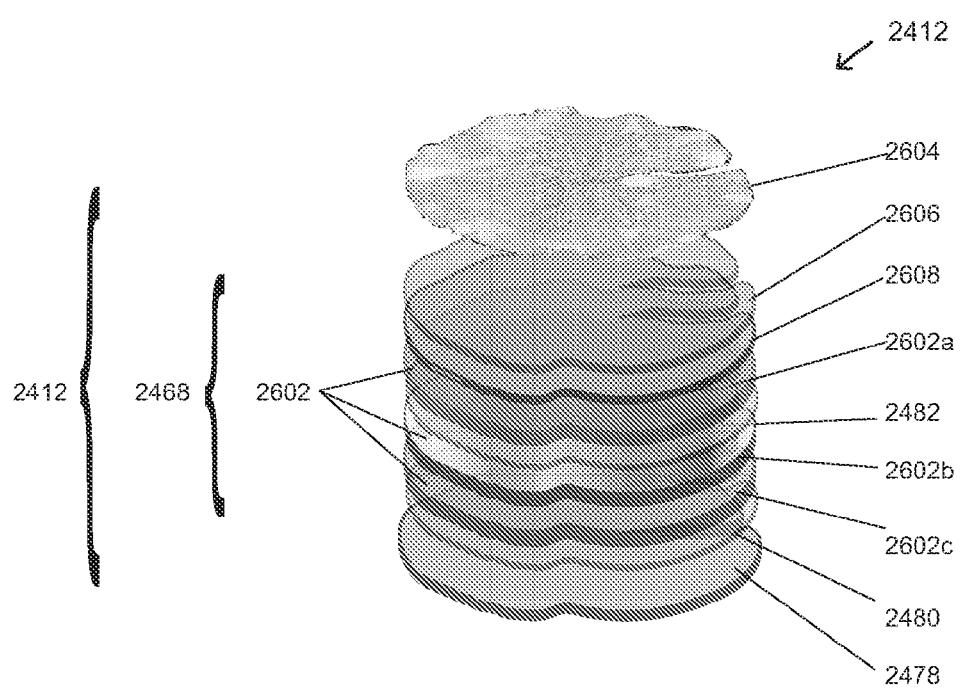

FIG. 6M together with Table 1 below is a terminology legend, using the example embodiment above as a prototype. FIG. 6M and Table 1 are provided to help the reader in understanding the several "unit", "assembly" and "complex" designations, some of which are as subsets of each other.

TABLE 1

| | |
|---|---|
| 2412 | Energy-Gathering UNIT |
| 2468 | Energy-Gathering Complex |
| 2602 | Energy-Gathering Assemblies |
| 2604 | Visible top layer. Patterned, to make energy-gathering UNIT look realistic. |
| 2606 | Finish layer. Can be a partially reflective or refractive layer 2532 or other. |
| 2608 | Upper layer: part of energy-gathering COMPLEX 2468. E.g., Can be a one-way mirror layer 2536 or other assistive layer. |
| 2602a | First energy-gathering ASSEMBLY 2602: One of potentially multiple. Can be, e.g., a radio-frequency (RF) em receiver COMPLEX 2646. |
| 2482 | Conductive Infrastructure, e.g. wires. Can be multiple and/or shared. |
| 2602b | Second energy-gathering ASSEMBLY. Optional. Can be, e.g., a photovoltaic COMPLEX 2484, such as a DSSC. |
| 2602c | Third energy-gathering ASSEMBLY. Optional. Can be more or fewer. Can be, e.g., a thermoelectric COMPLEX 2610. |
| 2480 | Backing layer - optional "primer" to bind substrate 2478 and upper layers. |
| 2478 | Substrate, on which other layers are applied. E.g., a lily-pad substrate. |

Self-Contained Embodiments

In contrast to the examples wherein a plurality of energy-gathering units 2412 (such as lily pads) are joined together into one apparatus 2400 or a larger network (2808 or 2465), several embodiments of the present technology involve self-contained or free-standing systems. This includes aquatic embodiments, such as those resembling lily pads (although many other self-contained embodiments of the technology exist). In a self-contained lily pad, all the details and alternatives above (as well as the light-chasing functionality below) that apply to individual lily pads also apply, with the following differences.

FIG. 6L is a schematic representation of a self-contained energy-gathering lily pad 2690. Referring to conductors that would generally conduct electricity from any energy-gathering complexes on the pad 2412 (such as a photovoltaic complex 2484 or thermoelectric complex 2610 or radio-frequency receiver complex 2646), on a self-contained lily pad 2690, they conduct electricity to on-pad electrical elements. Such on-pad electrical elements can include an electrical storage device such as a battery or supercapacitor, a miniature charge controller, a lighting system, a light-chasing control assembly (see below), a broadcast and/or receive antenna, a GPS device, and/or other devices such as described or implied elsewhere herein for connected (as opposed to self-contained) embodiments.

For instance, a lighting system can include a small light-emitting device, such as a waterproofed light bulb assembly or LED light assembly, a light meter, and a small controller switch that turns on the light-emitting device when ambient light levels drop below a threshold for a time period that is over a threshold. In this way, the self-contained lily pad 2690 fitted with such a lighting system becomes a self-lighting lily pad, which one can simply throw into a body of water and not interact with again—it will keep itself lit at night. The light-emitting device can be situated to provide light over the pad surface, to provide light under the pad (into the water), to shine light in some direction away from the pad, to provide a stead or blinking beacon that can be used for safety or emergency or locating purposes, or a combination of these or others.

Electrical storage devices for self-contained lily pads 2690 include the usual range of electrical storage devices, as well as flexible batteries or malleable supercapacitors, which are in this case shaped to form a layer or partial layer of the lily pad. That is to say, the electrical storage device in these embodiments hides as simply another thin layer of the self-contained lily pad 2690.

The light emitting device can also be made to be flat and thus effectively invisible (when not in operation). For instance a sheet of organic light-emitting diode (OLED) material can form a layer of the device (bottom side, or top side when beneath semi-transparent layers) or can form strips of the lily pad (2412 or 2690) that are not covered with opaque layers.

In the case of lily pad embodiments with solar thermal capabilities, a heat-absorbing layer provides its heat to water beneath the self-contained energy-gathering lily pad 2690. For instance, the lily pad substrate 2478 may have holes in it that allow water to be in direct thermal contact with the underside of a thermal absorbing layer, or the thermal absorbing layer may be connected to a thermal radiating layer, for instance via heat assemblies that traverse the lily pad substrate 2478. That thermal radiating layer may be positioned on the bottom side of the self-contained lily pad 2690. In this way, heat is provided to the water below, which can be useful for heating a pond for human enjoyment, for instance, or for heating a pond such that it can support exotic fish such as koi that might not otherwise survive in the given environmental conditions or in a given season.

In the case of self-contained lily pads 2690 that utilize light-channeling complexes 2658, such as fiber optic cables or light tunnels, said light-channeling complexes 2658 do not conduct the light down a stalk 2408 but rather they conduct it to a centralized location on the self-contained lily pad 2690, such as a light chamber 2668 on the top side or underside. In this light chamber 2668 can be positioned a photovoltaic complex 2448 that can convert light to electricity, a thermoelectric complex 2610 that can convert heat to electricity, and/or a heat-gathering assembly that can absorb heat from the light and conduct it to where it can be used. Electricity generated by technology in the light chamber 2668 is then conducted onward, for instance to an electricity storage device and/or electrical elements as described above. The light chamber 2668 affords advantages such as being able to replace the photovoltaic material with more efficient versions in the future without otherwise replacing the whole self-contained lily pad 2690.

Light-Chasing Control Assembly

The embodiments gather most of their energy from the sun (whether from light or heat) so it is important to arrange the energy-gathering units so that they gather the maximal sunshine. This means avoiding shadows, such as shadows of nearby trees and houses, as well as passing overhead items. Shading can cause much loss of output. Accordingly the present technology contemplates methods to automatically position energy-gathering units such as the lily pads 2412 here, to maximally gather sunshine—without maintaining positional information about each energy-gathering unit.

FIG. 7A is a schematic representation of an energy-gathering pad 2412, implying all the functionality and alternative embodiments described above, which is fitted with a sunlight-chasing control assembly 2700, according to one optional embodiment of the power-generating apparatus 2400 from FIG. 4A. The sunlight-chasing control assembly 2700 physically moves the pad 2412 across the water surface in order to maximize the amount of energy it gathers, for instance by attempting to move the pad 2412 out of shadows and into available sunlight. The control assembly 2700 includes three or more actuator assemblies 2704a-2704c (collectively 2704) arranged around the perimeter of the pad 2412, and a controller unit 2708 that is connected to all the actuator assemblies 2704 via control wires 2712.

Each actuator assembly 2704 is capable of propelling the pad 2412 in the direction in which the actuator assembly 2704 faces, and is capable of sensing the light level at its location. In a schematic sense, the controller unit responds when one or more actuator assembly becomes shaded, by activating the remaining actuators. In this way, if a shadow is creeping over a pad 2412 (for instance from nearby trees or buildings, as the sun traverses the sky), the pad 2412 that is fitted with this sun-chasing control assembly 2700 will respond by moving away from the shadow and toward the sun-lit area.

When all actuator assemblies 2704 are in relatively even sun they are all shut off so the pad stays put. When they are all in the shade they are set in motion at random to try to find the edge of the shade zone, and if that edge is found, the functioning described above will cause the pad 2412 to crawl into the light. Further states and conditions provided by the controller unit 2708 are diagrammed in FIG. 7E.

As shown in FIG. 7B the control unit 2708 in one embodiment contains an energy storage device 2716 such as a battery or super capacitor, a receiver-interface module 2720, a microprocessor unit 2724, a charging wire 2728, and optionally a dedicated solar panel 2732 connected to the charging wire 2728. The dedicated solar panel 2732, if employed, is angled and coated with a non-stick coating, in order to inhibit the buildup of residues, dropping, or other materials, which would otherwise inhibit the operation of the entire control assembly 2700.

The energy storage device 2716 is charged via the charging wire 2728, either via electricity generated by the dedicated solar panel 2732 (which can be the lid of the controller unit 2708), or via electricity diverted from the pad 2412 when it is producing electricity. The storage device 2716 then drives the operation of the microprocessor unit 2724 as well as the actuator assemblies 2704.

Signals from the actuator assemblies 2704, including luminance levels, are received by the interface module 2720 via control wires 2712; and signals from the microprocessor unit are sent back out via the interface module 2720 via paired wires, for instance to activate the actuator assemblies (amplified using electricity from the energy storage device 2716). The microprocessor unit 2724 determines the patterns in which to activate the actuator assemblies 2704 according an a procedure, one embodiment of which is schematically represented in FIG. 7E.

The actuator assemblies 2704 in these embodiments (FIG. 7C and FIG. 7D) can each include a light meter 2736, an electric motor 2740, and a propulsion drive 2744. The components are sealed within a waterproof casing, or are individually waterproof, with the light meter 2736 able to receive light from outside any case. Light meter 2736 can be arranged inside a narrow, conical, clear plastic housing with a non-stick coating, to inhibit it from becoming blocked by residues or debris or the like. Light meter 2736 can be arranged anywhere near the other elements of the actuator assembly 2704, and do not have to be within the waterproof casing if there is one. The light meter 2736 provides data on instantaneous luminance levels, which information is in turn used in order to determine when actuators are to be activated, as described elsewhere herein.

Impeller-Based Propulsion

In one embodiment (FIG. 7C), the propulsion drive 2744 includes a tube 2748 in which is arranged an impeller 2752 that is attached to and driven by the electric motor 2740. The actuator assembly 2704 and specifically the propulsion drive 2744 are arranged such the ends of the tube are submerged in the water on which the pad 2412 is floating. Therefore, when the impeller 2752 is activated, water is taken in through one end of the tube and ejected out the other end of the tube. This produces propulsion. The tube is arranged such that the propulsion force propels the pad 2412 in a direction orthogonal to the edge of the pad 2412, and the motor is driven in the direction that results in the pad being pulled forward when activated. In this way, since a given actuator assembly 2704 will be activated when it is in the sunlight and de-activated when it is in the shadow, the result is that the pad 2412 is always propelled in the direction of more sunlight and away from shadows.

The enclosed nature of the propulsion drive 2744 in this embodiment (FIG. 7C) protects the impeller 2748, for instance from items in the body of water that could get caught in the impeller 2748. The protection is augmented by gratings 2756 at the mouths of the tubes, which strain out debris.

Propeller-Based Propulsion

FIG. 7D is a schematic representation of another embodiment of the actuator assembly 2704 from FIG. 7A. In this embodiment, the propulsion drive 2744 differs from the embodiment schematically represented in FIG. 7C. Namely, the electric motor 2740 is oriented in the direction of intended motion, and is connected to a propeller 2760 that sits in the water. When the actuator assembly 2704 of this embodiment is activated it has the effect of tugging the pad 2412 on which the actuator assembly 2704 is arranged in the direction that the actuator assembly 2704 is facing, just as in the embodiment represented in FIG. 7C. Some differences include that this embodiment is simpler and requires fewer parts, and yet that the propeller is exposed and can become caught up in water-born debris.

The entire sunlight-chasing control assembly 2700 can be clipped onto any energy-gathering pad or pads 2412, to make any aquatic power-generating apparatus 2400 a light-chasing one. Three or more actuator assemblies 2704 are simply clipped on a pad 2412, maximizing their separation distance around the perimeter of the pad, and the control unit 2708 is simply placed or clipped anywhere on the surface of the pad 2412. The control wires 2712 from the actuator assemblies 2704 are attached to the control unit. Such an apparatus 2400 would have the appearance of a natural lily plant with its lily pads floating on the surface of for instance a pond, just as might naturally be seen on a pond, and the lily pads would slowly swim around the surface to follow the sunlight whenever shadows were imposed. The elements of the assembly 2700 can be miniaturized such they are invisible or minimally visible from a normal human viewing distance of the water surface, thus increasing acceptability of the apparatus 2400 as a whole.

Control Procedure for Light Chasing

FIG. 7E is a schematic representation of one embodiment of the procedure followed by a microprocessor 2724 in the control unit 2708, of an embodiment (as in FIG. 7A) where the control unit 2708 controls the behavior of all actuators 2704 on a pad 2412. This procedure can be rendered as a finite-state machine (FSM) or finite-state automaton (FSA) circuit, for instance. A microprocessor 2724 can be burned once (EEPROM) or can be flashed when needed, to render and/or upgrade the state machine logic. Unified Modeling Language state machines corresponding to the relevant states for the sunlight-chasing control assembly 2700 are implemented in the hardware (microprocessor) in some embodiments, allowing initial conditions and ongoing states to bear on the actions of the system.

According to FIG. 7E, at each cycle of the FSM, the primary action is to query the state of the system (represented by the box in the upper left corner). Next the system essential asks, "is the system battery (or other storage device) sufficiently charged to go any further (e.g. to activate one or more actuators)?". If the answer is no (battery level is below a predetermined threshold), then the system proceeds to a final action of "wait", wherein the system awaits the next cycle. If the answer is yes, the system proceeds to a next state determination. In this next state determination, the system essentially asks "are all the attached light meters 2736 in the sunlight?", by comparing the current or other signal coming in from each light meter 2736 to a predetermined threshold. If the answer is yes (the whole pad is presumably in the sun), then the system again waits but also takes an action, namely of adding the ongoing current levels from each light meter 2736 to a data store or running average calculation. This information is stored in a small memory device integrated with the microprocessor 2724. If the answer is no (at least one light meter is below threshold), then the system proceeds to a next determination. In this determination the system essentially asks, "are all of the light meters below threshold?". If the answer is yes, then the whole pad is presumably in the dark (the shadow advanced too rapidly to catch its leading edge). In this case, the system goes to a final action of "random-walk", wherein all the actuators are activated but in a pseudorandom schedule. The result is that the pad will swim around willy-nilly, until hopefully it finds an edge of the shadow, at which time the other states will take over and propel it into the light. If the answer to the last determination is no, then at least one but not all light meters are in a shadow. This means that the pad lies on the edge of a shadow and thus can use this information to propel itself out of the shadow. First the system determines which light meter or meters (and accompanying actuator(s)) are in the dark. Next it essentially asks, "did the light meter(s) 2736 fall suddenly into darkness", by comparing the current signal from each light meter 2736 to its respective historical values based on a predetermined formula. If the answer is no (for instance if the light level has been slowly decreasing and has recently dipped below threshold) then the system goes into wait mode. (Note, if the reason for it drifting below threshold is the onset of evening, it might stay in this wait mode until the next day). If the answer is yes, namely if the light level from the light meter(s) 2736 that recently fell below threshold actually did fall rapidly relative to their recent values, then we can assume that some kind of shadow or shading recently came upon part of the pad 2412 and thus shaded the light meter(s) 2736 near the respective propulsion drives 2744. Accordingly, the system in this state proceeds to a final action of activating the respective actuators 2704, namely by sending current to the electric motor 2740 that is part of the propulsion drive 2744. This has the effect of pushing the pad 2412 away from the shaded actuator or actuators, which should push the pad out of the shadow and toward the sunlight. This process will repeat again and again, refining the trajectory interactively, until the pad is situated fully in the sun. At this time, the second determination step of the procedure will result in a Yes, and the pad will cease moving. (Note, the process of comparing to historical values can also usefully be used when determining whether to go into random-walk, so that the pad does not swim around for sunlight after sunset, though this is not shown in the diagram.)

Some of the constants that are preferably programmed into the FSM system that is schematically represented in FIG. 7E are as follows: cycle duration (time between cycles of the procedure), battery charge threshold, threshold of current from a given light meter that signifies it is in sunlight, and a formula for determining if a light meter's reading decreased rapidly enough (relative to any ongoing average data) such as would indicate a shadow event rather than overall sunlight decrease such as the approaching evening.

In a more refined embodiment, the procedure can include information about day-night cycles. With this information, the system can avoid random-walking at night, and can save enough battery power for the next morning, to try to scoot the pads into the advancing sun of the early morning. The system can be programmed with the day/night cycles at the location it will be deployed, or it can use a small GPS device to determine its location and other systems such as national clock RF broadcasts to determine time of year. From these two initial conditions, it can easily extrapolate all future days' the sunset time (to turn off the system) and sunrise time (to turn the system on to go hunting for the earliest sunbeams). Such a sophisticated system is more likely to be economical in embodiments where a central controller manages a large network of apparatuses (see below).

Actuator-Level Control of Light-Chasing

FIG. 7F is a schematic representation of an alternative embodiment of a control assembly like the above-described sunlight chasing control assembly 2700 (FIG. 7A), but where there is no central control unit (2708 above). This embodiment, the autonomous sunlight chasing control assembly 2770 includes a plurality of autonomous actuator assemblies 2774 that act independently yet have a similar effect on a pad 2412 as above. The autonomous actuator assemblies 2774 are clipped onto any pad 2412, usually in collections of three or more.

Each autonomous actuator assembly 2774 in this embodiment includes a solar panel 2778 that acts both as a power source and a light meter, in that the ongoing current derived from the panel is an indication of the sunlight that is impinging upon its photovoltaic surface. Electricity generated by the solar panel 2774 charges a an energy storage device 2782 such as a battery or super capacitor for instance. The energy storage device provides electricity to drive a microprocessor 2786 and through it an electric motor 2790.

The microprocessor 2786 works according to a procedure designed to push the pad 2412 on which it is situated away from shadows and shaded regions. Whenever the current coming from the solar panel 2778 decreases by an amount and at a speed that meets an internal threshold, the microprocessor determines that a shadow has come over the assembly (as opposed to for instance gradual nightfall). Once the determination has been made that a shadow is present, the microprocessor directs electricity from the energy storage device 2782 to the electric motor 2790. The motor turns a propeller 2794 that is situated in the water, in a direction such that it moves the pad 2412 on which it sits backward relative to the autonomous actuator assembly 2774, that is, putatively away from an advancing shadow. This procedure is rendered as a finite state machine implemented in the microprocessor, similar to above but simplified because only a single actuator is being controlled at a given time.

If the trajectory enacted by the first actuator causes another autonomous actuator assembly 2774 to edge into a shadow, it too will be activated, and in certain situations this will cause the pad 2412 to continue to be moved in the right direction relative to the sun and shadow. It is possible for a pad to thus push itself into shadows that it won't be able to escape, but in the case of most simple shadows, the system will in principle increase the amount of sunlight that can be harnessed.

Fan-Based Propulsion

Two alternate categories of embodiment parallel the embodiments above, yet their means of propulsion is via air-based fans rather than water-based propellers or impellers. That is, these embodiments parallel the embodiment 2700 schematically represented in FIG. 7A, on the one hand (with a plurality of actuator assemblies 2704 and a centralize control unit 2708), and the embodiment 2770 schematically represented in FIG. 7F, on the other hand (with a plurality of autonomous actuator assemblies 2774 and no centralized controller). In these parallel embodiments, much is the same as their parallels, except that the actuators (2704 or 2774) include a fan or similar propulsion device that is mounted in the air rather than in the water. The thrust generated by the fan drives the lily pad around in the same way as the water-mounted devices. An advantage is that the air-mounted fan is less susceptible to clogging than the water-mounted propeller or impeller.

Network-Level Control of Light-Chasing

As noted, FIGS. 7A through 7E schematically represent a sunlight-chasing control assembly 2700 that has a controller unit 2708 that controls one whole pad, and FIGS. 7F through 7G schematically represent a sunlight-chasing control assembly 2700 in an alternate embodiment, wherein there is no central control but rather each autonomous actuator assembly 2774 operates independently.

Figure 8A:
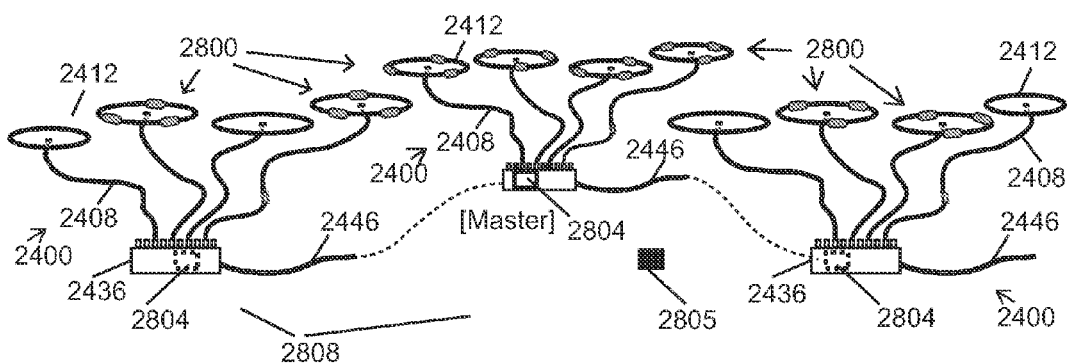
Figure 8B:
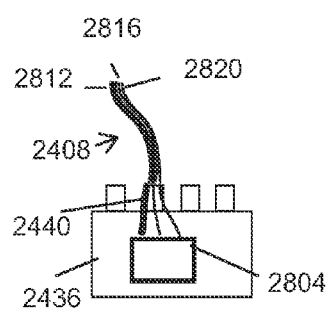

In contrast, FIGS. 8A through 8B schematically represent a category of embodiments where there is a controller that is even more centralized than in the assembly 2700. Namely, these are embodiments that include a network-level controller 2804 that controls a network 2808 which is a plurality of power-generating apparatuses 2400, where each apparatus 2400 can be of any of the embodiments described above or anything similar. In short, FIGS. 7A through 7E represent pad-level control of the light-chasing functionality, FIGS. 7F through 7G represent actuator-level control of the light-chasing functionality, and FIGS. 8A through 8B represent apparatus-level and network-level control of the light-chasing functionality.

In a network 2808, the control of individual network-controlled light-chasing control assemblies 2800 and individual pads 2412 is accomplished at the network level, namely by a network-level controller 2804 that operates a plurality of apparatuses 2400. The network-controlled assemblies 2800 are identical to the assemblies 2700 except that they do not include a control unit 2708 on each pad but rather are connected to a network-level controller 2804. In one category of embodiments, the network-level controller 2804 is integrated into the base unit 2436 of one of the apparatuses 2400. In this arrangement, only one base unit 2436 may have such a network-level controller 2804 and as such can be considered a "master" base unit, while all other base units 2436 are considered satellite base units. In FIG. 8A, the master base unit is labeled, and a network-level control unit 2804 is represented as a solid-line box inside the base unit 2436.

Alternatively, each base unit may include a controller (allowing it to control its associated apparatus 2400 and specifically light-chasing assemblies 2800 when in isolation), however, when a network 2808 is established, one base unit 2436 becomes designated as the "master" base unit, and its controller controls the rest. In this paradigm, the controllers in other base units 2436 do not work, unless for instance recruited to take over as master by a failure in the designated master. In FIG. 8A, the master base unit is labeled, and a network-level control unit 2804 is represented as a solid-line box inside its base unit 2436, and non-functioning/latent network-level control units 2804 are represented by dashed-line boxes within the other base units 2436.

Some examples of the technology include a procedure for selecting a master unit.

FIG. 8D is a flow diagram illustrating the operation of the building of a network in one embodiment of the system. At step 2840 a plant is brought online. (Note, here, a "plant" refers to any apparatus 2400 or other embodiment of the technology, including but not limited to those that emulate terrestrial plants. At step 2844 the plant determines its location using an onboard global positioning satellite (GPS) system for geographic localization via satellite signals.

At step 2848 the system transmits its ID and location using its communication electronics and waits for an acknowledgement. At decision block 2852 it is determined if a response has been received. If so, the system receives the response at step 2856. The response will include an identification of a master or controller unit in the installation or defined network. At step 2860 the plant transmits its performance information to the master in a scheduled manner.

If there is no response at step 2852, the plant establishes itself as a master of the network. At decision block 2868 the system determines if other plants are reporting performance data. If so, the system aggregates its own and the data of any reporting plants and transmits it to a central location at step 2872. (The central location can be a memory or a data storage device within the unit or the within the local network; or it can be a central control center that is reached via radio broadcast, cellular phone network packet transmission, or other communication means.) If not, the system transmits its own performance data at step 2876 and then returns to step 2868.

Note that when there is only one apparatus 2400 and no network 2808, the so-called network-level controller 2804 inside the base unit 2436 actually becomes an "apparatus-level controller", in that it controls all the pads 2412 in one apparatus 2400 but nothing in any other apparatus 2400 since none is connected.

In another category of embodiments, no base unit has a master controller integrated in it, but rather a network-level controller 2804 is a stand-alone device and is preferably integrated into the network. In FIG. 8A, such a stand-alone is depicted as a solid box, labeled as 2805, and is shown without any wires or connections for simplicity but is connected to the network.

In example paradigms including a network 2808 of apparatuses 2400 with network-level control of light-chasing assemblies, the base units 2436, and ultimately the network-level controller 2804 communicate with the actuators (2704 or equivalent). Therefore, in some examples, separate conductors are added to what would otherwise be in the stalk 2408.

FIG. 8B schematically represents a single stalk 2408 entering a simplified base unit 2436 via a base unit coupling junction 2440, with the additional conductors. First of all there is the original core of the stalk 2408 which is here represented as 2812, and this contains an electrical conductor and/or heat conductor as per the requirements of the specific embodiment of the apparatus 2400. Further, there is a light meter signal line 2816, which may include one or more physical wires, and an actuator control line 2820, which may include one or more physical wires. These, respectively, convey the luminance or lightness readings from all the light meters 2736 and in turn allow control signals to all the actuators 2704, and the electric motors 2740 thereof.

Figure 8C:
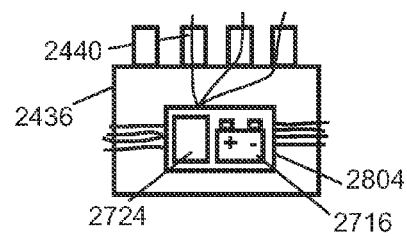

FIG. 8C schematically represents a base unit that is serving as a master, with a network-level controller 2804. The network-level controller 2804 includes an electrical storage device 2716 such as a battery, and a microprocessor assembly 2724. Also represented are conductors from several attached stalks as well as from other base units. Each such conductor may contain several conductive paths or wires. These are utilized as above, to communicate with light meters 2736 and actuators 2704 throughout the network 2808. Some aspects described above for pad-level control units 2708 also apply for network-level controllers 2804. A procedure similar to the finite-state machine procedure as in FIG. 7E can be implemented in circuitry within or associated with the microprocessor assembly in the network-level controller 2804, with the exception that the network-level controller preferably controls a plurality of pads 2412 and/or a plurality of apparatuses 2400.

In one embodiment, an entire network is controlled, in terms of light-chasing apparatuses, by a single controller. That controller has a more difficult task than that described above, in reference to FIG. 7E. However, a procedure to address this task can be similar to the one diagrammed in FIG. 7E. One difference is that the procedure needs to be repeated for each lily pad, in turn.

The lily pads can be thought of as being independent. Given this, in one approach, the new procedure embeds the original procedure (FIG. 7E) within a loop. The outer loop loops through the set of all lily pads 2412 that are connected to the given base unit 2436 or entire network 2808. As such, the new procedure has nearly the same effect except that each pad 2412 (or light-chasing assembly 2800) waits until all the others have been queried and any actions taken. In a normal microprocessor at the current state of the art, this wait time would be negligible. Even in a large network 2808 of energy-gathering lily plant apparatuses 2400 should succeed in guiding lily pads 2412 to stay within the sunlight when within the length of their stalks.

It is a notable advantage of this technology that the network-level controller does not need to have any knowledge of the position of any of the lily pads (relative nor absolute position) in order to control them and navigate them out of the shadows and into the sunlight.

A network 2808 can include not only embodiments of an aquatic energy-gathering apparatus in the shape of a lily plant (2400) but can include any other examples of the present technology. When such a network 2808 includes non-aquatic embodiments, a network-level controller 2804 can be located on land or under water, and furthermore can be very remote from the installation of such apparatuses 2400 or other embodiments. Embodiments including aquatic and non-aquatic plant-like forms, as well as non-plant forms, are all referred to below (and elsewhere in this document) as "plants".

A network 2808 can connect a plurality of plants into one installation, as well as connecting separate installations in a larger network, with one central ("master") unit, or with a central information-processing station. The plants and installations can organically form peer-to-peer networks to create ad-hoc networks to transfer information among themselves. The shared information can include a unique signature ID, can additionally and optionally include location (via a GPS module located in each plant, or located in only one, in which case locations of the others are determined by triangulation among the peer-to-peer network), and additionally or optionally can include information about the current working state and/or history of each plant. The data can additionally or optionally include information about factors including ambient temperature, temperature of components of the plant(s), amount of light collected or energy generated by the plants(s).

This method for establishing a network among energy-gathering devices, whether automatic or manually established, applies also to energy-gathering devices of all sorts, including 'traditional' solar panels or solar-powered utilities, regular grid-tied utilities and highway signs and street lamps and the like, and in mixed installations that combine energy-gathering plants of the current technology as well as traditional solar systems.

What was described above as applying to a network 2465 also applies to a network 2808, and what is described here for a network 2808 also applies above to a network 2465, where possible.

Summary of Utility of Light-Chasing Functionality

In some of the foregoing ways, an aquatic power-generating apparatus 2400 that resembles a lily plant with a plurality of lily pads will arrange itself to maximize the exposure to the sun on the given body of water, within the constraints of the lengths of the stalks 2408, any water-born obstructions, and other pads 2412 in the adjacent area.

Buoyancy

For some examples of energy-gathering lily pads 2412, buoyancy of the energy-gathering lily pads 2412 is desirable. Buoyant lily pads 2412 will remain on the surface of a body of water in which they are placed, which assists in being exposed to maximal sunlight. Pads 2412 that are buoyant in water will float to the top of the body of water in which they are placed, rather than relying on support from below.

This becomes somewhat complicated for several reasons. First of all, the various energy-gathering means as described above impose some degree of mass/weight upon the pad 2412 as a whole, and thus the lily pad substrate 2478 must be buoyant enough to counteract this weight. The weight is variable, across the set of possible energy-gathering means, for instance an embodiment with a fluid-exchange based solar thermal complex 2630 built in to the pad 2412 is much heavier than an embodiment with just a thin-film photovoltaic complex 2484. However, it is desirable from a design, manufacturing and assembly point of view to have relatively standardized lily pad substrates 2478, particularly from a categorical point of view such as choice of material. Therefore, some average buoyancy range for a candidate material and design is desired. The ability to vary the overall buoyancy within that range is another advantage for a given candidate material and design choice.

Furthermore, the stalk 2408 can impose a great deal of weight on the total apparatus 2400 and particularly on the pad 2412. The stalk weight/mass has greater variability than with the pads, across embodiments as well as within an embodiment. In general, a stalk 2408 is long and contains at least some electrical wiring, which is usually denser/heavier than water. In embodiments, for instance, that gather thermal energy via a solar thermal collection means on the pad 2412, the stalk 2408 must conduct said heat. This can be done via fluid exchange 2632 or via a heat pipe assembly 2644, as described above. Similarly, embodiments that require additional conductors such as added wires in the stalk, e.g. to carry control signals, may add additional weight. These examples illustrate how different embodiments may lead to different amounts of weight from the stalks 2408 that can bear on the pads 2412. Furthermore, within a given embodiment, there are advantages, as mentioned above, to having stalks 2408 of differing lengths within a given apparatus 2400 or network of apparatuses. This creates variability in how much weight might potentially have to be supported by any given pad 2412 based on its stalk 2408.

It is advantageous to have a system where parts are interchangeable, and/or where the key elements in the manufacture of final parts are interchangeable. In this framework, it is advantageous if the lily pad substrate 2478 for lily pads can be made in a similar way for all embodiments that will be manufactured and sold simultaneously. However, this is difficult, since the stalks can vary in weight considerably, as noted above.

In one type of embodiment, part of this challenge is addressed by keeping the stalks 2408 weight-neutral, so that they don't affect the system design. That is to say, the stalks 2408 support their own weight, so that the pads 2412 do not have to. This clearly eliminates the greater part of the challenge, since it eliminates a major source of within-embodiment variability as to the buoyancy specifications for pads 2412 and pad substrates 2478.

More particularly, stalks are made, in one type of embodiment, to float stably at about 0.5 m below the surface of water, assuming fresh water at sea level. This should be an advantageous compromise of possible flotation specifications. Relevant buoyancy is maintained in the stalks by, for instance, assuring that each component of a stalk (e.g. wires, fluid exchangers, etc.) likewise has a float point set to 0.5 m below fresh water surface at STP. Alternatively, components can be separately counteracted in the specification of stalk housing materials. That is, if a stalk is going to have heavy wires it is specified for more light foam.

As for the lily pad substrate 2478, a variety of lighter-than-water materials can be used for the entire substrate, and/or attached to the underside to supplement buoyancy as needed. Some materials include plastic, resin, foam, polystyrene, light polymers, and other such materials. It is an important and desired factor that lily pad substrates be flexible and easy to deform. This is an important factor in visual realism, which is the cornerstone of customer acceptance and deployment of this technology. Therefore, candidate materials also need to pass flexibility requirements.

One type of embodiment of the lily pad substrate 2478 is a bladder. For instance, a thin-walled, flat plastic bladder in the shape of a lily pad would confer several advantages. It would be light-weight, it would be flexible and easy to distort, and it could be low-cost. Importantly, air can be added to a bladder, to adjust its buoyancy. In some embodiments, air can be added and removed after deployment, via an air valve. In other embodiments, air content can only be adjusted at the factory.

To address the risks associated with puncture, a lily pad substrate can be a bladder with several compartments. That way if one punctures, the others maintain it afloat or mostly afloat.

Discussion of a Advantages and Unique Features

This overall category of embodiments (resembling a lily plant or network of lily plants) provides several specific functional advantages as an energy gathering device or method. For instance, the following lists some advantages to energy-gathering lily plants in the present family of embodiments. Lily pads naturally face the sky and can collect sunlight all day, whenever there is sunlight. Furthermore, the surface of a body of water of sufficient size is generally far enough away from trees, bushes, or buildings that shadows from such are minimal or non-existent, which provides a significant and rare advantage relative to most solar collectors at or near ground level in a populated area. Shadows on even part of a traditional solar cell block the energy production of the whole cell, so avoiding shadows is of great advantage. Several advances are described elsewhere herein for diminishing the effects of partial shading, but having a largely non-shaded surface is still an advantage and allows for lower-cost photovoltaic materials and manufacture methods. Water surfaces are often enjoyed but relatively ignored by human observers and also they are by definition remote; therefore, human observers will not likely inspect devices of these embodiments in close detail. This allows for simpler, cheaper, and more function-oriented manufacture techniques and physical forms (rather than appearance-oriented ones) when designing and fabricating such devices. Whereas lily pads float on the water surface and are visible, the stalks extend below the surface, mostly invisible, and the stalks are a natural shape and configuration to house wires and other conductors. Therefore, the lily provides great advantages for hiding wiring to conduct away energy gathered by the visible pads. Similarly, any aspects of the embodiments that are situated at the bottom of the body of water, or under significant depth of water, are also invisible. This allows for potentially large, unsightly, and simple-to-manufacture items such as the base units 2436 to be hidden well below the water surface.

The aquatic lily-like embodiments here 2400 have some other particular functional advantages, some of which are outlined next. The pad surfaces (and lily flowers when deployed) are kept photorealistic in some embodiments (from a typical viewing distance) by several methods described above, thus increasing value and likelihood of adoption in urban and suburban landscapes. Adoption in such environments is particularly important because it is in these densely populated area that a.) electrical power is most needed, b.) traditional power plants are not economical (land cost is too high) and are not wanted (unsightly and loud), yet c.) transmission from distant power plants is costly and lossy, d.) traditional solar and wind devices are also viewed as ugly and are often rejected, and e.) usage patterns are difficult to predict and highly variable such that centralized production (traditional power plants) requires over-generation to avoid blackouts whereas distributed (local) generation and temporary storage can help fill in for those usage spikes. Furthermore, stalks 2408 as described here provide much functionality in conducting electricity and other forms of energy, and additionally their flexibility, varying length, and ability to be extended provide further realism to the system as a whole. The modularity of the parts, including base units 2436 and in some cases the stalks 2408 and extender sections 2424, provides for a flexible, lower-cost total system, easy upgrade paths, easy repair, decreased stocking costs (few, interchangeable part types), decreased costs of shipping and handling due to standardizable shipping containers, etc. Furthermore, the modularity allows for an arbitrarily large installation, and allows for a whole ecosystem of energy-gathering apparatuses of many times to be networked together. The optional light-chasing assembly increases light-gathering function by automatically maneuvering pads out of shadows and into sunlight, which increases the effective amount of energy-gathering that can be accomplished by the apparatuses. In any other way of looking at this, the light-chasing means that an apparatus containing some finite amount of surface area and light-converting materials (such as photovoltaic films) can act as if it is a large apparatus because it effectively covers a larger surface area as would be necessary to always catch the direct sunlight throughout a day. It is a related functionality and advantage of the technology, that such embodiments can find the sunlight without the controllers having any information about the physical location of the energy-gathering devices (the pads). Furthermore, because these embodiments (e.g. lily plant type) are self-contained systems, they can be dropped directly into a body of water and instantly form a naturalistic energy-gathering setup. That is, one can purchase for instance a fully-assembled apparatus 2400 (or a base unit 2436 and the desired number of plant-like structures 2404, to assemble manually), and just throw it into a pond or river while retaining control of the output conduit. The system will immediately start working. Other unique functionality and advantages exist and are in part described elsewhere herein.

It will be apparent that many other materials, methods, arrangements, configuration, functions, and means of assembly are possible for each and every element, process, and configuration described herein. These are all included in the technology. The illustrative examples supplied here are not to be taken to limit the scope of what is claimed but rather to provide detail of some specific embodiments of the much broader technology.

The some of the above-described examples of the technology (e.g., the procedure for light chasing described with reference to FIG. 7E) can be implemented in digital electronic circuitry, in computer hardware, firmware, and/or software. The implementation can be as a computer program product. The implementation can, for example, be in a machine-readable storage device, for execution by, or to control the operation of, data processing apparatus. The implementation can, for example, be a programmable processor, a computer, and/or multiple computers.

A computer program can be written in any form of programming language, including compiled and/or interpreted languages, and the computer program can be deployed in any form, including as a stand-alone program or as a subroutine, element, and/or other unit suitable for use in a computing environment. A computer program can be deployed to be executed on one computer or on multiple computers at one site.

Method steps can be performed by one or more programmable processors executing a computer program to perform functions of the invention by operating on input data and generating output. Method steps can also be performed by and an apparatus can be implemented as special purpose logic circuitry. The circuitry can, for example, be a FPGA (field programmable gate array) and/or an ASIC (application-specific integrated circuit). Subroutines and software agents can refer to portions of the computer program, the processor, the special circuitry, software, and/or hardware that implement that functionality.

Processors suitable for the execution of a computer program include, by way of example, both general and special purpose microprocessors, and any one or more processors of any kind of digital computer. Generally, a processor receives instructions and data from a read-only memory or a random access memory or both. The essential elements of a computer are a processor for executing instructions and one or more memory devices for storing instructions and data. Generally, a computer can be operatively coupled to receive data from and/or transfer data to one or more mass storage devices for storing data (e.g., magnetic, magneto-optical disks, or optical disks).

Data transmission and instructions can also occur over a communications network. Computer program products suitable for embodying computer program instructions and data include all forms of non-volatile memory, including by way of example semiconductor memory devices. The computer program products can, for example, be EPROM, EEPROM, flash memory devices, magnetic disks, internal hard disks, removable disks, magneto-optical disks, CD-ROM, and/or DVD-ROM disks. The processor and the memory can be supplemented by, and/or incorporated in special purpose logic circuitry.

To provide for interaction with a user, the above described techniques can be implemented on a computer having a display device. The display device can, for example, be a cathode ray tube (CRT) and/or a liquid crystal display (LCD) monitor. The interaction with a user can, for example, be a display of information to the user and a keyboard and a pointing device (e.g., a mouse or a trackball) by which the user can provide input to the computer (e.g., interact with a user interface element). Other kinds of devices can be used to provide for interaction with a user. Other devices can, for example, be feedback provided to the user in any form of sensory feedback (e.g., visual feedback, auditory feedback, or tactile feedback). Input from the user can, for example, be received in any form, including acoustic, speech, and/or tactile input.

The above described examples can be implemented in a distributed computing system that includes a back-end component. The back-end component can, for example, be a data server, a middleware component, and/or an application server. The above described techniques can be implemented in a distributing computing system that includes a front-end component. The front-end component can, for example, be a client computer having a graphical user interface, a Web browser through which a user can interact with an example implementation, and/or other graphical user interfaces for a transmitting device. The components of the system can be interconnected by any form or medium of digital data communication (e.g., a communication network). Examples of communication networks include a local area network (LAN), a wide area network (WAN), the Internet, wired networks, and/or wireless networks.

The system can include clients and servers. A client and a server are generally remote from each other and typically interact through a communication network. The relationship of client and server arises by virtue of computer programs running on the respective computers and having a client-server relationship to each other.

Packet-based networks can include, for example, the Internet, a carrier internet protocol (IP) network (e.g., local area network (LAN), wide area network (WAN), campus area network (CAN), metropolitan area network (MAN), home area network (HAN)), a private IP network, an IP private branch exchange (IPBX), a wireless network (e.g., radio access network (RAN), 802.11 network, 802.16 network, general packet radio service (GPRS) network, HiperLAN), and/or other packet-based networks. Circuit-based networks can include, for example, the public switched telephone network (PSTN), a private branch exchange (PBX), a wireless network (e.g., RAN, bluetooth, code-division multiple access (CDMA) network, time division multiple access (TDMA) network, global system for mobile communications (GSM) network), and/or other circuit-based networks.

The transmitting device can include, for example, a computer, a computer with a browser device, a telephone, an IP phone, a mobile device (e.g., cellular phone, personal digital assistant (PDA) device, laptop computer, electronic mail device), and/or other communication devices. The browser device includes, for example, a computer (e.g., desktop computer, laptop computer) with a world wide web browser (e.g., Microsoft® Internet Explorer® available from Microsoft Corporation, Mozilla® Firefox available from Mozilla Corporation). The mobile computing device includes, for example, a Blackberry®.

Other Forms

The system is not limited to embodiments of an aquatic nature having stalks, base units, and pads/leaves. The system can also be embodied in other natural objects where a surface can be coated with photovoltaic materials and/or any of the energy-gathering materials and complexes described. In the plant world, this includes cacti, which are particularly suitable because the rigidity of a cactus based system will appear natural. The use of a cactus shape also allows more efficient location and exposure to optimal sunlight by designing the shape of the cactus appropriately.

Other embodiments include succulents having large leaves that emanate from a central base, ground cover, particularly where pedestrian walking is not likely or is prohibited, grass, and the like.

In addition, the system contemplates natural looking installations that can take advantage of wind and/or fluid motion to generate power. Electricity generation can also be accomplished from vibrational energy where small deflections of parts of a plant can be converted to vibrations, for instance with a cantilevered arm holding magnets such that they vibrate vertically up and down next to or surrounding a tightly wound coil. This can produce alternating currents in the coil and in connected wires that can be coupled and multiplied with outputs from other such devices in multiple locations on the plant. Thus an electromagnetic generator can produce electricity from vibrations induced when the wind blows against a plant.

Similarly, vibrational energy can be converted to electricity using a piezoelectric generator that is designed to harness vibrations. For instance, a cantilevered arm made of or containing piezoelectric material with a weight on the arm can be deflected by vibration, and stress and strain through the cantilevered arm can activate the piezoelectric material such that it generates electricity. There are myriad other possible arrangements and configurations for piezoelectric generators (or electromagnetic generators as above), driven by vibrations or by any type of movement, as may be created by wind or other fluid acting on an embodiment of this technology. This is in addition to the piezoelectric implementation in the trunk gaskets described above.

The system also contemplates the dedicated or combined use of other types of power generation implemented in a plant or other natural looking installation. For instance, a system tree can have a rotor hidden from view by being placed at the top (e.g. nestled among upper fronds) that turns with passing wind; any tree can have passages bored through the trunk through which wind passes, actuating a hidden rotor, or a series of holes leading into and at least one leading out of a trunk or other part such that wind is carried through and perhaps accelerated and a rotor near the output hole(s) turns with the collected wind and generates power; or a normal-looking building in an urban landscape can have semi-hidden or normal looking ventilation gratings in a wall, through which wind is allowed to come in, and perhaps concentrate for instance in a duct system, and rotors in said ducts thus turn because of the wind and generate electricity or useful rotational or other kinetic energy. These are just a few representative examples; many more exist.

Banana Tree

One type of embodiment of the present technology is a terrestrial not aquatic plant, and it resembles the form of a tree, more particularly a banana tree. The banana tree (Pictured in FIG. 2A) is advantageous for many reasons including that it has large leaves with a lot of continuous surface areas, the leaves can be arrange so they shade each other minimally, the trunk can accommodate a lot of electronics, banana trees are expected in the same geographical locations where there is a lot of sun and thus where such systems are more efficient, and because of its relative simplicity of design/configuration.

The details of the present technology as they apply to embodiments that resemble plants have been described already in great detail herein, in the context of embodiments resembling lily plants. All of what was previously described or implied, and all that is described and implied below, applies to embodiments resembling banana trees, where appropriate. Therefore, this section will only briefly cover the analogical similarities between banana trees and lily plants, and then will cover some differences and unique advantages in the banana tree embodiments.

First of all, the physical configurations of lily plants and banana trees are more similar than may appear at first. The homologies are here enumerated. The large, flat leaves/fronds of a banana tree are similar to the lily pads of a lily plant, and the banana leaves are the primary location for energy-gathering assemblies. Therefore, herein the leaves are referred to as energy-gathering units 2412 in the shape of banana tree leaves, or for short, banana leaves 2412. The stem of a banana leaf is similar to the stalk 2408 of a lily pad, except for some features, for instance it is rigid and therefor can support itself and the leaf. Therefore, it is herein referred to as a banana frond stem 2408.

A banana tree has a trunk whereas a lily plant does not. However, a trunk acts like a larger stem, and frond stems 2408 can plug into the trunk and convey their signals and energy sources. Therefore, the banana tree trunk is here referred to with the designation 2408t.

Figure 2B:
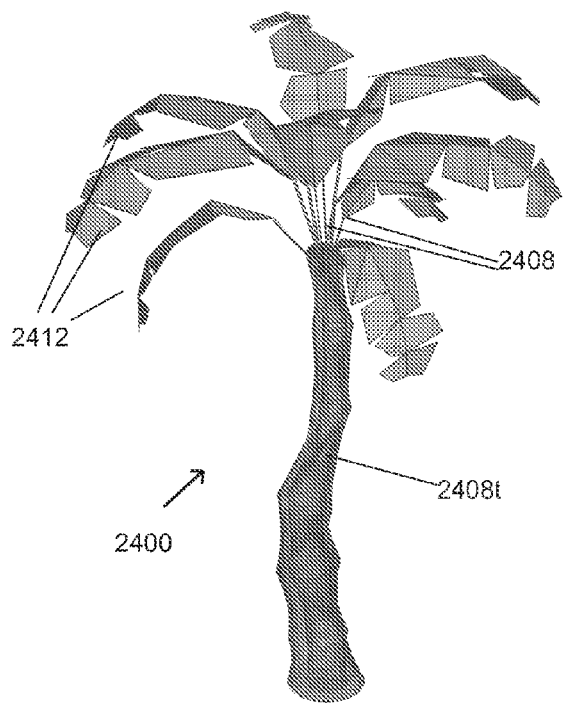

Referring to FIG. 2B, a schematic representation of a banana tree displays its large banana leaf energy-gathering units 2412, its frond stems 2408 and its trunk 2408t.

Because a banana tree is not aquatic, there is not the opportunity to hide electronics and downstream elements as are in base units of lily pad embodiments; however, this is compensated for by the trunk 2408t. Electronics and other items in the base units 2436 above are deployed in base chambers 2436 hidden inside the trunk 2408t, but made accessible via a service panel. The non-aquatic environment means that the opportunity to disperse heat into a body of water is not there, however airflow around banana leaves 2412 and the trunk 2408t helps disperse heat into the air. Air-based heat sinks and heat pipes are employed instead, when necessary.

Shading of banana leaves 2412 is less of a problem than most trees but more of a problem than in lily pads 2412. This is both because of the shape of the individual leaves and their proximity to each other, and because land-based trees have more chance of being shaded by buildings and/or other trees. Therefore, embodiments focusing on the challenge of partial shading are more emphasized with banana tree embodiments of the apparatus 2400. For instance, separate segments of banana leaves 2412 are wired separately as independent solar cells, in some embodiments of the photovoltaic versions, an individual segment's current is conducted down the stalk 2408 and trunk 2408t independently and may be separately handled by an MTTP, microinverter, small battery, supercapacitor, or other device to smooth the power outputs.

Figure 2C:
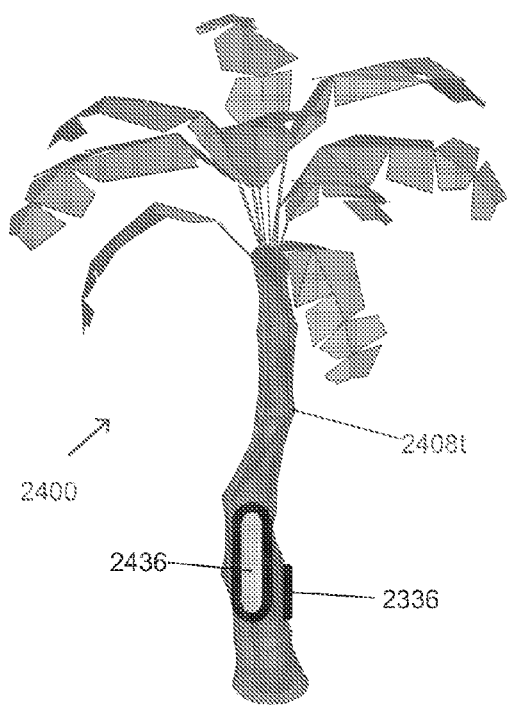

FIG. 2C schematically represents an example embodiment of an energy-gathering apparatus 2400 in the form of a banana tree, where a base unit 2436 is embedded inside the trunk 2408t of the tree apparatus 2400. Furthermore, a base unit access panel 2336 is positioned on the tree trunk. Such an access panel 2336 is used in embodiments where the base unit 2436 is not directly reachable by a human operator but could be made accessible with such a panel 2336. In this case, an operator can open the access panel and access any electronics within the base unit.

The base unit 2436 in this tree embodiment can have any of the electronics or embodiments discussed elsewhere herein, for apparatuses 2400 or base units 2436 or networks (2465 or 2808).

With a few exceptions that should be obvious, all embodiments described or alluded to for lily plants apply to banana tree embodiments 2400. Therefore, only some of the unique features are described here.

Tree Trunk as an Energy Collector and Source of Visual Realism

Because the trunk 2408t is one of the unique features of the banana tree apparatus 2400 relative to lily plants 2400, several of the unique embodiments attempt to use the trunk for added advantages.

First of all, a tree is tall and has a lot of surface area, so it does a much better job of catching wind than ground-cover plants or lily pads. Therefore the structural and functional characteristics of a true confer particular advantages in terms of gathering useful energy from the movement of fluids, particularly wind. Secondly, natural trees are not motionless erect poles, but rather they bend and sway with the wind, and they have seemingly random bends, leans, and curvature to their trunk. In addition, the trunk may be of varying lengths, shapes, and heights.

Several unique embodiments of the present technology address both of these via a unique configuration of the trunk 2408t.

In keeping with the modularity and scalability of the system, the trunk 2408t is constructed from modular non-symmetric sections that are designed to create naturalistic bends in the final trunk when assembled together. Furthermore, they are fitted with special connectors that allow them to sway realistically when under force from wind.

Additionally, like natural trees, a system tree can "grow" during its lifetime by adding further modular sections to the trunk, adding additional leaves and branches, and the like.

Furthermore, electronics and solid-state devices embedded in the connectors of the trunks sections allow the assembled trees to generate electricity from the energy latent in the force of the wind and the commensurate swaying of the trees.

As an example of one embodiment, this is accomplished by having a central pole that is sturdy like the pole of a street lamp but which is curved and bent in a configuration that is realistic for a tree trunk.

Figures 3A, 3B:
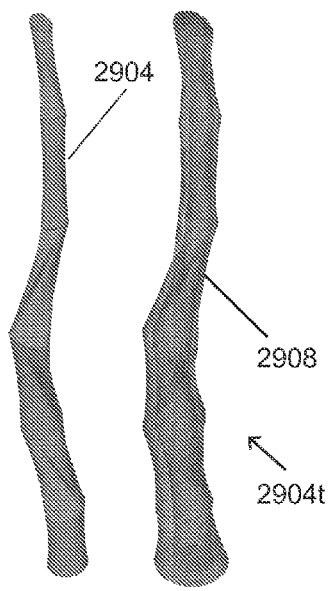
FIGS. 3A-H illustrate examples of a way to make realistic tree trunks with modular rearrangeable sections and energy harvesting from wind.

FIG. 3A provides a representative example of such a pole 2904. Such a pole could form the infrastructure of a tree alike a banana tree or a palm tree or palmetto, or other similar flexible tree.

The visible trunk 2908 of the tree is then built around this pole, as described below. FIG. 3B provides a representation of a pole 2904 encased in a sheath of material that forms the visible trunk 2908. As a whole, the pole 2904 and the sheath 2908 form the overall trunk 2408*t*.

The central pole 2908 acts like spinal column in a vertebral animal, so it here referred to as a spinal pole 2908.

Figure 3C:
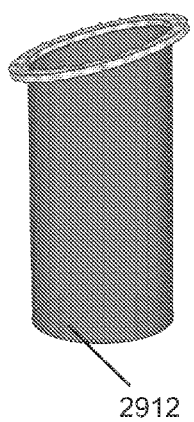

The spinal pole 2908 can be segmented into a plurality of pole sections 2912 (FIG. 3C). These pole sections 2912 can be assembled before shipping or after shipping (e.g. directly at the install site). As mentioned above, this latter modular approach allows for easier/cheaper storage and shipping, and optional on-site assembly. Additionally, modular and relatively interchangeable segments allow for cheaper manufacture and order fulfillment.

Part of the curvature as well as the randomization can come from the order and angle in which each spinal pole module is attached to the previous and to the next. Segments can each be a little bit bent and/or twisted, so that when they are assembled into one full trunk it has a realistic overall serpentine bend to it. Segments can in some embodiments be joined in two or more possible configurations. Thus, the overall bend and lean or a trunk emerge organically and can result in a myriad of final forms.

These design principles can greatly increase the number of conformational permutations (thus realism) while meanwhile decreasing the number of types of parts that would need to be manufactured and that need to be accessed in order to fulfill orders. Ideally all modules of a general type can be interchanged and can be assembled at random angles and all will result in believable but relatively unique final conformations such as trunk curvatures and bends.

Figure 3D:
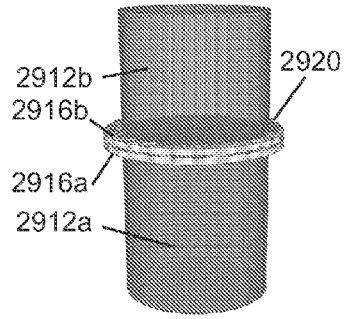

FIG. 3D provides a schematic representation of an embodiment of modular trunk sections that may be used with the system 2912. In these modular pole sections 2912 the circumference at each end is identical, allowing the building up of taller sections while still allowing later insertion of additional sections as desired.

In other instances, a section will have a narrower circumference at the top versus the circumference at the bottom, allowing for a natural narrowing of the trunk toward the top of the tree. These straight and narrowing sections can be used as building blocks to construct and to upgrade a natural looking tree.

In FIG. 3D, a first modular pole section 2912*a* (blue) is coupled to a second pole section 2912*b* (red). In this embodiment, each section has an annular connector gasket 2916 about the end circumference to allow secure joining of the sections. The annular connector 2916*a* of the first pole section 2912*a* is concentric with annular connector 2916*b* of the second pole section 2912*b*. The rings can be fastened together using bolts or screws such as bolt 2920. The example of FIG. 3D shows an embodiment where the annular connectors are coplanar with the section itself. In such a configuration, the trunk assembly would be effectively straight up and down.

Figure 3E:
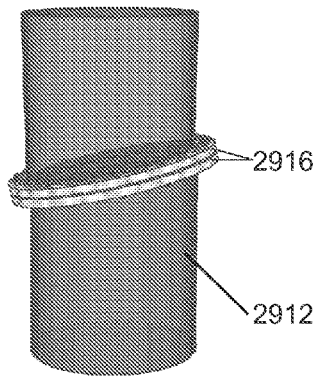

FIG. 3E shows an alternate embodiment where the annular connector gaskets are disposed such that a plurality of bends and curves can be introduced into an assembled spinal pole 2902, and thus likewise into the final trunk 2408*t*. In this embodiment, the annular connectors 2916 at the end of the sections 2912 are not co-planar with the remainder of the respective section, but instead describe an angle with respect to the plane of each section (it is at an angle).

The bottom spinal section 2912*a* has a slanted connector 2916*a*. The top section 2912*b* has its own slanted connector 2916*b*. Because the connectors are circular, they can be oriented in a wide variety of relationships. Even though the two spinal pole sections 2912 are in this case joined such they are vertical and plumb with respect to each other, any slight variation in the angle at which they are joined would cause great variation in the conformation of the resulting join and thus the of the spinal pole.

Figure 3F:
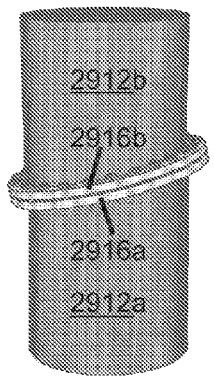
Figure 3F:
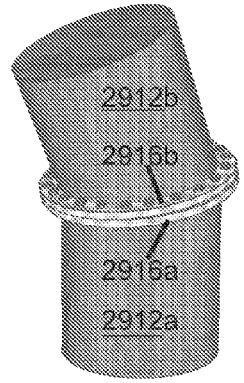

FIG. 3F demonstrates this principle. On the left, the lower and upper sections are joined such that the resulting overall structure is substantially straight up and down. However, the same two sections are joined together in a different orientation in on the right. Here, the resulting structure is such that the two sections are at an angle relative to one another, suggesting and mimicking the bends in the trunk of a tree such as a banana or palm tree.

By rotating the upper section with respect to the bottom section, a large variety of bend angles and positions can be achieved. The number of openings for fasteners in the connecting rings represents the number of different positions that can be achieved with the two trunk sections, and these numbers can be implemented in an arbitrary number of ways (different ring connectors).

Recalling FIG. 3A, the spinal pole 2904 shows multiple modular trunk sections. Each segment is joined to the next in a unique manner so that natural bends and curves in the trunk may be achieved. The circumference of the top portion of a section is designed to match the circumference of the bottom of the next section so that the trunk appears substantially smooth, although there can be some slight border or swell defined at the points of joinder as desired.

Figure 3G:
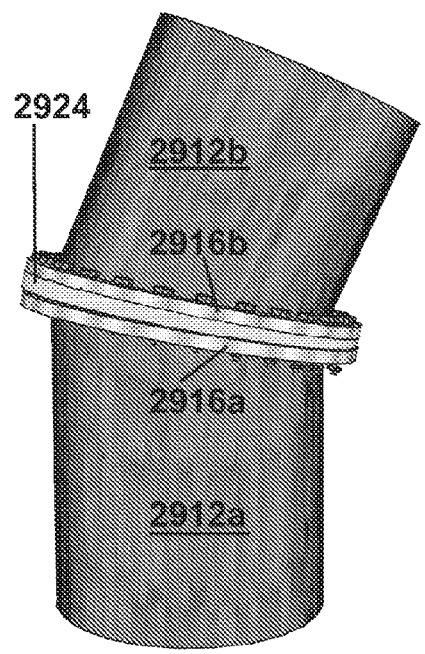
Figure 3H:
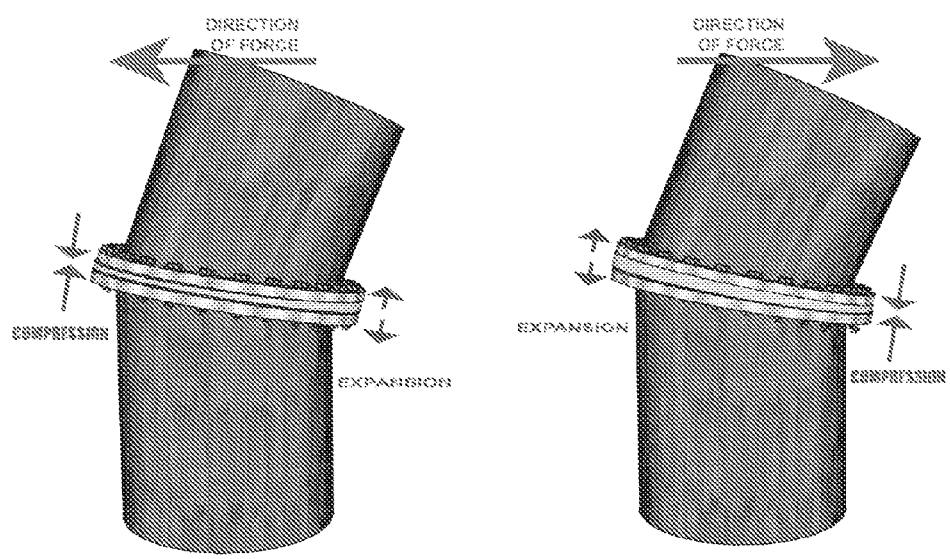

Further realism can be achieved in the system by allowing for a natural looking swaying of a tree in the wind. In one embodiment as shown in FIG. 3G, this is accomplished by inserting a flexible and compressible gasket 2924 between connectors 2916*a* and 2916*b* of sections 2912*a* and 2912*b*. Depending on the direction of force applied to the structure, the gasket will be compressed on one side and expanded on the other (FIG. 3H). The natural bias of the gasket will be to return the tree to its original position. However, the compressibility of the gasket allows the tree sections to sway and bend somewhat, much in the way a tree trunk might bend somewhat in the breeze, furthering the illusion of nature in the system.

In one embodiment the gasket 2924 may incorporate piezoelectric materials so that the compression and decompression of the trunk gaskets during movement can provide another source of electricity. In a related embodiment, the gasket 2924 may incorporate dielectric elastomer materials so that that the compression and decompression of the trunk gaskets during movement can provide another source of electricity. The piezoelectric or elastomer is connected by wires to other wires passing through the trunk 2408*t*, and thereby electricity that is generated is conducted to downstream elements along with electricity from other elements such as a photovoltaic complex 2484 or other energy-gathering assembly 2602 as may be incorporated. Wind causes the tree 2400 to sway, in a lifelike manner, and force associated from that swaying is converted to electricity. Therefore, the embodiment is an integrated device that generates usable power from wind as well as from other sources such as sunlight or em radiation.

In one embodiment of the system, the annular connectors are on the outside of each section. In another embodiment, the connecting rings may be annular within the section itself. In this manner, the connecting rings are not visible. Each ring can be connected to the next by reaching through the inside of the section and attaching the fasteners to the rings. In another embodiment, the sections have a slightly smaller circumference at one end compared to the connecting section and slide partially into the next section. Fasteners are then inserted into the sides of the section, perhaps with recessed or countersunk openings so that the fastening means are essentially flush with the sides of the assembled pieces.

The spinal pole sections act as a core for the tree, with a separate sheath layer on top to emulate bark. This sheath can also contain photovoltaic cells as part of the surface. In this embodiment, the core can be prewired for both connection to the leaves as well as, when appropriate, cells on the trunk sections. In this embodiment, the base member may include the electronics, communications, interconnectivity to a grid, and GPS modules of the trunk module described above. In another embodiment, the electronics may be integrated into the skin (bark) implemented after the spine is constructed.

The trunk sheath can be formed of segments also, and they can be relatively simple, e.g. tubular segments. For instance, short sheath segments (e.g., 2-4 feet high) can be dropped into place from above prior to attachment of the leaves or as each section is mounted onto a spinal pole to build the palm or palmetto trunk. Alternatively, trunk sheath segments can be hinged in a clam-shell fashion along the long axis, and can snap together around a spinal pole, rather than being dropped from the top.

The trunk sheath segments can then be joined together (e.g. by bolts or snaps or other fasteners) at their tops and bottoms (and along vertical seem if clamshell types). Segments can be relatively interchangeable, with some variance in width and external texture as corresponds to trunk geometry at different heights in natural palms or palmettos.

Trunk sheath segments can snap together using different fasteners from sets of available fasteners on the units, to create segments of differing diameters—like belt fasteners or pant snaps where there are different rows of them. Tree trunk height, thickness, taper, flexibility, etc. can be specified and can be tailored to the likely wind, rain, extreme weather, snow weight, and other factors expected at the install site.

In an alternative type of embodiment, there is no spinal pole. In these cases, the 'outer' surface (trunk sheath) is the entirety of the structure and therefore must be able to support the weight and all stress and strain under extreme weather conditions. It acts as an exoskeleton, rather than an internal spine. Thus, segments of the trunk sheath must be strong, and can be joined in the highly secure ways noted above for segments of a spinal pole. All of the design and function principles for spinal poles can apply to trunk sheath segments when there is no spinal pole.

Indoor Embodiments

Up to this point, embodiments and examples of the technology have been described in terms of outdoor applications. In fact, nearly every embodiment or example described herein has a homologous embodiment for indoor applications.

Indoor embodiments of the technology parallel the embodiments described above, and are to be taken to include the details, variants, and advantages there recited, except for some details particular to indoor implementation. For indoor embodiments the source of light for any photovoltaic production of electricity (as well as solar thermal) is not direct sunlight. Rather it is artificial light, sunlight filtered through windows, a combination of the two, or other light as may exist indoors. Consequently, light intensity is usually lower, and the spectrum of incident light differs from that of sunlight.

Consequences of these factors include that thin-film photovoltaics are preferred for a photovoltaic complex, especially DSSCs and other PV materials that deal well with low light (as described above). Furthermore, since output voltage and current is lower, more units are placed in series and/or batteries are generally lower-voltage, where relevant, to assist in the ability for the indoor embodiments to charge said batteries. Furthermore, especially for embodiments and deployments where the light source is purely artificial light, solar thermal methods are generally not very effective, so many indoor embodiments of the technology do not focus on generation of heat. Indoor embodiments generally do not have grid-tie functionality nor high-wattage inverters. Indoor embodiments of the technology do, however, include those that use light-channeling mechanisms such as fiber optics and light tunnels, in part to concentrate the light for efficient conversion, and they do include RF-absorbing embodiments. Electricity produced by indoor embodiments is more often used directly, as DC power, than passed through an inverter. One major advantage of indoor embodiments is that they are not exposed to the outdoor environment nor weather, which allows for less rugged and thus lower-cost and potentially more pliable and lifelike materials.

Terminology

Comprise, include, and/or plural forms of each are open ended and include the listed parts and can include additional parts that are not listed. And/or is open ended and includes one or more of the listed parts and combinations of the listed parts.

One skilled in the art will realize the technology may be embodied in other specific forms without departing from the spirit or essential characteristics thereof. The foregoing examples are therefore to be considered in all respects illustrative rather than limiting of the invention described herein. Scope of the technology is thus indicated by the appended claims, rather than by the foregoing description, and all changes that come within the meaning and range of equivalency of the claims are therefore intended to be embraced therein.

The invention claimed is:
1. An aquatic power-generating apparatus comprising:
an energy-gathering unit;
a photovoltaic complex in operative association with the energy-gathering unit for converting light to electricity;
a conductive infrastructure layer integrated with the photovoltaic complex for conducting the electricity from the photovoltaic complex;

a buoyant base layer underneath of the energy gathering unit for keeping the energy-gathering unit afloat on water;

a stalk including one or more conductive cores for conducting energy from the energy-gathering unit;

a base unit coupled to the energy-gathering unit by way of the one or more energy conductive cores of the stalk, the base unit adapted for combining the energy from the energy-gathering unit with energy from other energy-gathering units, the base unit including an output conduit carrying the combined energy from the base unit; and a light-chasing control assembly including one or more actuator assemblies and one or more light meters wherein each actuator assembly includes a motor and propulsion drive and wherein the light-chasing control assembly is configured to, in response to data on instantaneous luminance levels provided by the one or more light meters, activate the motor of one or more actuator assemblies to drive the propulsion drive and move the energy-gathering unit across the water from a first location to a second separate and distinct location.

2. The aquatic power-generating apparatus of claim 1 wherein the energy-gathering unit resembles a plant leaf.

3. The aquatic power-generating apparatus of claim 1 wherein the conductive infrastructure layer is divided into segments, each segment associated with a portion of the photovoltaic complex, each association converting light to electricity and conducting the electricity separately from other associations.

4. The aquatic power-generating apparatus of claim 1 further comprising a one-way mirrored surface is included over either the photovoltaic complex or over the energy-gathering unit for allowing light to pass through the one-way mirrored surface to reach the photovoltaic complex or a light gathering surface of the energy-gathering unit and for reflecting light reflected back by the photovoltaic complex or the light gathering surface back thereto.

5. The aquatic power-generating apparatus of claim 1 wherein the energy-gathering unit further includes a green-reflective layer for imparting a green appearance to the energy-gathering unit.

6. The aquatic power-generating apparatus of claim 1 further comprising a thermoelectric complex in operative association with the energy-gathering unit for gathering energy in the form of electricity, via the thermoelectric effect.

7. The aquatic power-generating apparatus of claim 1 further comprising a pyroelectric complex in operative association with the energy-gathering unit for gathering energy in the form of electricity, via the pyroeletric effect.

8. The aquatic power-generating apparatus of claim 1 further comprising a fluid-exchange solar thermal complex in operative association with the energy-gathering unit for gathering energy in the form of heat, via thermal exchange using a fluid pumped into the energy-gathering unit unheated and returned to a heat-exchanger heated.

9. The aquatic power-generating apparatus of claim 1 further comprising a solid-state solar thermal complex in operative association with the energy-gathering unit for gathering energy in the form of heat, via thermal conduction along a heat pipe.

10. The aquatic power-generating apparatus of claim 1 further comprising an ambient electromagnetic signal receiver and conversion complex in operative association with the energy-gathering unit for gathering energy in the form of electricity, via analog reception of ambient electromagnetic signals.

11. The aquatic power-generating apparatus of claim 1 wherein the stalk includes a protective housing made from any one of plastic, polymer, rubber, cloth, and braided metal.

12. The aquatic power-generating apparatus of claim 11 wherein the protective housing of the stalk is dipped, sprayed, deposited, wrapped, painted on the one or more conductive cores of the stalk.

13. The aquatic power-generating apparatus of claim 11 wherein the protective housing of the stalk is a pre-fabricated flexible tube provided separately, and the conductive core is threaded through the pre-fabricated flexible tube.

14. The aquatic power-generating apparatus of claim 11 wherein the protective housing of the stalk includes a plurality of segments.

15. The aquatic power-generating apparatus of claim 1 wherein the base unit is coupled to another base unit by way of the output conduit to combine electricity from multiple base units.

16. The aquatic power-generating apparatus of claim 1 wherein the base unit is coupled to an energy storage device by way of the output conduit, the energy storage device including any one of super-capacitor, battery, battery bank, electrically coupled flywheel and superconducting energy store.

17. The aquatic power-generating apparatus of claim 1 wherein the base unit is coupled to a derivative energy storage device by way of the output conduit, the derivative energy storage device including a means for converting electricity from the base unit to any one of mechanical energy, thermal energy, potential energy, chemical energy, and synthesis of materials for fuel cells.

18. The aquatic power-generating apparatus of claim 1 wherein a microprocessor unit is located in a controller unit connected to the actuator assemblies arranged on the energy-gathering unit, via control wires, and the microprocessor unit is further configured to in response to data on instantaneous luminance levels provided by the one or more light meters, activate the motor of one or more actuator assemblies to drive the propulsion drive of one or more actuator assembly and move the energy-gathering unit across the water from a first location to a second separate and distinct location.

19. The aquatic power-generating apparatus of claim 1 wherein a microprocessor unit is located in a network-level controller unit connected to the actuator assemblies arranged on the energy-gathering unit and other energy-gathering units, via control wires, forming a network of energy-gathering units, and the microprocessor unit is further configured to, in response to data on instantaneous luminance levels provided by the one or more light meters of at least some of the energy-gathering units of the network of energy-gathering units, activate the motors of the one or more actuator assemblies of at least some of the energy-gather units to drive the propulsion drives of the one or more actuator assemblies of at least some of the energy-gathering units and move at least some of the energy-gathering units together across the water from a first location to a second separate and distinct location.

20. The aquatic power-generating apparatus of claim 19 wherein the network of energy-gathering units includes a master network-level controller unit and another network-level controller unit, the master network-level controller unit controlling the actuator assemblies of the network of energy-gathering units and the other network-level controller controlling the actuator assemblies of the network of energy-gathering units when the master network-level controller unit fails.

21. The aquatic power-generating apparatus of claim 19 wherein the network-level controller unit is located in the base unit.

22. The aquatic power-generating apparatus of claim 18 wherein the network of energy-gathering units includes a master base unit with the network-level controller and another base unit without a network-level controller.

23. The aquatic power-generating apparatus of claim 1 wherein the propulsion drive is any one of an impeller and propeller.

24. The aquatic power-generating apparatus of claim 1 further comprising a light pipe for conducting light away from the energy-gathering unit to a location remote from the energy-gathering unit and converting the conducted light to electricity at the remote location.

25. The aquatic power-generating apparatus of claim 1 further comprising a light pipe for conducting light away from the energy-gathering unit to a location remote from the energy-gathering unit and heating a substance at the remote location.

26. The aquatic power-generating apparatus of claim 1 further comprising a motion to electricity force transducer for gathering energy in the form of mechanical energy and converting the mechanical energy to electricity, the motion to electricity force transducer is interposed between the stalk and base unit or between the base unit and ground to which the base unit is tethered by an anchor unit.

27. The aquatic power-generating apparatus of claim 1, wherein the light-chasing control assembly includes three or more actuator assemblies arranged around a perimeter of the energy-gathering unit each configured for propelling the energy gathering unit in a different direction.

28. The aquatic power-generating apparatus of claim 1, wherein the light-chasing control assembly is configured to, in response to data on instantaneous luminance levels provided by the one or more light meters, activate the electric motor to drive the propulsion drive and move the energy-gathering unit laterally across the water from a first location to a second separate and distinct location.

29. The aquatic power-generating apparatus of claim 1, wherein the light-chasing control assembly is configured to, in response to data on instantaneous luminance levels provided by the light meter of the respective actuator assembly, activate the electric motor to drive the propulsion drive and move the energy-gathering unit across the water from a first location to a second separate and distinct location to a less shaded area.

30. The aquatic power-generating apparatus of claim 1, wherein the aquatic power-generating apparatus includes texture and patterns of realistic plant features on both a substrate layer of the photovoltaic complex as well as on a visible top layer.

31. The aquatic power-generating apparatus of claim 1, wherein the energy-gathering unit is patterned with realistic plant features including each of (i) large and small veins on the leaf structure, (ii) color variation, and (iii) irregularities and topography that mimic a natural plant structure.

32. The aquatic power-generating apparatus of claim 6, wherein the thermoelectric complex is adapted to utilize a temperature gradient between the photovoltaic complex and the water for gathering energy in the form of electricity, via the thermoelectric effect.

33. The aquatic power-generating apparatus of claim 7, wherein the pyroelectric complex gathers energy in the form of electricity, via the pyroeletric effect, as a result of fluctuations in temperature caused by a decreased in sunlight, whereby a decrease in photoelectric output of the photovoltaic complex is compensated by an increase in pyroelectric output of the pyroelectric complex.

34. The aquatic power-generating apparatus of claim 1, wherein the photovoltaic complex and the conductive infrastructure layer form part of the energy gathering unit, wherein the energy conducted by the stalk from the energy gathering unit to the base unit includes electricity from the photovoltaic complex.

35. The aquatic power-generating apparatus of claim 1, wherein the photovoltaic complex and the conductive infrastructure layer form part of the base unit, wherein the energy conducted by the stalk from the energy-gathering unit to the base unit includes light.

36. The aquatic power-generating apparatus of claim 35, wherein the energy-gathering unit further comprises a light-gathering complex with an arrangement of one or more optical fibers.

37. The aquatic power-generating apparatus of claim 1, wherein the energy conducted by the stalk from the energy-gathering unit to the base unit includes one or more of light, electricity, electromagnetic energy or heat energy.

38. The aquatic power-generating apparatus of claim 27, wherein each actuator assembly is configured for propelling the energy gathering unit a direction orthogonal to an edge of the energy gathering unit at the perimeter location of that of that actuator assembly.

39. The aquatic power-generating apparatus of claim 27, wherein the light-chasing control assembly is configured to control a relative activation of the electric motor of each of the actuator assemblies based on data on instantaneous luminance levels provided by the one or more light meters.

40. The aquatic power-generating apparatus of claim 34 wherein the energy-gathering unit further includes an insulating layer between the buoyant base layer and the conductive infrastructure layer for providing a constant, well controlled, and tuned interfacial structural layer between the buoyant base layer and the conductive infrastructure layer.

* * * * *